(12) United States Patent
Matsumoto et al.

(10) Patent No.: US 9,076,740 B2
(45) Date of Patent: Jul. 7, 2015

(54) ORGANIC ELECTROLUMINESCENCE DISPLAY AND METHOD OF MANUFACTURING THE SAME

(75) Inventors: Toshiki Matsumoto, Kanagawa (JP); Tadahiko Yoshinaga, Kanagawa (JP)

(73) Assignee: JOLED INC. (JP)

( * ) Notice: Subject to any disclaimer, the term of this patent is extended or adjusted under 35 U.S.C. 154(b) by 690 days.

(21) Appl. No.: 13/406,753

(22) Filed: Feb. 28, 2012

(65) Prior Publication Data

US 2012/0242217 A1 Sep. 27, 2012

(30) Foreign Application Priority Data

Mar. 25, 2011 (JP) ................. 2011-068247

(51) Int. Cl.
*H05B 33/14* (2006.01)
*H01L 27/32* (2006.01)
*H01L 51/50* (2006.01)

(52) U.S. Cl.
CPC .......... *H01L 27/3213* (2013.01); *H01L 27/322* (2013.01); *H01L 51/5044* (2013.01)

(58) Field of Classification Search
CPC ............ H01L 27/3213; H01L 27/3223; H01L 51/5044; H05B 33/14
See application file for complete search history.

(56) References Cited

U.S. PATENT DOCUMENTS

| | | | | |
|---|---|---|---|---|
| 6,459,199 B1 * | 10/2002 | Kido et al. | ..................... | 313/504 |
| 2002/0011783 A1 * | 1/2002 | Hosokawa | ..................... | 313/504 |
| 2006/0273714 A1 * | 12/2006 | Forrest et al. | ................. | 313/504 |

FOREIGN PATENT DOCUMENTS

JP    2006-140434    6/2006

* cited by examiner

*Primary Examiner* — Andrew Coughlin
(74) *Attorney, Agent, or Firm* — Sheridan Ross P.C.

(57) ABSTRACT

Disclosed herein is an organic electroluminescence display including a plurality of first electrodes, a hole injection/transport layer, a second organic light emitting layer for another color, a connection layer, a first organic light emitting layer for blue color, an electron injection/transport layer, and an electron injection/transport layer. The first electrodes are provided on a substrate on the basis of each of a first organic electroluminescence element for blue color and a second organic electroluminescence element for another color. The hole injection/transport layer is provided over the whole surface area on the first electrodes and having a property for one of hole injection or transport. The second organic light emitting layer for another color is provided over the whole surface area on the hole injection/transport layer and having a crystal part in a part. The connection layer is provided over the whole surface area on the second organic light emitting layer.

19 Claims, 13 Drawing Sheets

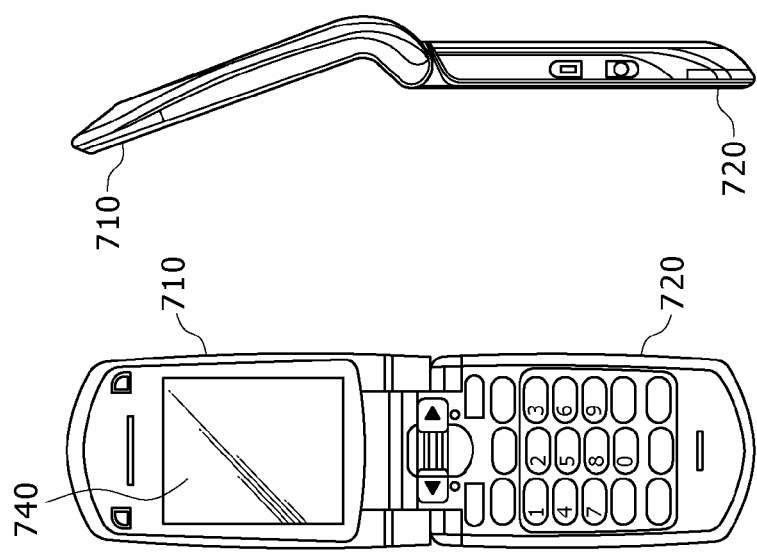
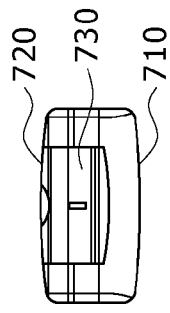
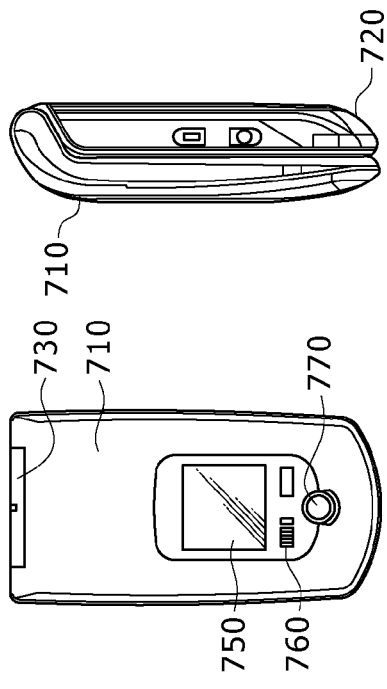
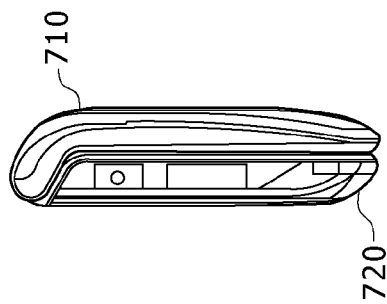
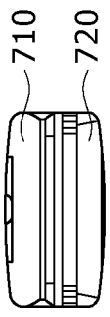

ORGANIC ELECTROLUMINESCENCE DISPLAY AND METHOD OF MANUFACTURING THE SAME

BACKGROUND

The present disclosure relates to an organic EL (electroluminescence) display in which an organic EL phenomenon is utilized for light emission.

With the recent accelerated developments in information and communication industries, there has been a demand for display devices having high degrees of functions. Among others, organic EL devices paid attention to as next-generation display devices have the merits of not only a wide view angle and an excellent contrast but also rapid response, when used as a spontaneous light emitting type display device.

The materials used for light emitting layers and the like constituting an organic EL device are generally classified into low-molecular materials and high-molecular materials. Of both the materials, in general, the low-molecular materials are known to show higher luminous efficiency and longer service life.

In addition, organic films of low-molecular materials are formed by dry processes (vapor deposition process) such as vacuum deposition, while organic films of high-molecular materials are formed by wet processes (coating process) such as spin coating system, ink jet system or nozzle coating system, or by printing processes such as flexographic printing or offset printing.

The vacuum deposition process is advantageous in that it is unnecessary to dissolve the organic thin film forming material in solvent and, therefore, removal of solvent after film formation is not needed. In the vacuum deposition process, however, it is difficult to form different films in different areas by use of metal masks, and, particularly, high manufacturing costs are needed for fabrication of large-sized panels. Therefore, the vacuum deposition process has had difficulties in application to large-screen substrates and in adaptation to mass production. In view of this, the coating process in which the area of display screen can be enlarged comparatively easily has drawn attention.

In such circumstances, for example Japanese Patent Laid-open No. 2006-140434 discloses a display wherein a hole injection layer, a hole transport layer, a red light emitting layer and a green light emitting layer are formed by a wet process such as ink jet process on the basis of light emitting elements for each color, and a blue light emitting layer and the like are formed thereover as common layers by a vacuum deposition process. This structure eliminates the need for fine patterning of the blue light emitting layer, and, therefore, highly possibly permits enlargement of the display screen area.

SUMMARY

In the organic EL display wherein the layers are formed on an element basis by coating process as in Japanese Patent Laid-open No. 2006-140434, however, it is very difficult to control the film thickness and it is difficult to achieve stable manufacture. Furthermore, it may be necessary to improve device characteristics.

Thus, there is a desire for an organic EL display in which stable manufacture and device characteristic improvements are possible, and a method of manufacturing the same.

According to an embodiment of the present disclosure, there is provided an organic electroluminescence display including:

a plurality of first electrodes provided on a substrate on the basis of each of a first organic electroluminescence element for blue color and a second organic electroluminescence element for another color;

a hole injection/transport layer which is provided over the whole surface area on the first electrodes and which has a property for at least one of hole injection or hole transport;

a second organic light emitting layer for another color which is provided over the whole surface area on the hole injection/transport layer and which has a crystal part at least in a part thereof;

a connection layer provided over the whole surface area on the second organic light emitting layer;

a first organic light emitting layer for blue color which is provided over the whole surface area on the connection layer;

an electron injection/transport layer which is provided over the whole surface area on the first organic light emitting layer and which has a property for at least one of electron injection or electron transport; and a second electrode provided on the electron injection/transport layer.

According to another embodiment of the present disclosure, there is provided a first method of manufacturing an organic electroluminescence display, including:

forming a plurality of first electrodes on a substrate on the basis of each of a first organic electroluminescence element for blue color and a second organic electroluminescence element for another color;

forming a plurality of hole injection/transport layers which are provided over the whole surface area of the first electrodes and have a property for at least one of hole injection or hole transport, by coating process;

forming a second organic light emitting layer for another color over the whole surface area on the hole injection/transport layers by coating process;

forming a crystal part at least in a part of the second organic light emitting layer;

forming a connection layer over the whole surface area of the second organic light emitting layer by vapor deposition process;

forming a first organic light emitting layer for blue color over the whole surface area of the connection layer by vapor deposition process;

forming an electron injection/transport layer having a property for at least one of electron injection or electron transport, over the whole surface area of the first organic light emitting layer by vapor deposition process; and forming a second electrode over the whole surface area of the electron injection/transport layer.

According to a further embodiment of the present disclosure, there is provided a second method of manufacturing an organic electroluminescence display, including:

forming a plurality of first electrodes on a substrate on the basis of each of a first organic electroluminescence element for blue color and a second organic electroluminescence element for another color;

forming a plurality of hole injection/transport layers which are provided over the whole surface area of the first electrodes and have a property for at least one of hole injection or hole transport, by coating process;

forming a second organic light emitting layer for another color over the whole surface area on the hole injection/transport layers by vapor deposition process;

forming a crystal part at least in a part of the second organic light emitting layer;

forming a connection layer over the whole surface area of the second organic light emitting layer by vapor deposition process;

forming a first organic light emitting layer for blue color over the whole surface area of the connection layer by vapor deposition process;

forming an electron injection/transport layer having a property for at least one of electron injection or electron transport, over the whole surface area of the first organic light emitting layer by vapor deposition process; and forming a second electrode over the whole surface area of the electron injection/transport layer.

In the organic EL display and the methods of manufacturing the same according to embodiments of the present disclosure, the first organic light emitting layer for blue color and the second organic light emitting layer for another color are formed as common layers over the whole area, whereby film thickness control is facilitated. Besides, the second organic light emitting layer is partly crystallized, whereby selective emission of lights of two wavelengths can be performed.

According to the organic EL display and the methods of manufacturing the same pertaining to the embodiments of the present disclosure, the first organic light emitting layer for blue color and the second organic light emitting layer for another color are formed as common layers over the whole area, so that film thickness control is facilitated, and scattering of characteristics among elements is reduced. In addition, since the second organic light emitting layer is partly crystallized, selective emission of lights of two wavelengths is enabled. As a result, a full-color display with stable characteristics can be provided more easily.

BRIEF DESCRIPTION OF THE DRAWINGS

FIG. 15A is a front view of Application Example 5 in an opened state, FIG. 15B is a side view thereof, FIG. 15C is a front view thereof in a closed state, FIG. 15D is a left side view, FIG. 15E is a right side view, FIG. 15F is a top plan view, and FIG. 15G is a bottom view.

DETAILED DESCRIPTION OF THE PREFERRED EMBODIMENTS

Figure 1:
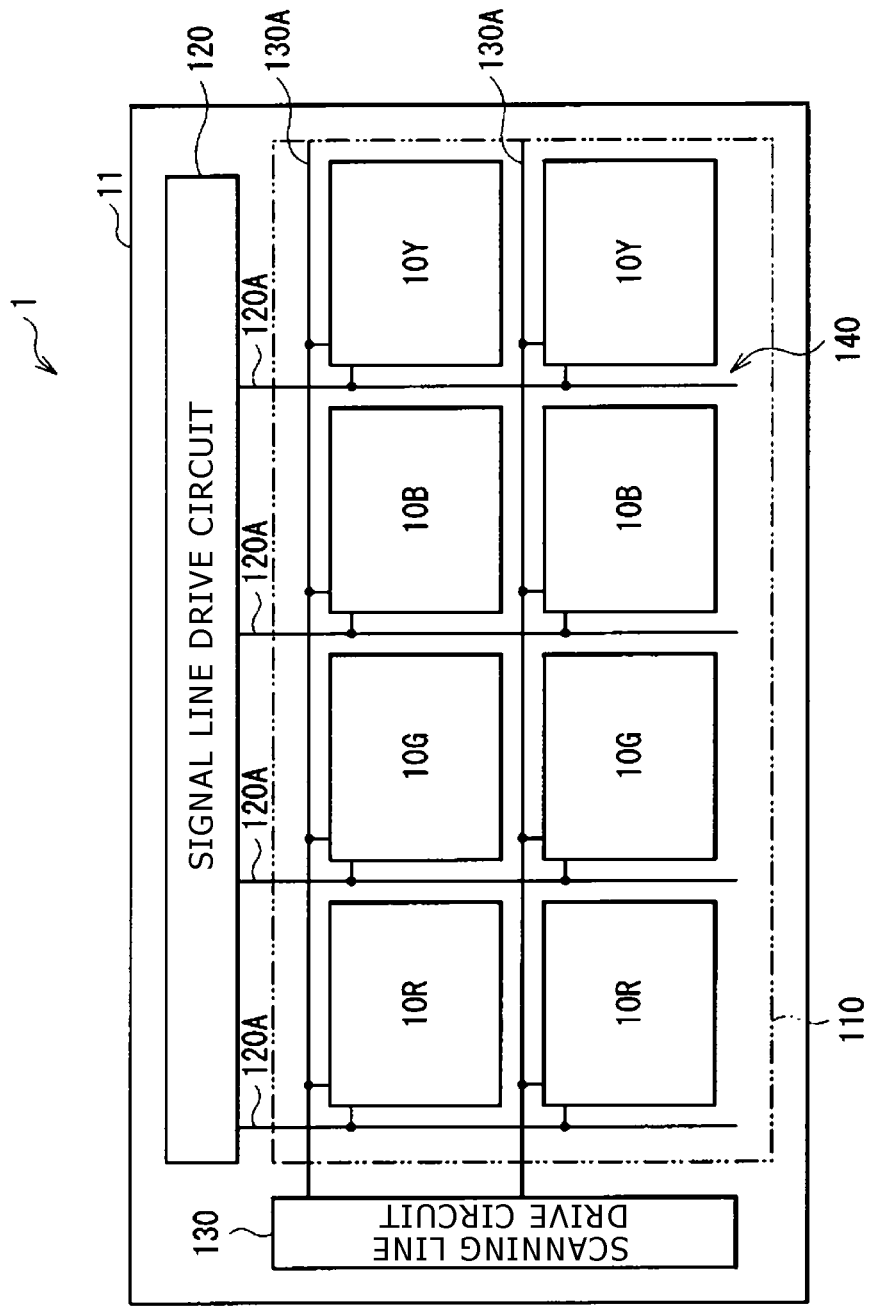
FIG. 1 illustrates the configuration of an organic EL display according to a first embodiment of the present disclosure.

Now, embodiments of the present disclosure will be described in detail below referring to the drawings, in the following order.
1. First Embodiment
  (Organic EL display in which a second organic light emitting layer for another color is formed by a coating process)
2. Second Embodiment
  (Organic EL display in which a second organic light emitting layer for another color is formed by a vapor deposition process)
(First Embodiment)

FIG. 1 illustrates the configuration of an organic EL display according to a first embodiment of the present disclosure. The organic EL display is for use as an organic EL television set or the like, wherein, for example, a plurality of red organic EL elements 10R, green organic EL elements 10G, blue organic EL elements 10B, and yellow organic EL elements 10Y which will be described later are disposed in a matrix pattern in a display region 110 on a substrate 11. In the periphery of the display region 110, a signal line drive circuit 120 and a scanning line drive circuit 130 are provided as drivers for display of images.

Figure 2:
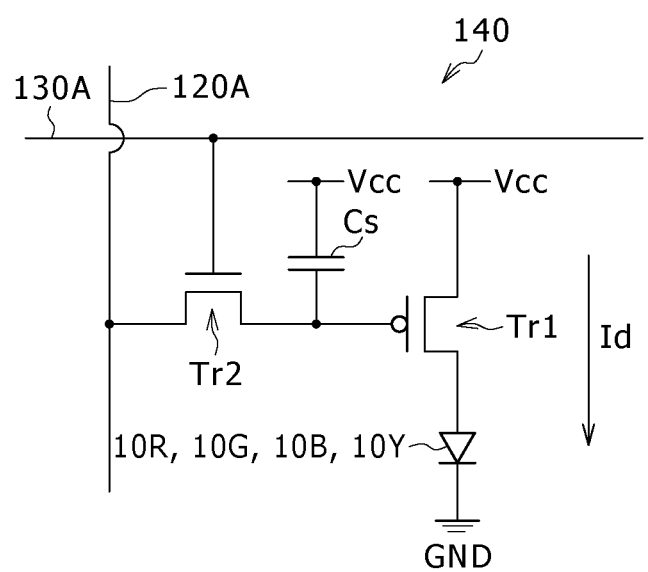
FIG. 2 illustrates an example of a pixel drive circuit shown in FIG. 1.

Pixel drive circuits 140 are provided in the display region 110. FIG. 2 illustrates an example of the pixel drive circuit 140. The pixel drive circuit 140 is an active type drive circuit formed in a layer under a lower electrode 14 which will be described later. Specifically, the pixel drive circuit 140 includes a drive transistor Tr1 and a write transistor Tr2, a capacitor (holding capacitance) Cs between these transistors Tr1 and Tr2, and the red organic EL element 10R (or green organic EL element 10G, blue organic EL element 10B, or yellow organic EL element 10Y) connected in series with the drive transistor Tr1 between a first power source line (Vcc) and a second power source line (GND). The drive transistor Tr1 and the write transistor Tr2 are each composed of an ordinary thin film transistor (TFT), the structure of which may, for example, be an inverted stagger configuration (so-called bottom gate type) or a stagger configuration (top gate type), and is not specifically restricted.

In the pixel drive circuits 140, a plurality of signal lines 120A are arranged in a column direction, while a plurality of scanning lines 130A are arranged in a row direction. The intersection of each signal line 120A and each scanning line 130A corresponds to one (sub-pixel) of the red organic EL element 10R, green organic EL element 10G, blue organic EL element 10B, and yellow organic EL element 10Y. Each signal line 120A is connected to the signal line drive circuit 120, and an image signal is supplied from the signal line drive circuit 120 to a source electrode of the write transistor Tr2 through the signal line 120A. Each scanning line 130A is connected to the scanning line drive circuit 130, and a scan signal is supplied from the scanning line drive circuit 130 to a gate electrode of the write transistor Tr2 through the scanning line 130A, in a sequential manner.

Besides, in the display region 110, as above-mentioned, the red organic EL elements 10R operative to generate red light, the green organic EL elements 10G operative to generate green light, the blue organic EL elements 10B operative to generate blue light, and the yellow organic EL elements 10Y operative to generate yellow light are sequentially arranged in a matrix pattern as a whole. Incidentally, the red organic EL element 10R, green organic EL element 10G, blue organic EL element 10B, and yellow organic EL element 10Y which are adjacent to one another constitute one pixel. Here, the red organic EL element 10R operative to generate red light and the green organic EL element 10G operative to generate green light have respective color filters 40 through which the light from an organic EL element operative to generate yellow light is passed, to exhibit red and green light-emission colors, respectively.

Figure 3:
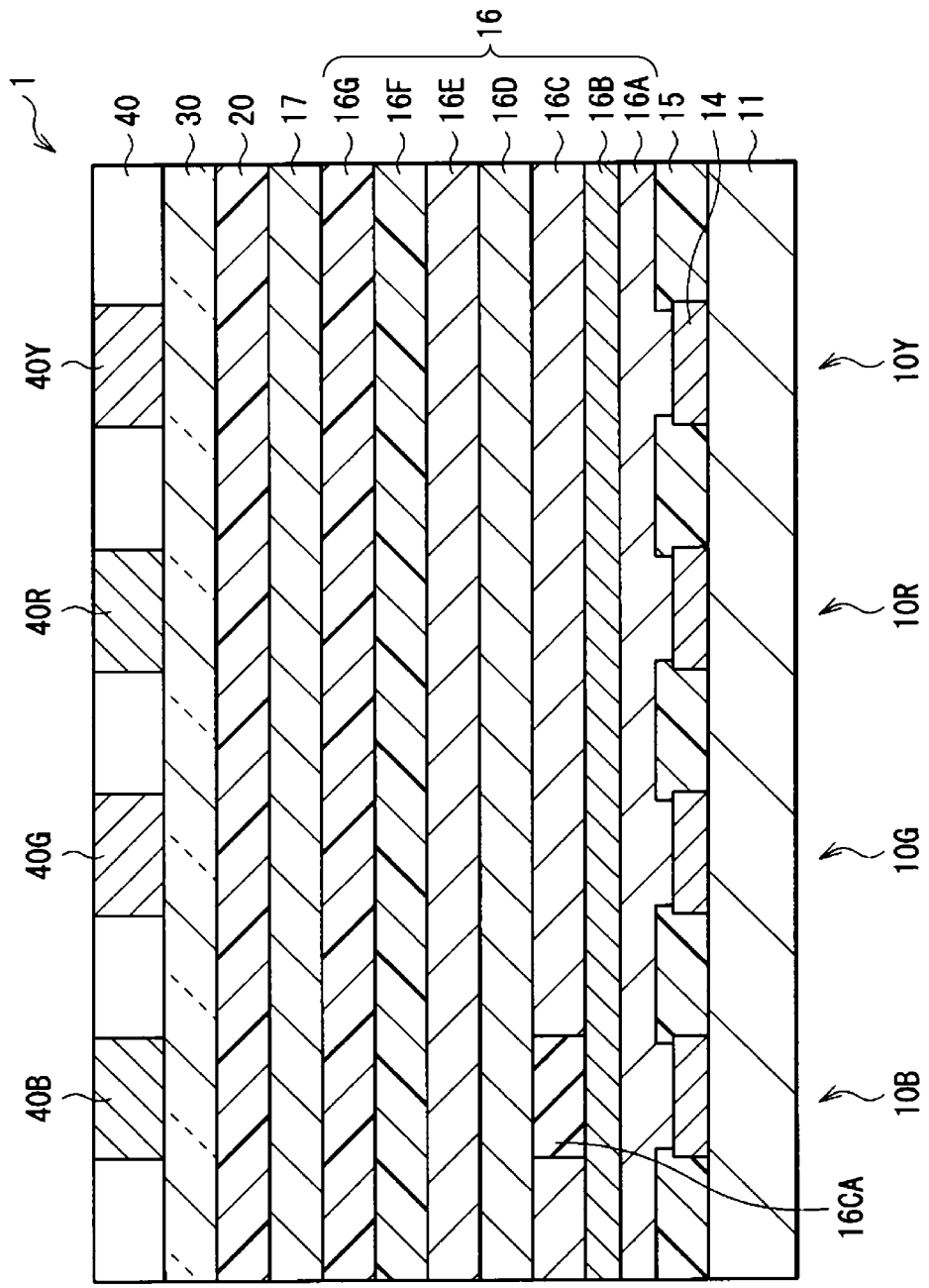
FIG. 3 is a sectional view showing the configuration of a display region shown in FIG. 1.

FIG. 3 illustrates the sectional configuration of the display region 110 shown in FIG. 1. Each of the red organic EL element 10R, green organic EL element 10G, blue organic EL element 10B and yellow organic EL element 10Y has a structure wherein the lower electrode 14 (first electrode) as an anode, a partition wall 15, organic layers 16 including a light emitting layer 16 (a yellow light emitting layer 16C, a blue light emitting layer 16E) and a connection layer 16D to be described later, and an upper electrode 17 (second electrode) as a cathode are laminated in this order from the substrate 11 side, with the above-mentioned drive transistor Tr1 of the pixel drive circuit 140 and a flattening dielectric film (not shown) interposed between the substrate 11 and the laminated layers.

Such red organic EL elements 10R, green organic EL elements 10G, blue organic EL elements 10B and yellow organic EL elements 10Y are covered with a protective layer 20; further, this assembly is sealed by a sealing substrate 30 (composed of glass or the like) adhered to the whole surface of the protective layer 20, with an adhesion layer (not shown) of a thermosetting resin or ultraviolet-curable resin interposed therebetween.

The substrate 11 is a support on one principal surface on which the red organic EL elements 10R, green organic EL elements 10G, blue organic EL elements 10B and yellow organic EL elements 10Y are to be formed in an arrayed manner. The substrate 11 may be a known one, for example, quartz, glass, metallic foil, or resin film or sheet. Among these, preferred are quartz and glass substrates. Where the substrate is a resin film, examples of the resin material include methacrylic resins represented by polymethyl methacrylate (PMMA), polyesters such as polyethylene terephthalate (PET), polyethylene naphthalate (PEN), polybutylene naphthalate (PBN), etc., and polycarbonate resins. In this case, adoption of a laminated structure or a surface treatment may be necessary for suppressing water permeability and gas permeability.

The lower electrodes 14 are provided on the substrate 11 on the basis of each of the red organic EL elements 10R, green organic EL elements 10G, blue organic EL elements 10B and yellow organic EL elements 10Y. The lower electrodes 14 have a thickness in the laminating direction (hereinafter referred to simply as "thickness") of, for example, 10 to 1000 nm. Examples of the material of the lower electrodes 14 include metallic elements such as molybdenum (Mo), chromium (Cr), gold (Au), platinum (Pt), nickel (Ni), copper (Cu), tungsten (W) and silver (Ag), in their elemental state, and their alloys. In addition, the lower electrode 14 may have a laminated structure of a metallic film of any of the just-mentioned elemental metals and their alloys with a transparent conductive film formed of indium-tin oxide (ITO), indium-zinc oxide (InZnO), an alloy of zinc oxide (ZnO) with aluminum (Al), or the like. Incidentally, where the lower electrode 14 is used as an anode, the lower electrode 14 is desirably formed of a material having a high hole injection property. It is to be noted here, however, that even aluminum (Al) alloys or the like materials accompanied by the problem of hole injection barrier arising from the presence of an oxide film at the surface thereof or a high work function thereof can be used as the material for the lower electrodes 14, by additionally providing an appropriate hole injection layer 16A.

The partition wall 15 is for securing insulation between the lower electrode 14 and the upper electrode 17 and for defining each light emission region into a desired shape. Examples of the material for the partition wall 15 include inorganic dielectric materials such as $SiO_2$, etc., and photosensitive resins such as positive-type photosensitive polybenzoxazole, positive-type photosensitive polyimides, etc. The partition wall 15 is provided with openings corresponding to the light emission regions. Incidentally, the organic layers 16 and the upper electrode 17 may be provided not only over the openings but also over the partition wall 15, but light emission takes place only in the areas of the openings in the partition wall 15. In addition, while a monolayer structure in which the partition wall 15 is formed of a single material is adopted in the present embodiment, the partition wall 15 may have a laminated structure composed of a plurality of materials. Besides, a structure may be adopted wherein only the lower electrode 14 is patterned, without providing the partition wall 15, and the hole injection layer 16A and the subsequent organic layers 16 are provided as common layers.

The organic layers 16 in the organic EL elements 10R, 10G, 10B and 10Y have, for example, the hole injection layer 16A, a hole transport layer 16B, the yellow light emitting layer 16C, the connection layer 16D, the blue light emitting layer 16E, an electron transport layer 16F and an electron injection layer 16G which are laminated in this order from the side of the lower electrodes 14. The organic layers 16 are provided as common layers which are common to the organic EL elements 10R, 10G, 10B and 10Y.

The hole injection layer 16A is a layer for enhancing the efficiency of hole injection into the yellow light emitting layer 16C and the blue light emitting layer 16E, and is a buffer layer for prevention of leakage. The thickness of the hole injection layer 16A is, for example, preferably 5 to 100 nm, more preferably 8 to 50 nm.

The material constituting the hole injection layer 16A may be appropriately selected in relation to the materials of the electrodes and the adjacent layers. Examples of the material applicable here include conductive polymers such as polyaniline, polythiophene, polypyrrole, polyphenylenevinylene, polythienylenevinylene, polyquinoline, polyquinoxaline and their derivatives, polymers having an aromatic amine structure in a main chain or side chain thereof, etc., metal phthalocyanine complex (copper phthalocyanine complex, etc.), and carbon.

Where the material used to form the hole injection layer 16A is a high-molecular material, the weight average molecular weight (Mw) of the high-molecular material may be in the range of 5,000 to 300,000, particularly preferably about 10,000 to 200,000. Besides, an oligomer with an Mw of about 2,000 to 5,000 may also be used; if the Mw is less than 5,000, however, dissolution of the hole injection layer may occur during formation of the hole transport layer and the subsequent layers. On the other hand, if the Mw is more than 300,000, the material may be gelled, making it difficult to form a film.

Examples of a typical conductive polymer for use as the material constituting the hole injection layer 16A include polyaniline, oligoaniline and polydioxythiophenes such as poly(3,4-ethylenedioxythiophene) (PEDOT). Other examples include a polymer commercialized under the name of Nafion (trademark) from H. C. Starck GmbH, a polymer commercialized in a dissolved form under the trade name of Liquion (trademark), ELsource (trademark) made by Nissan Chemical Industries, Ltd., and a conductive polymer called Verazol (trademark) made by Soken Chemical & Engineering Co., Ltd.

The hole transport layer 16B in the red organic EL element 10R, green organic EL element 10G, blue organic EL element 10B and yellow organic EL element 10Y is for enhancing the efficiency of hole transport into the yellow light emitting layer 16C and the blue light emitting layer 16E. The thickness of the hole transport layer 16B, which depends on the total element configuration, is, for example, preferably 10 to 200 nm, more preferably 15 to 150 nm.

The high-molecular material constituting the hole transport layer 16B may be a light emitting material which is soluble in organic solvent. Examples of the high-molecular material which can be used here include polyvinylcarbazole, polyfluorene, polyaniline, polysilane and their derivatives, polysiloxane derivatives having an aromatic amine in a side chain or main chain thereof, polythiophene and its derivatives, and polypyrrole.

More preferable examples include high-molecular materials which are represented by the following formula (1), which are soluble in organic solvent, and which ensure good adhesion of the hole transport layer 16B to the hole injection layer 16A on the lower side and the yellow light emitting layer 16C on the upper side.

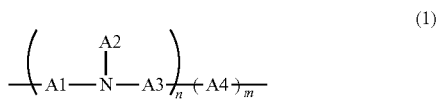

(1)

where A1 to A4 are each a group in which one to ten aromatic hydrocarbon groups or derivatives thereof are linked or a group in which one to 15 heterocyclic groups or derivatives thereof are linked, n and m are each an integer of 0 to 10,000, and n+m is an integer of 10 to 20,000.

In addition, the sequence of arrangement of the N parts and the m parts is arbitrary; for example, the sequence may be such as to make the high-molecular material a random polymer, an alternating copolymer, a periodic copolymer or a block copolymer. Further, n and m are each preferably an integer of 5 to 5,000, more preferably an integer of 10 to 3,000. Besides, n+m is preferably an integer of 10 to 10,000, more preferably an integer of 20 to 6,000.

Furthermore, specific examples of the aromatic hydrocarbon groups represented by A1 to A4 in the compound of the formula (1) include benzene, fluorine, naphthalene, anthracene, their derivatives, phenylenevinylene derivatives, and styryl derivatives. Specific examples of the heterocyclic groups include thiophene, pyridine, pyrrole, carbazole and their derivatives.

Where A1 to A4 in the compound represented by the formula (1) have a substituent group, the substituent group is a straight-chain or branched alkyl or alkenyl group of 1 to 12 carbon atoms, for example. Specific and preferable examples of the substituent group include methyl, ethyl, propyl, isopropyl, butyl, isobutyl, sec-butyl, tert-butyl, pentyl, hexyl, heptyl, octyl, nonyl, decyl, undecyl, dodecyl, vinyl, and allyl group.

Specific, preferable but nonlimitative, examples of the compound represented by the formula (1) include the compounds represented by the following formulas (1-1) to (1-3), specifically, poly[(9,9-dioctylfluorenyl-2,7-diyl)-co-(4,4'-(N-(4-sec-butylphenyl))diphenylamine)] (TFB, formula (1-1)), poly[(9,9-dioctylfluorenyl-2,7-diyl)-alt-co-(N,N'-bis{4-butylphenyl}-benzidine N,N'-{1,4-diphenylene})] (formula (1-2)), poly[(9,9-dioctylfluorenyl-2,7-diyl)] (PFO, formula (1-3)).

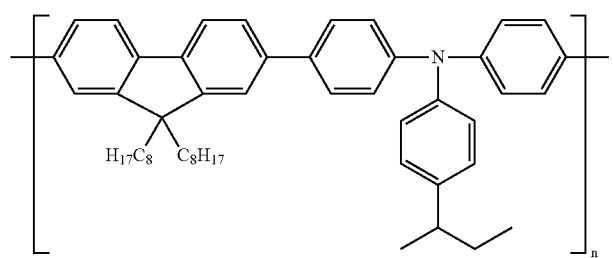

(1-1)

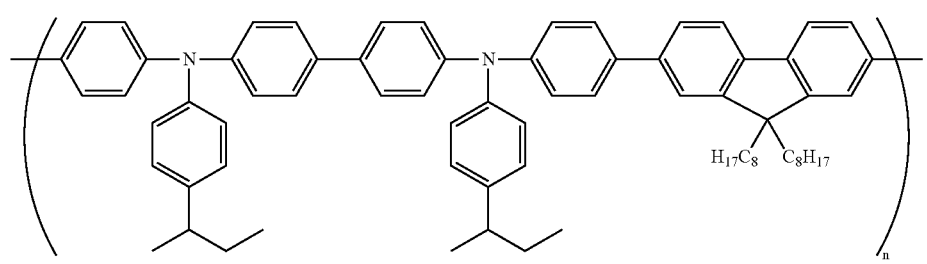

(1-2)

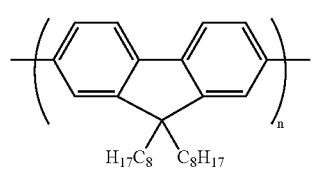

(1-3)

In the yellow light emitting layer 16C, application of an electric field causes electron-hole recombination, resulting in emission of light. The thickness of the yellow light emitting layer 16C, which depends on the total element configuration, is, for example, preferably 10 to 200 nm, more preferably 15 to 100 nm. The yellow light emitting layer 16C has at least one low-molecular material and at least one light emitting material. The low-molecular material here is a monomer or an oligomer having two to ten monomers linked to one another, and preferably has a weight average molecular weight of up to 10,000. Incidentally, low-molecular materials having a weight average molecular weight in excess of the just-mentioned range are not necessarily excluded.

The yellow light emitting layer 16C is formed, for example, by a coating process such as ink jet process, the details of which will be described later. In this case, a high-molecular material and a low-molecular material are dissolved by use of at least one organic solvent such as toluene, xylene, anisole, cyclohexanone, mesitylene (1,3,5-trimethylbenzene), pseudocumene (1,2,4-trimethylbenzene), dihydrobenzofuran, 1,2,3,4-tetramethylbenzene, tetralin, cyclohexylbenzene, 1-methylnaphthalene, p-anisyl alcohol, dimethylnaphthalene, 3-methylbiphenyl, 4-methylbiphenyl, 3-isopropylbiphenyl, monoisopropylnaphthalene, and the mixed solution thereof is used to form the yellow light emitting layer 16C.

The materials contained in the yellow light emitting layer 16C preferably have a glass transition point in the range of 80 to 180° C. When the glass transition point is equal to or less than 80° C., a trouble may be generated in a sealing step or at the time of a display reliability test or the like. If the glass transition point is equal to or greater than 180° C., on the other hand, it would be difficult to crystallize the yellow light emitting layer. Taking these into account, the glass transition point of the low-molecular material used in the yellow light emitting layer 16C is more preferably 130 to 150° C. Incidentally, it suffices that this condition is satisfied by at least one material among the low-molecular material(s) and the light emitting material(s) constituting the yellow light emitting layer 16C. In this case, it is preferable that the amount of the material(s) satisfying the above-mentioned condition is at least about 100, based on the total weight of the materials constituting the yellow light emitting layer 16C.

Examples of the light emitting material(s) constituting the yellow light emitting layer 16C include phosphorescent host materials and fluorescent host materials represented by the following formulas (2) to (4).

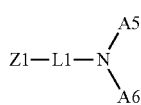

(2)

Where Z1 is a nitrogen-containing hydrocarbon group or derivative thereof; L1 is a group in which one to four divalent aromatic ring groups are linked, specifically, a divalent group in which one to four aromatic rings are linked or a derivative thereof; A5 and A6 are each an aromatic hydrocarbon group or an aromatic heterocyclic group or a derivative thereof, provided that A5 and A6 may be linked to each other to form a cyclic structure.

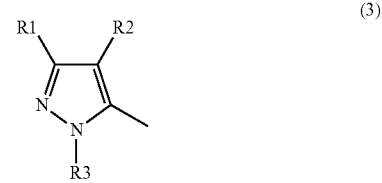

(3)

Where R1 to R3 are each independently a hydrogen atom, an aromatic hydrocarbon group having one to three aromatic rings condensed together or a derivative thereof, an aromatic hydrocarbon group in which one to three aromatic rings having a hydrocarbon group of one to six carbon atoms are condensed together or a derivative thereof, an aromatic hydrocarbon group in which one to three aromatic rings having an aromatic hydrocarbon group of six to 12 carbon atoms are condensed together or a derivative thereof.

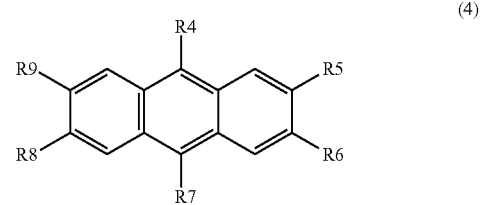

(4)

Where R4 to R9 are each a hydrogen atom, a halogen atom, hydroxyl, alkyl group of up to 20 carbon atoms, alkenyl group, carbonyl group-containing group, carbonyl ester group-containing group, alkoxyl group-containing group, cyano group-containing group, nitro group-containing group, or a derivative thereof, silyl group-containing group of up to 30 carbon atoms, aryl-containing group, heterocyclic group-containing group, amino group-containing group, or a derivative thereof.

Specific examples of the compound represented by the formula (2) include compounds represented by the following formulas (2-1) to (2-96).

11
(2-1)
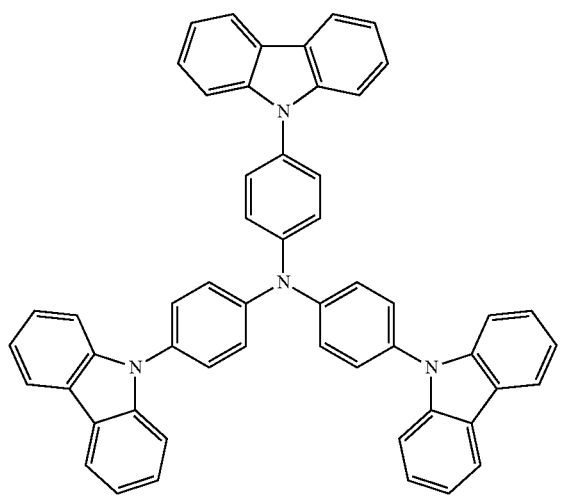
12
(2-2)
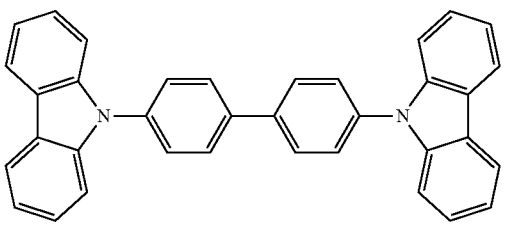
(2-3)
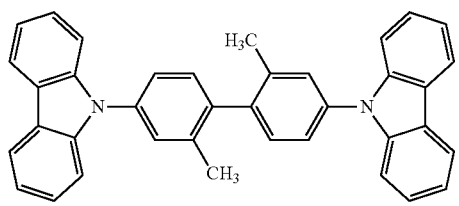
(2-4)
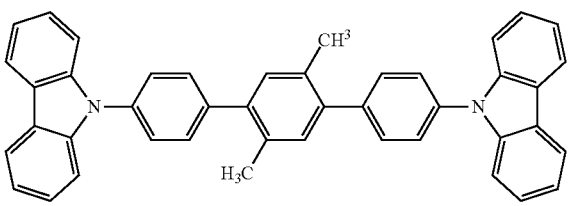
(2-5)
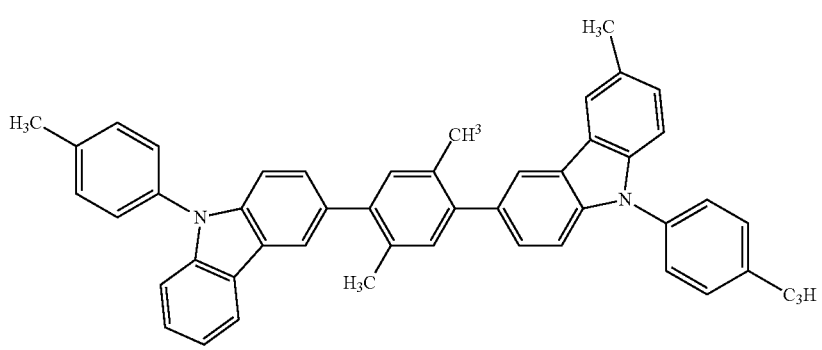
(2-6)
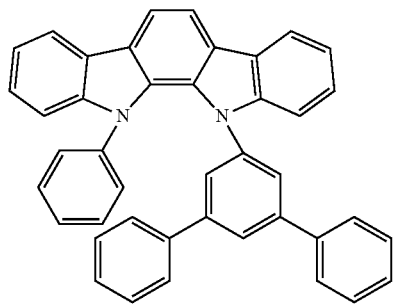
(2-7)
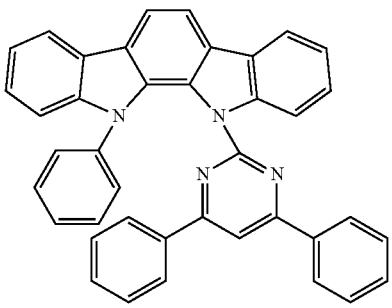

-continued
(2-8)
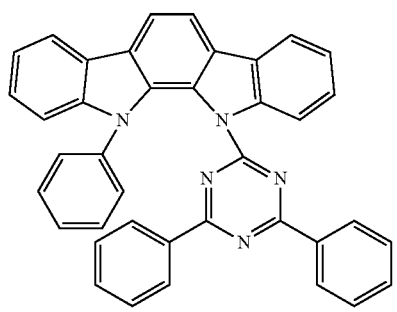
(2-9)
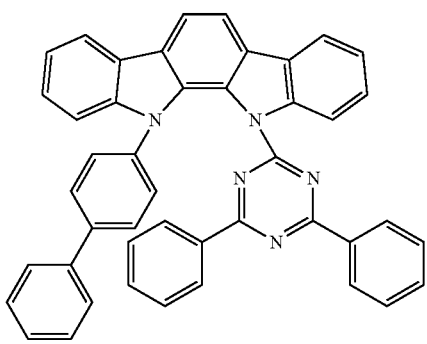
(2-10)
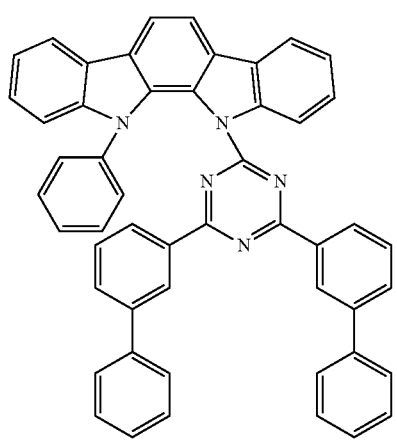
(2-11)
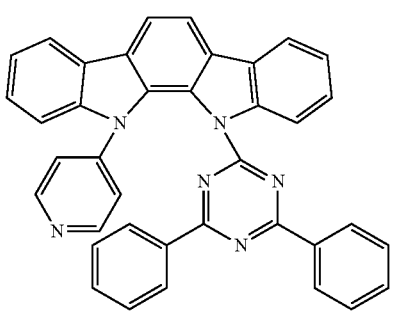
(2-12)
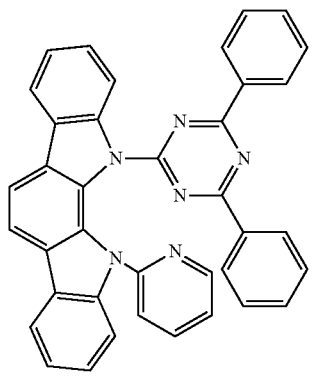
(2-13)
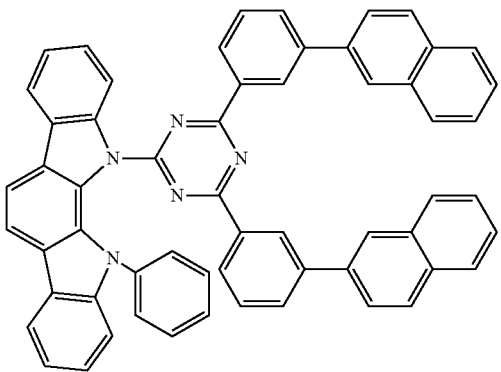

(2-14)
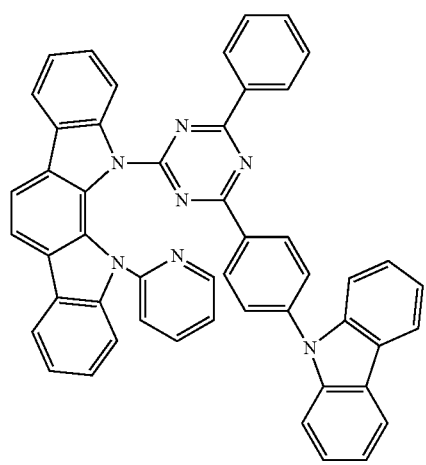
(2-15)
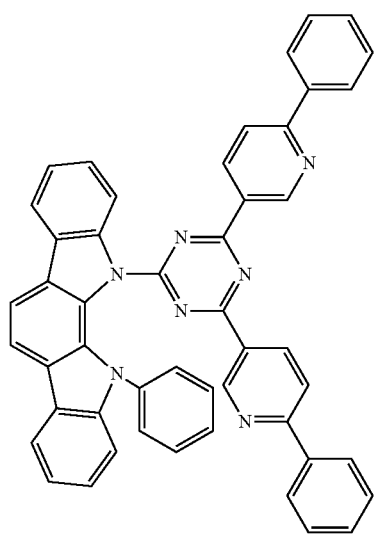
(2-16)
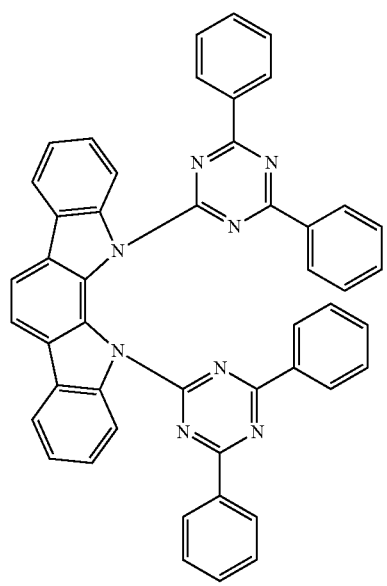
(2-17)
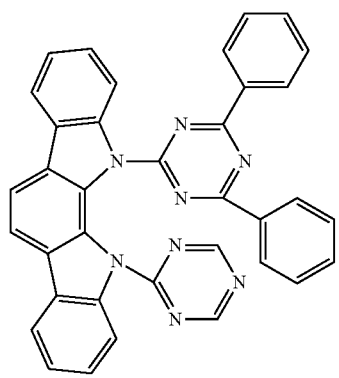
(2-18)
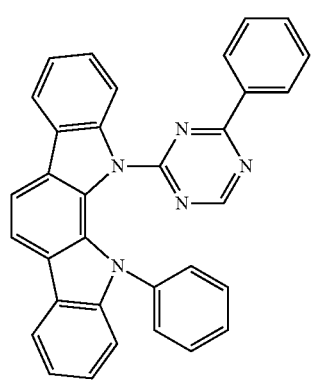
(2-19)
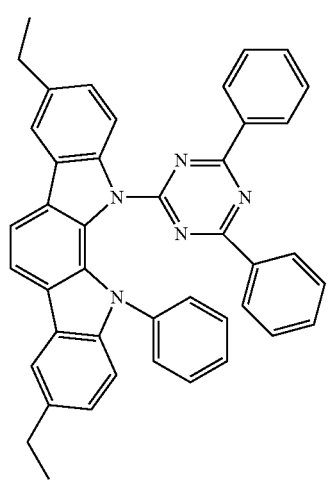

(2-20)
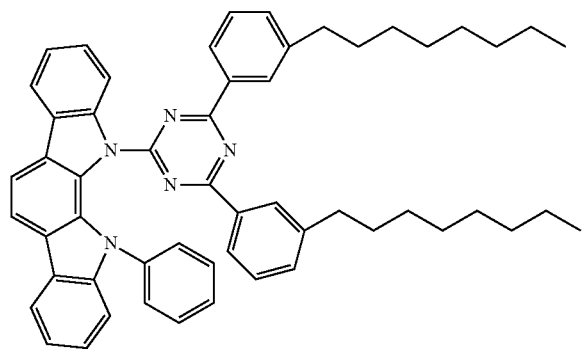
(2-21)
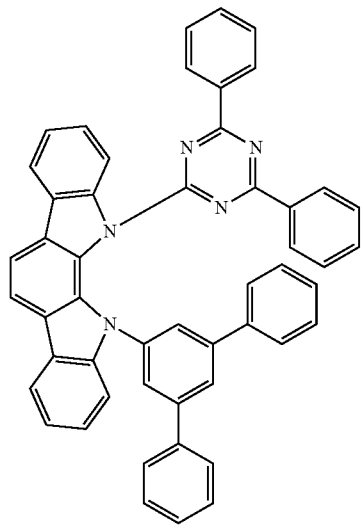
(2-22)
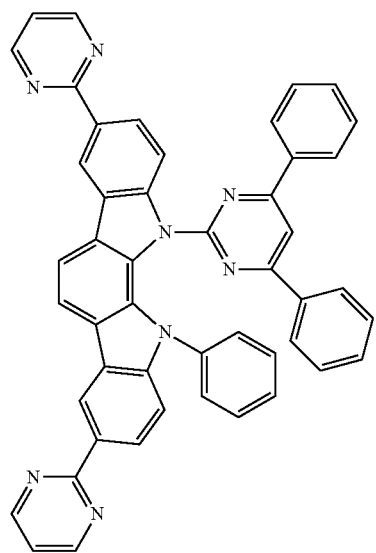
(2-23)
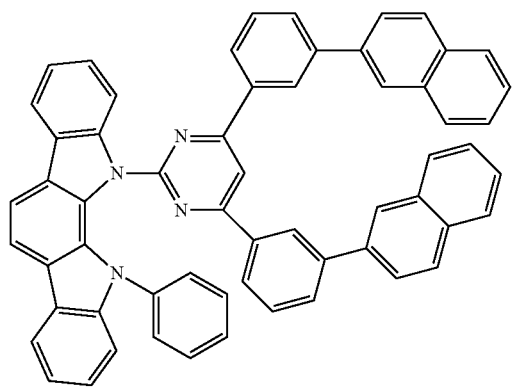
(2-24)
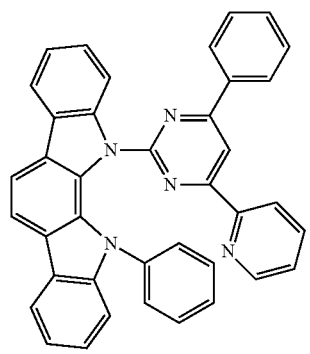
(2-25)
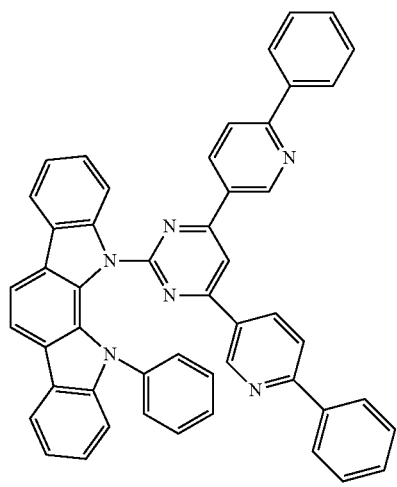

(2-26)
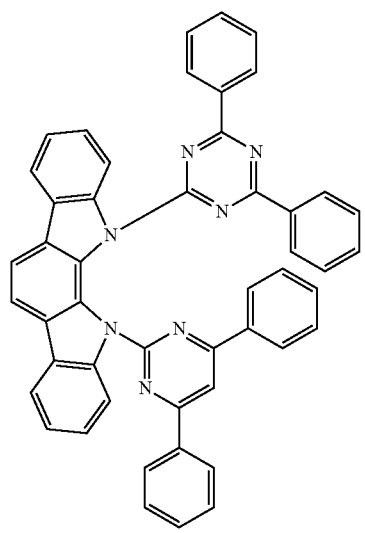
(2-27)
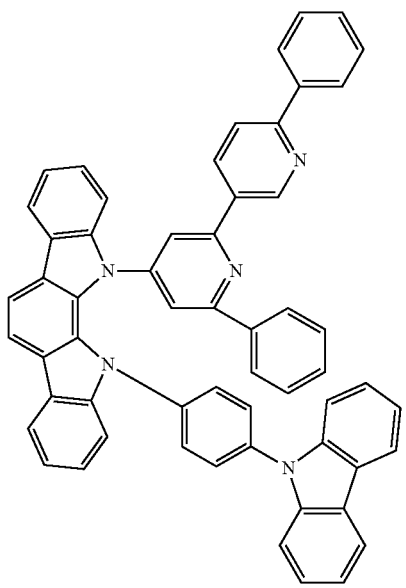
(2-28)
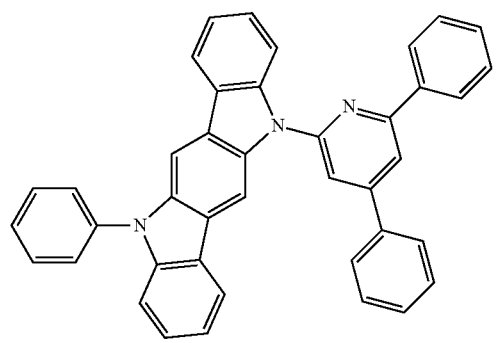
(2-29)
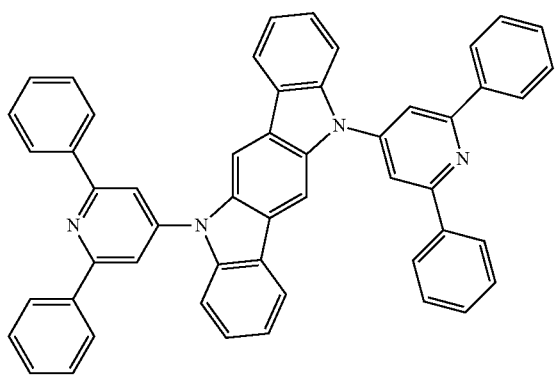
(2-30)
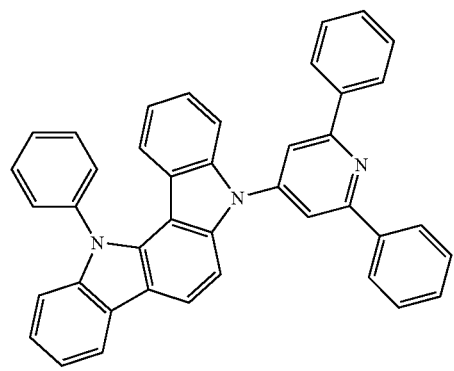
(2-31)
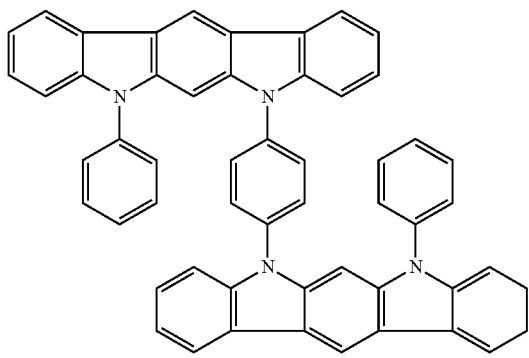

-continued
(2-32)
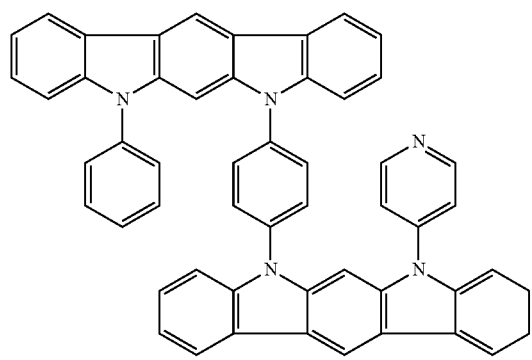
(2-33)
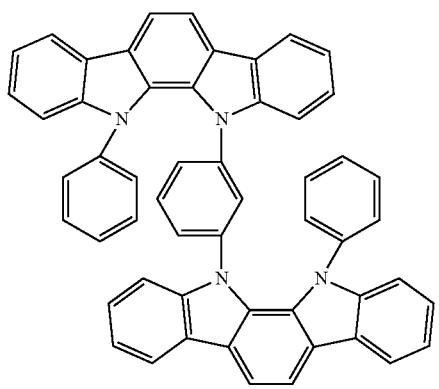
(2-34)
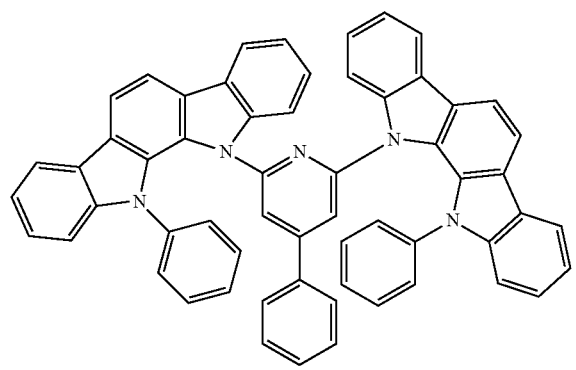
(2-35)
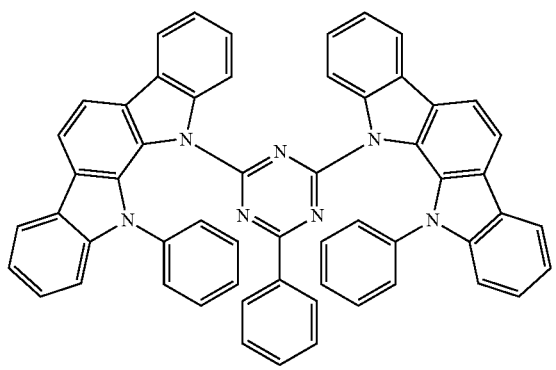
(2-36)
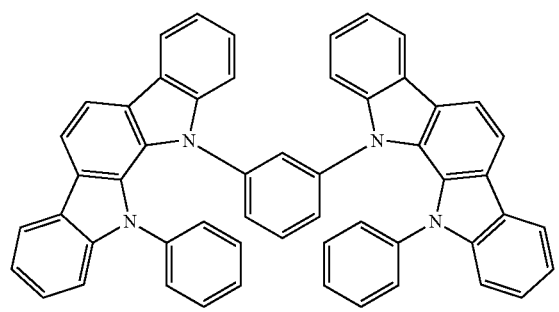
(2-37)
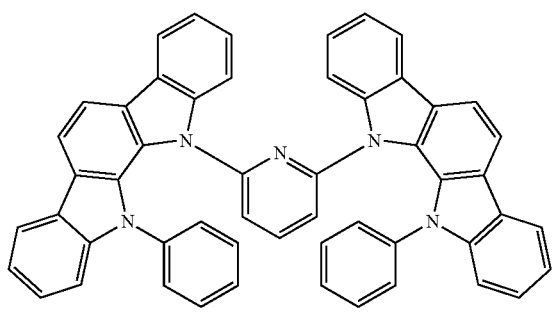
(2-38)
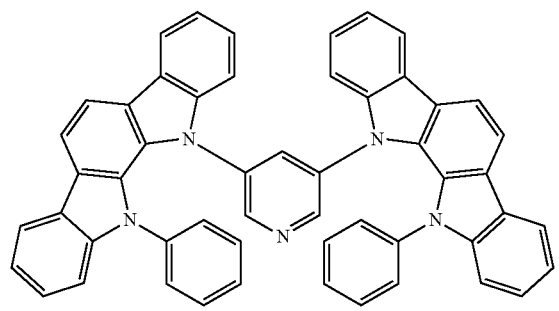
(2-39)
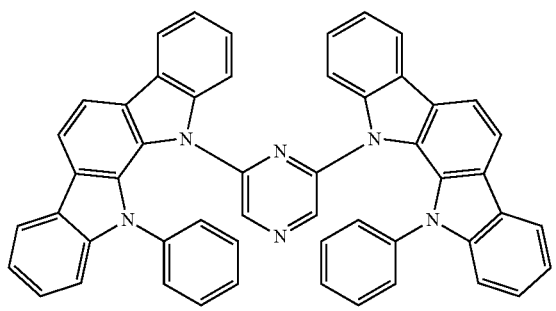

-continued
(2-40)
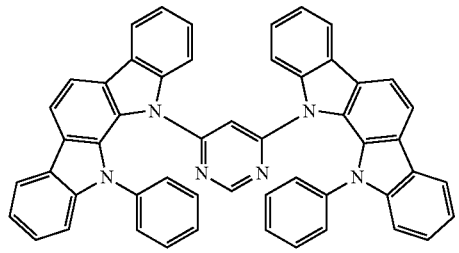
(2-41)
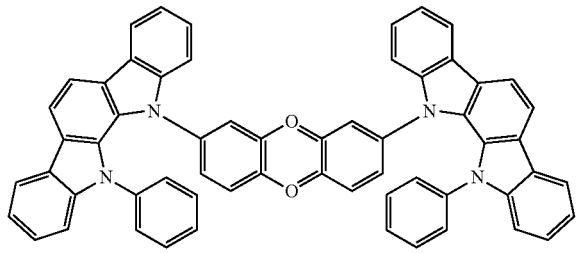
(2-42)
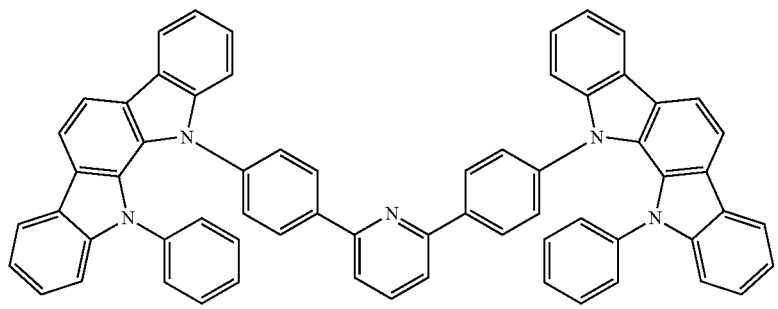
(2-43)
(2-44)
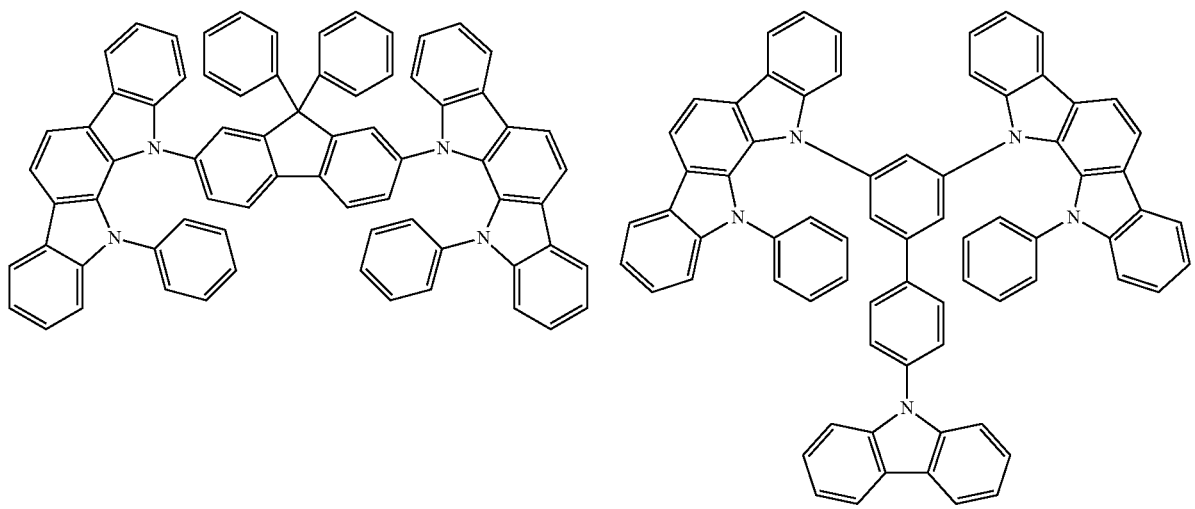
(2-45)
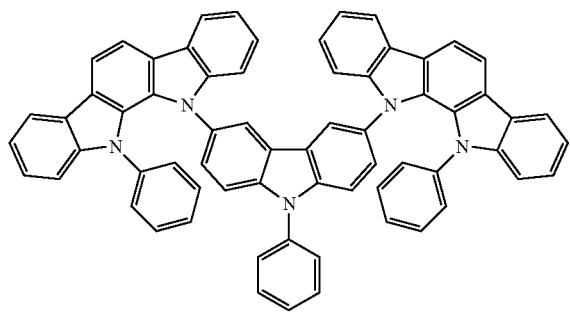
(2-46)
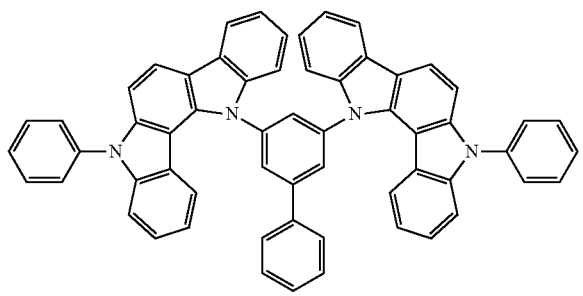

-continued
(2-47)
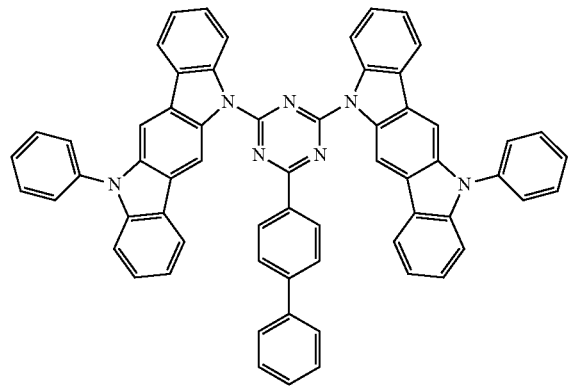
(2-48)
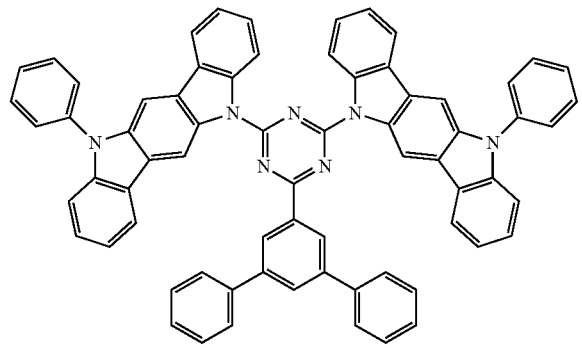
(2-49)
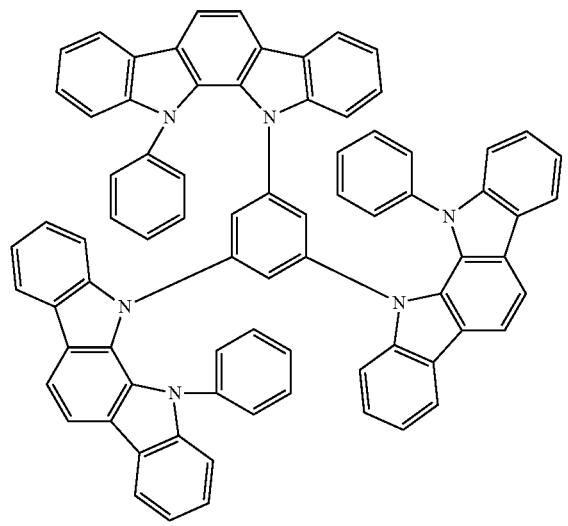
(2-50)
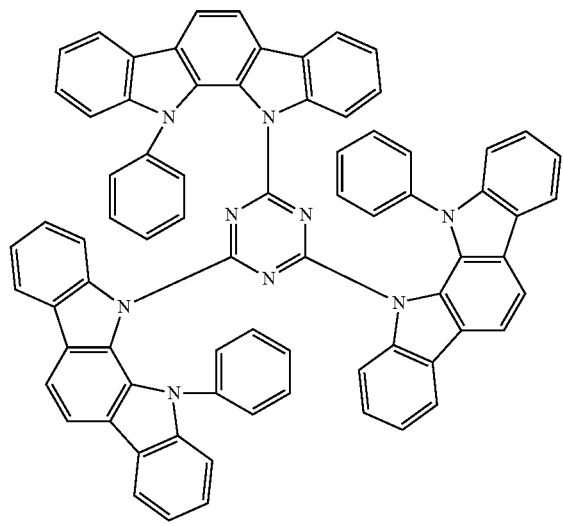
(2-51)
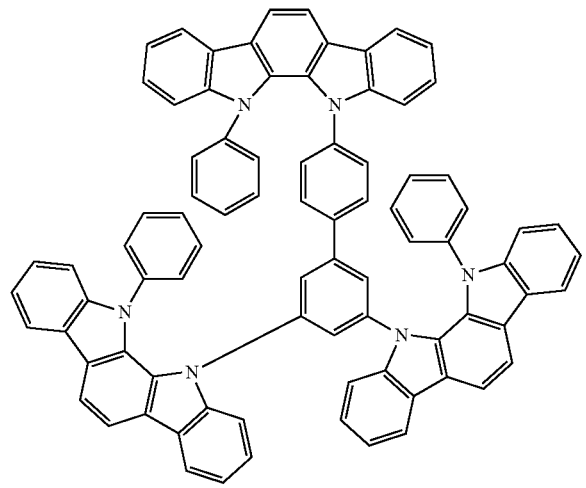
(2-52)
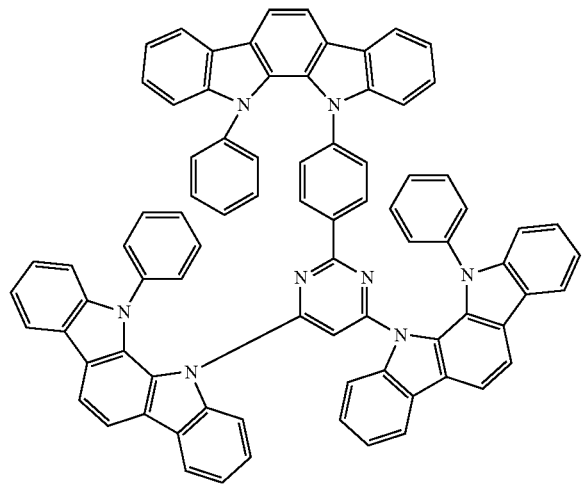

(2-53)
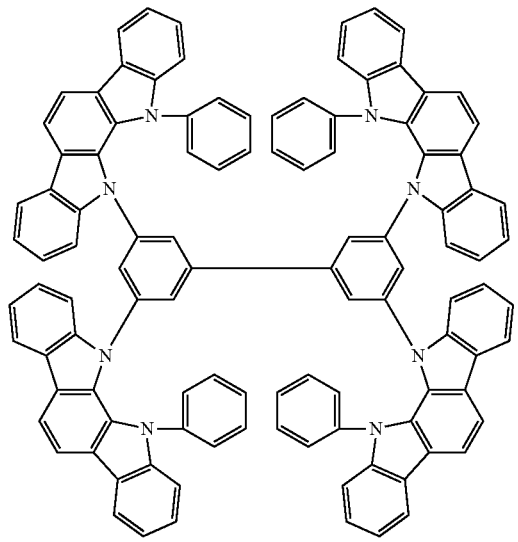
(2-54)
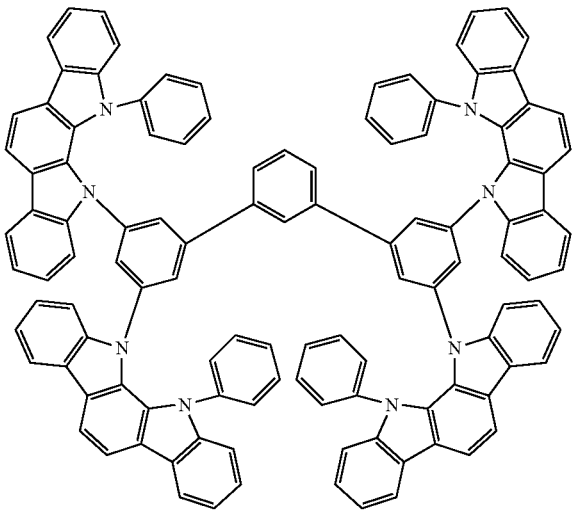
(2-55)
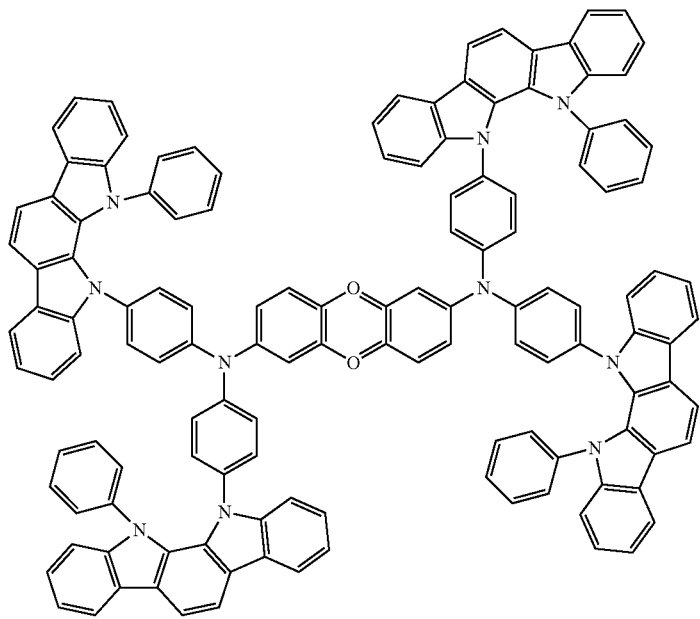

(2-56)
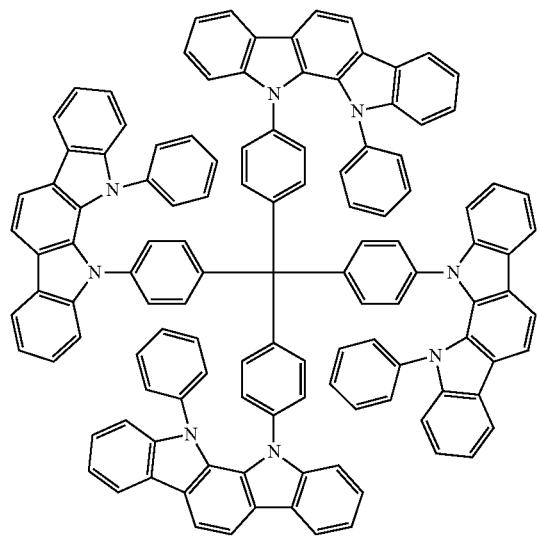
(2-57)
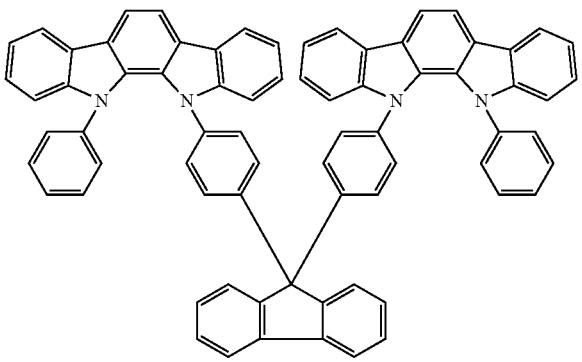
(2-58)
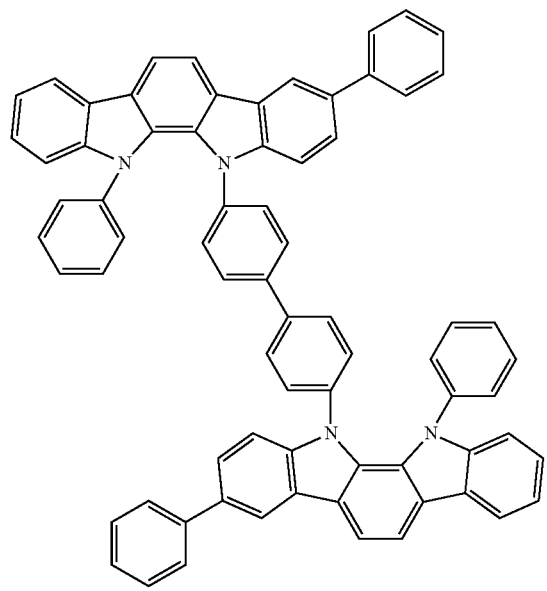
(2-59)
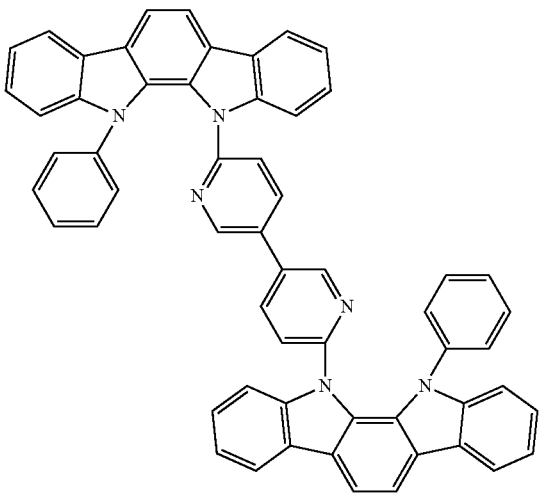
(2-60)
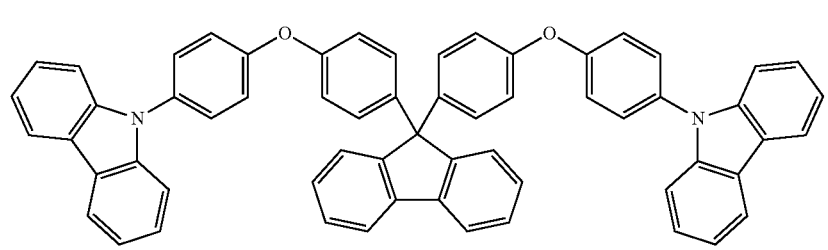
(2-61)
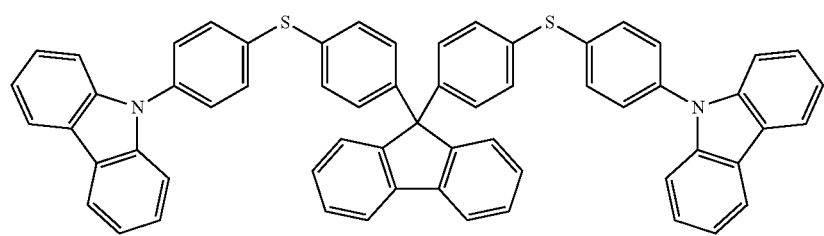

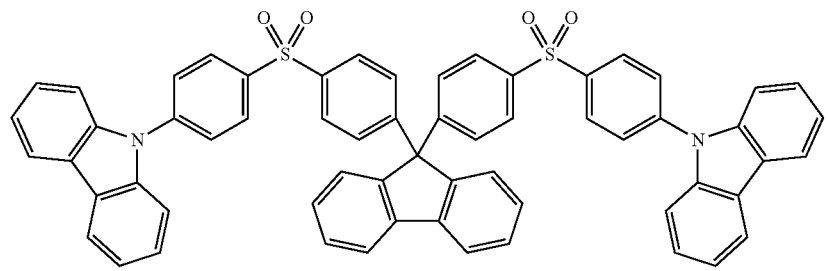
(2-62)
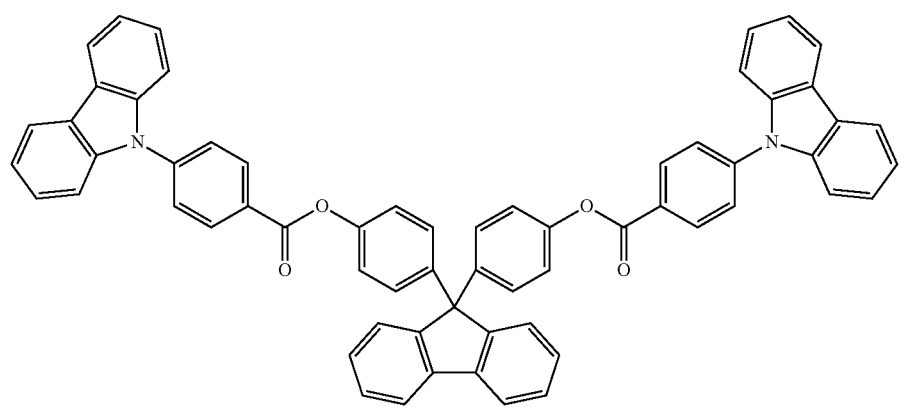
(2-63)
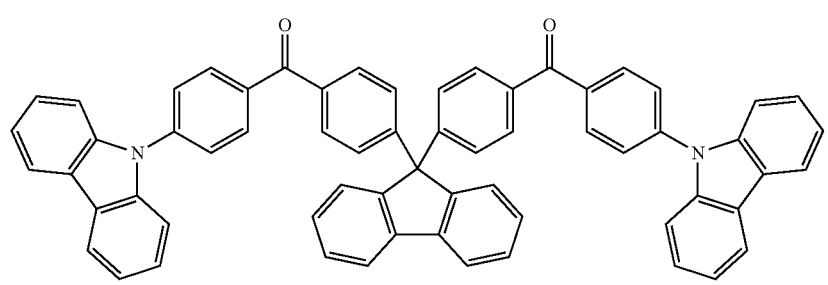
(2-64)
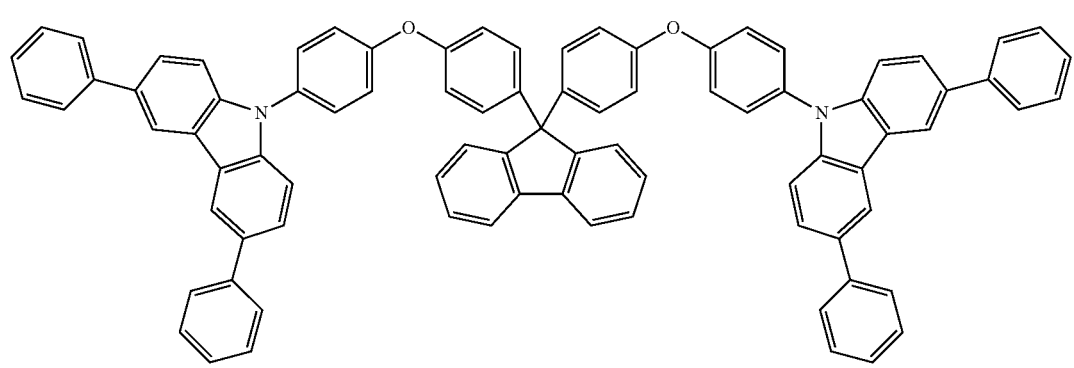
(2-65)

(2-66)
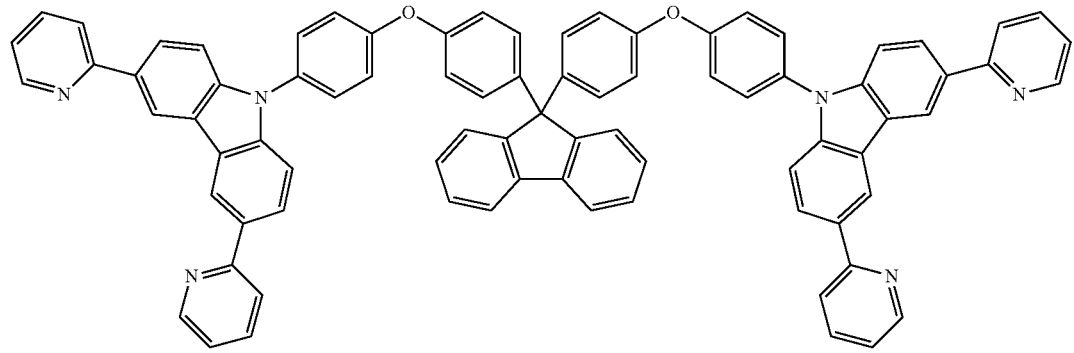
(2-67)
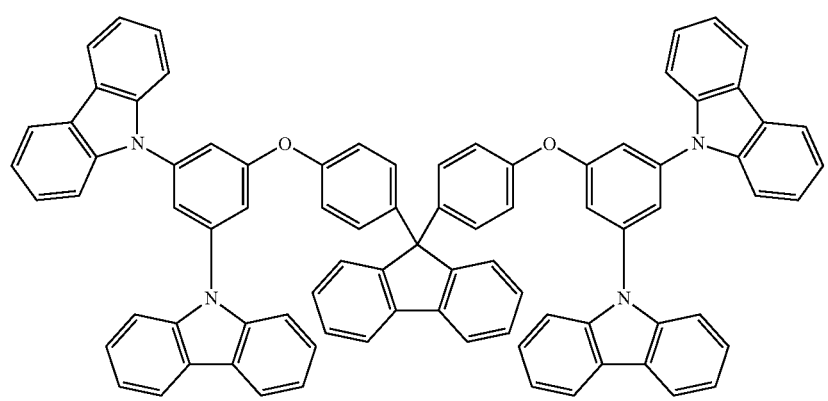
(2-68) (2-69)
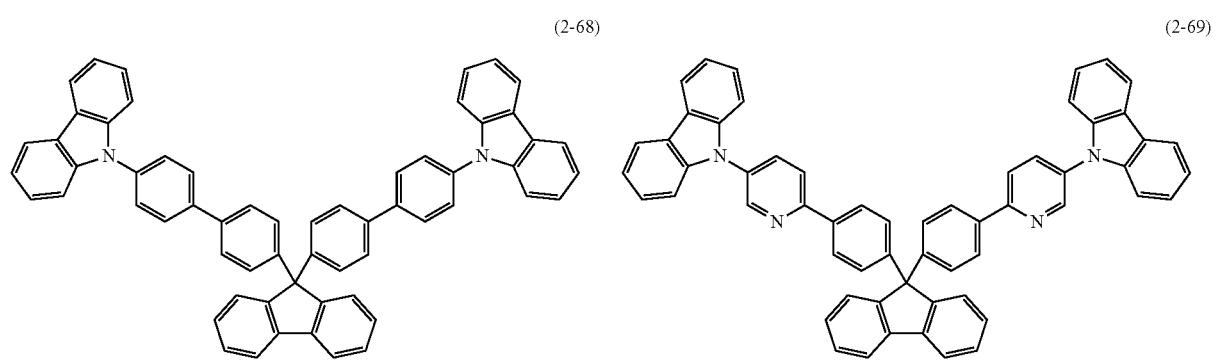
(2-70)
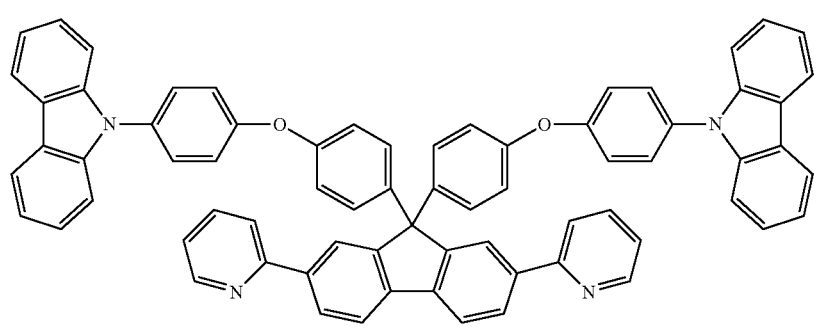

-continued
(2-71)
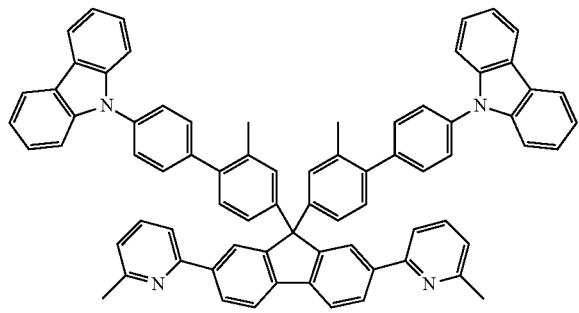
(2-72)
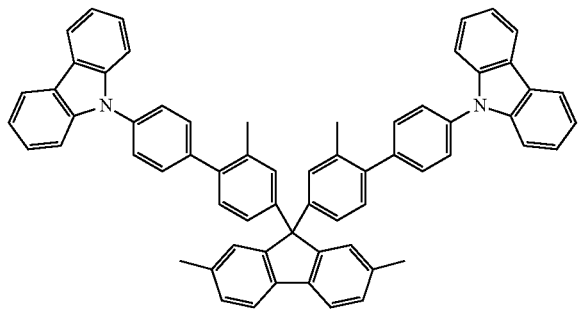
(2-73)
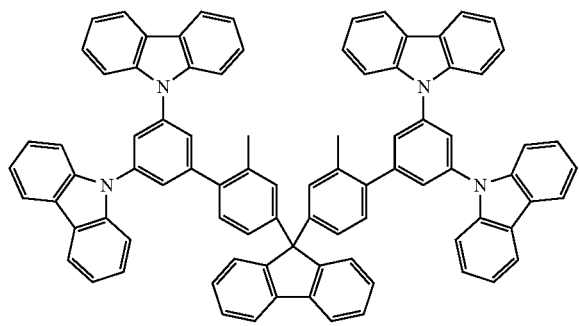
(2-74)
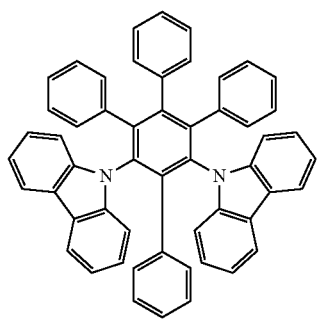
(2-75)
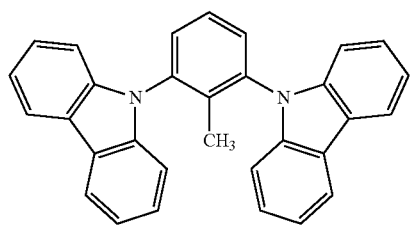
(2-76)
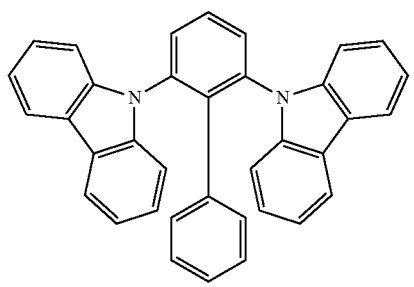
(2-77)
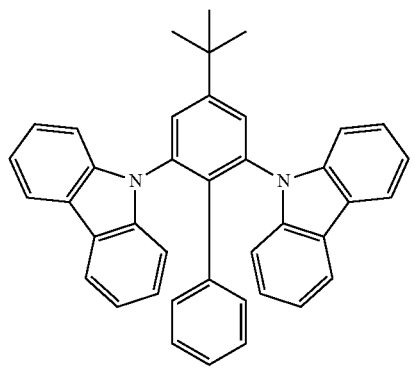
(2-78)
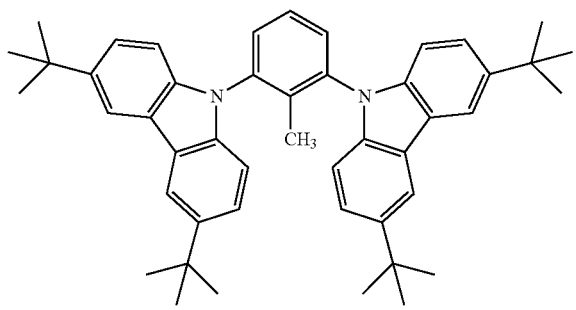

-continued
(2-79)
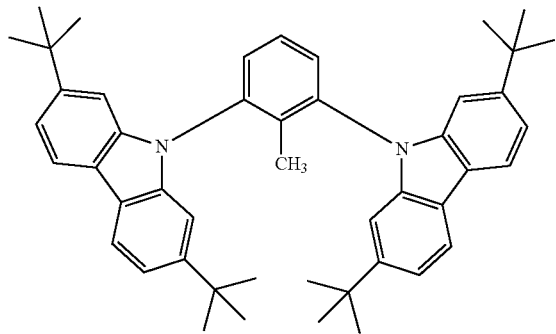
(2-80)
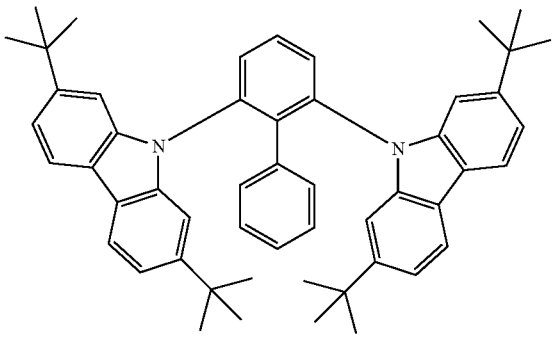
(2-81)
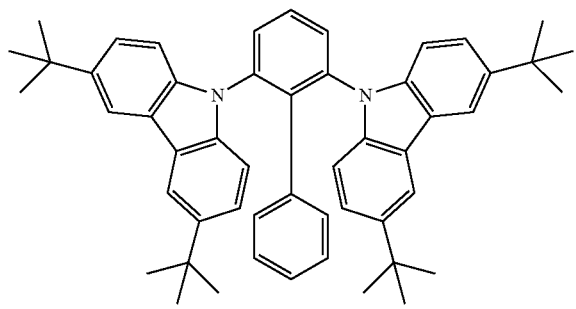
(2-82)
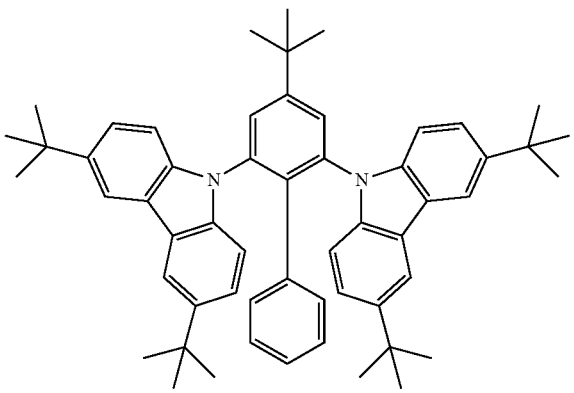
(2-83)
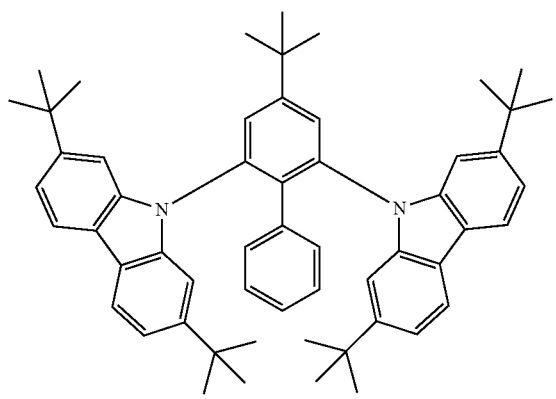
(2-84)
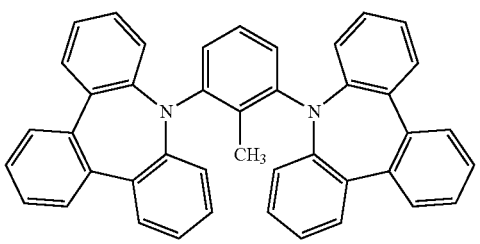
(2-85)
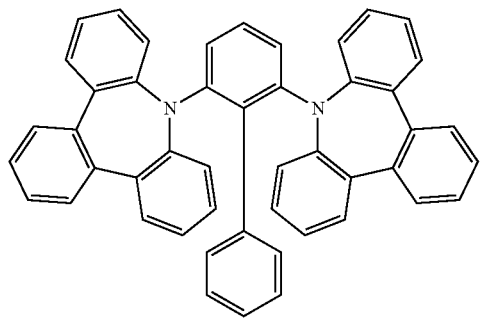
(2-86)
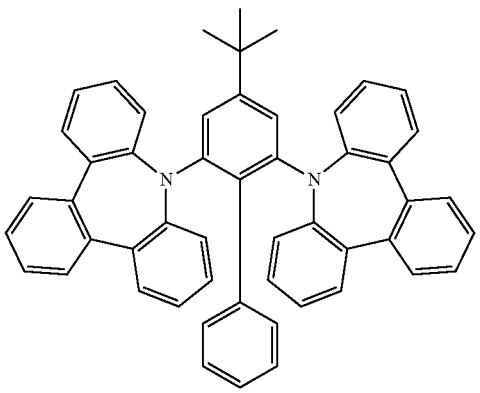

-continued
(2-87)
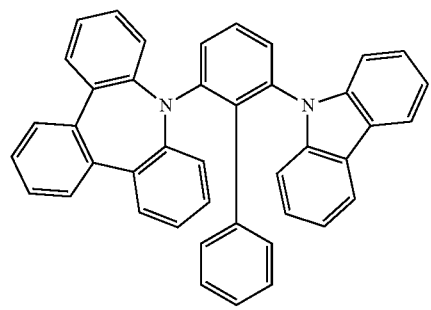
(2-88)
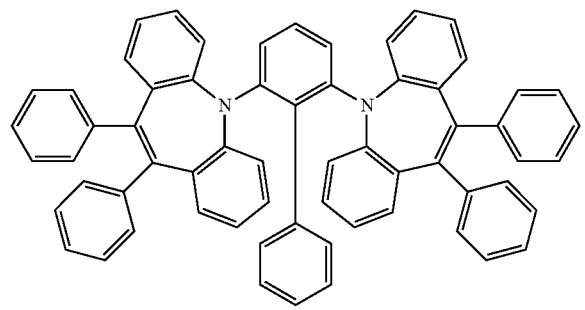
(2-89)
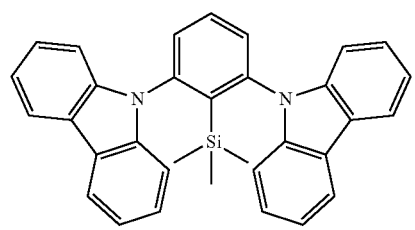
(2-90)
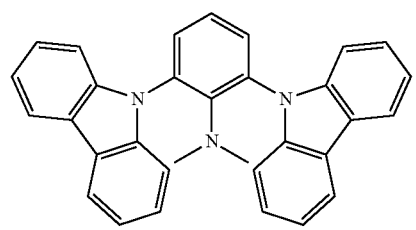
(2-91)
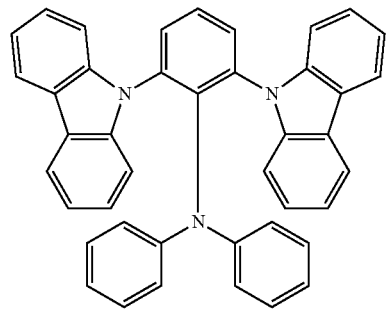
(2-92)
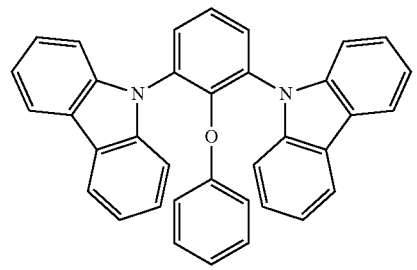
(2-93)
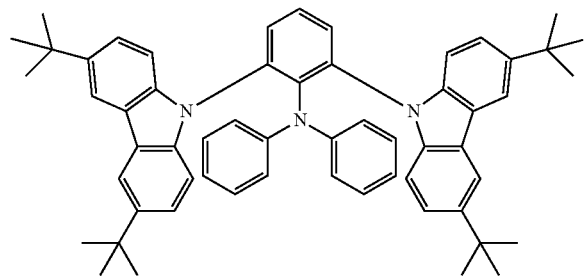
(2-94)
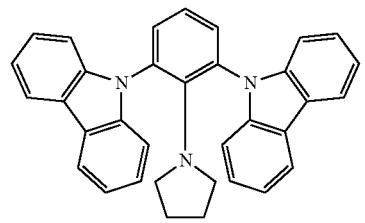
(2-95)
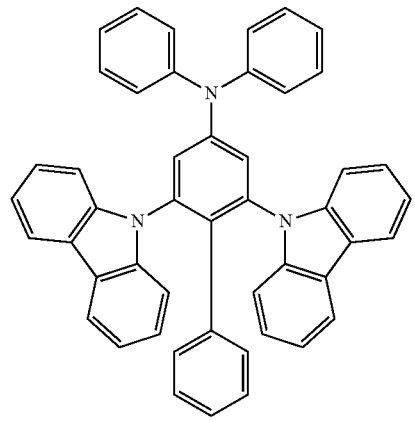
(2-96)
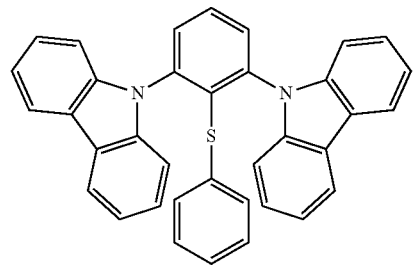

Specific examples of the compound represented by the above formula (3) include compounds represented by the following formulas (3-1) to (3-5).

(3-1)
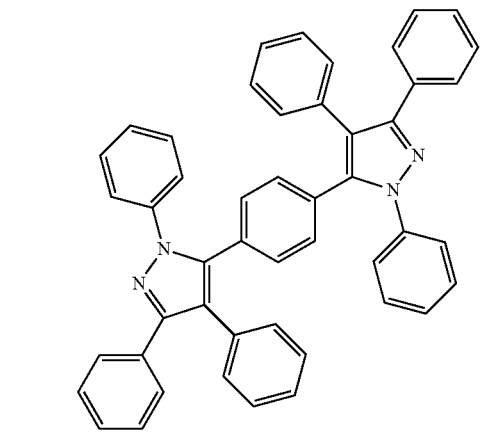

(3-2)
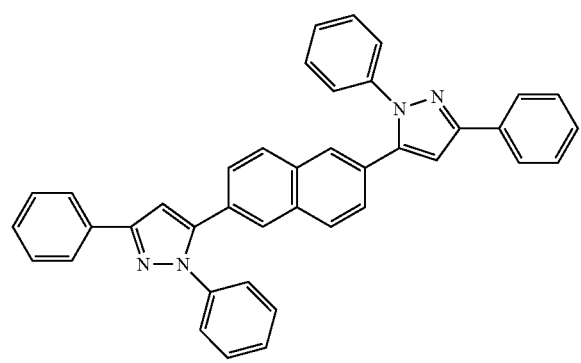

(3-3)
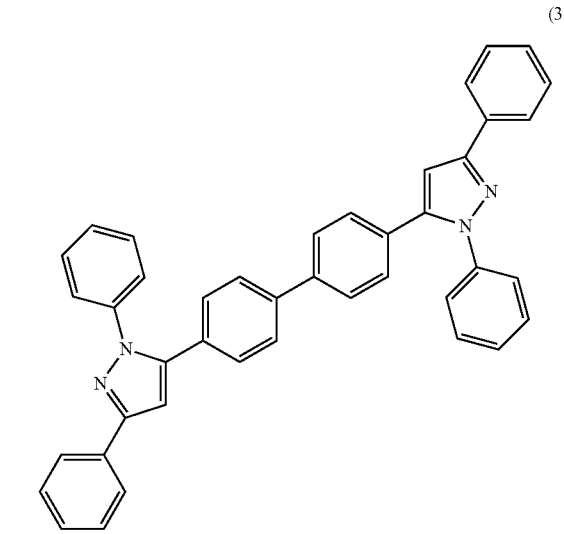

(3-4)
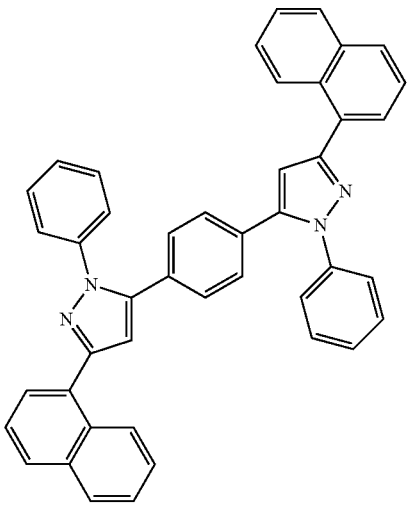

(3-5)
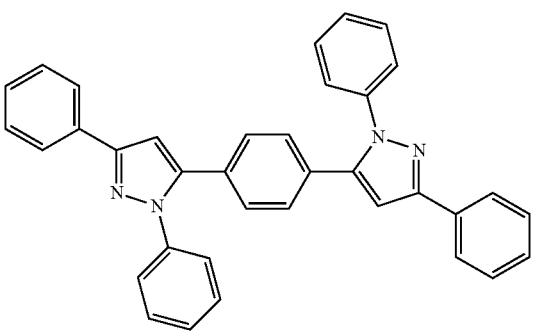

Examples of the aryl group-containing groups represented by R1 to R6 in the compound represented by the above formula (4) include phenyl, 1-naphthyl, 2-naphthyl, fluorenyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 1-chrysenyl, 6-chrysenyl, 2-fluoranthenyl, 3-fluoranthenyl, 2-biphenylyl, 3-biphenylyl, 4-biphenylyl, o-tolyl, m-tolyl, p-tolyl, and p-t-butylphenyl group.

In addition, the heterocyclic group-containing groups represented by R4 to R9 are five- or six-membered aromatic ring groups containing an oxygen atom (O), nitrogen atom (N) or sulfur atom (S) as a hetero-atom, and include condensed polycyclic aromatic ring groups of two to 20 carbon atoms. Examples of such heterocyclic groups include thienyl, furyl, pyrrolyl, pyridyl, quinolyl, quinoxalyl, imidazopyridyl, and benzothiazole group. Representative examples include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbozolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, and 9-acridinyl group.

The amino group-containing groups represented by R4 to R9 may be any of alkylamino groups, arylamino groups, aralkylamino groups and the like. These groups preferably have an aliphatic hydrocarbon group of 1 to 6 carbon atoms and/or an aromatic ring group of 1 to 4 carbon atoms. Examples of such groups include dimethylamino, diethylamino, dibutylamino, diphenylamino, ditolylamino, bisbiphenylylamino, and dinaphthylamino group. Incidentally, the just-mentioned substituent group(s) may be two or more substituent groups forming a condensed ring, or a derivative thereof.

Specific examples of the compounds represented by the above formula (4) include compounds represented by the following formulas (4-1) to (4-51).

(4-1)

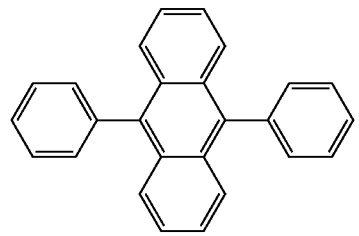

(4-2)

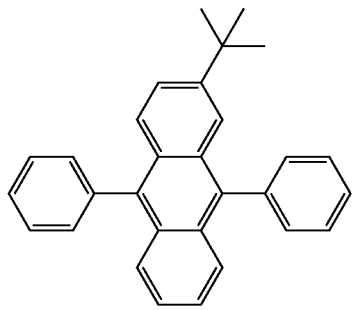

(4-3)

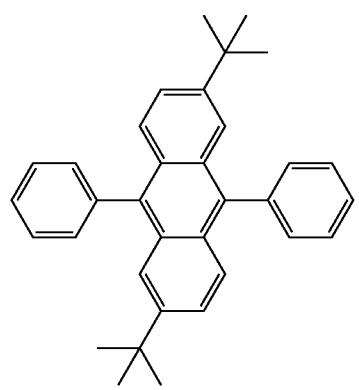

(4-4)

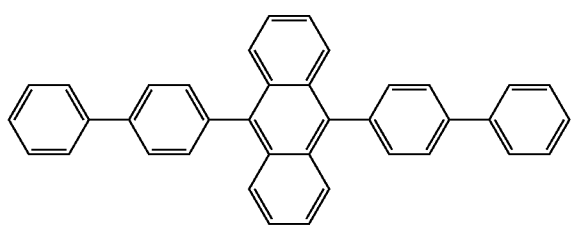

(4-5)

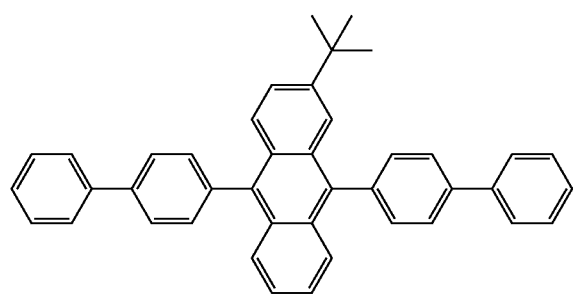

(4-6)

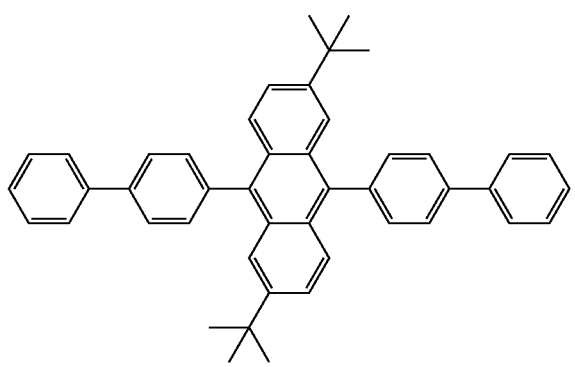

(4-7)

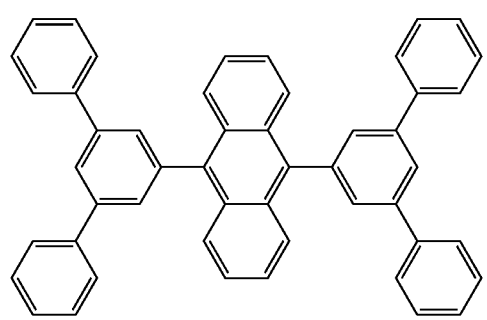

(4-8)

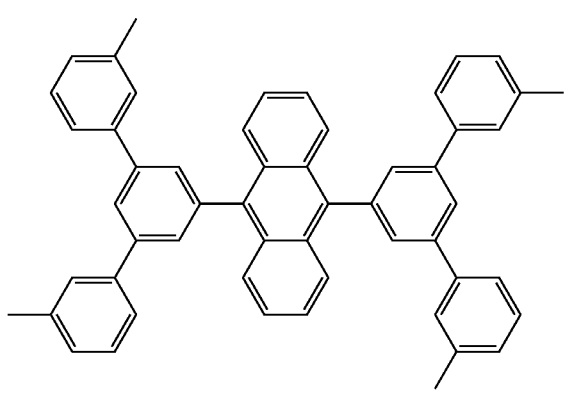

(4-9) 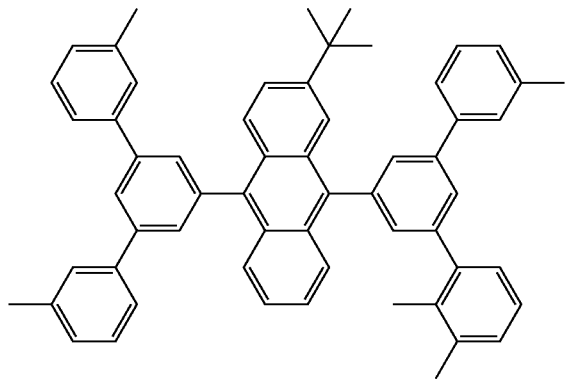
(4-10) 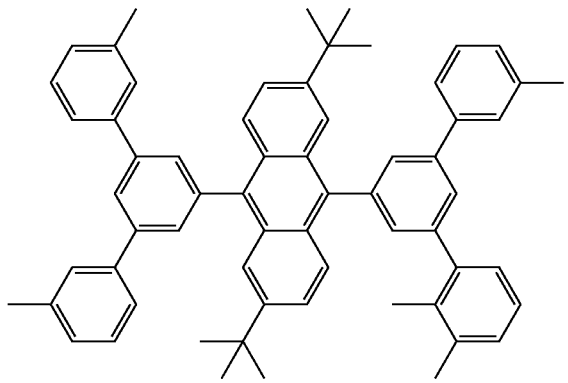
(4-11) 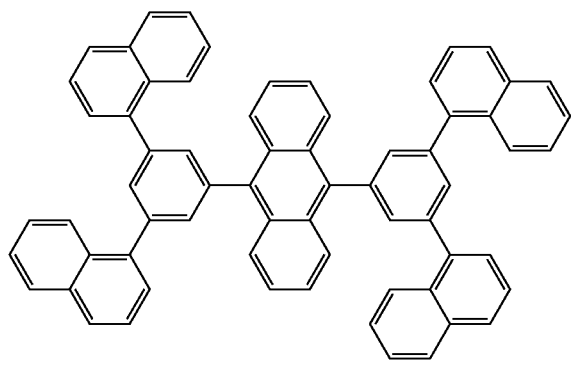
(4-12) 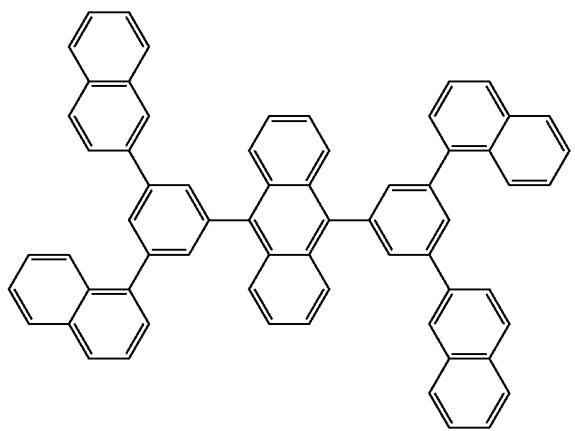
(4-13) 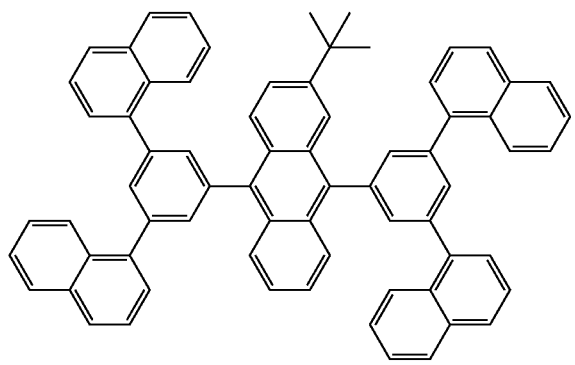
(4-14) 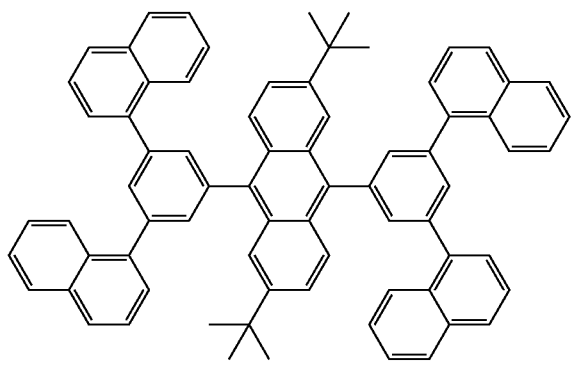
(4-15) 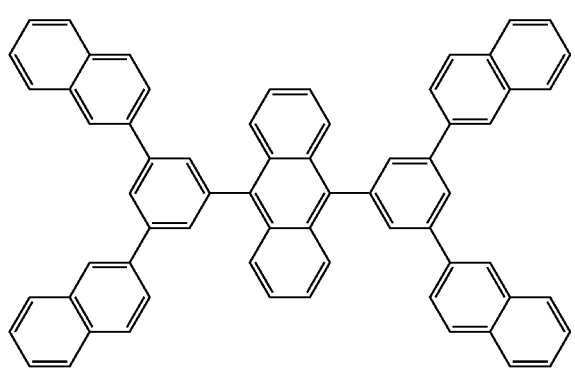
(4-16) 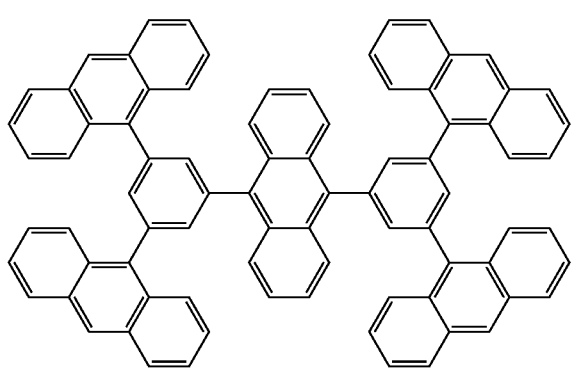

-continued
(4-17)
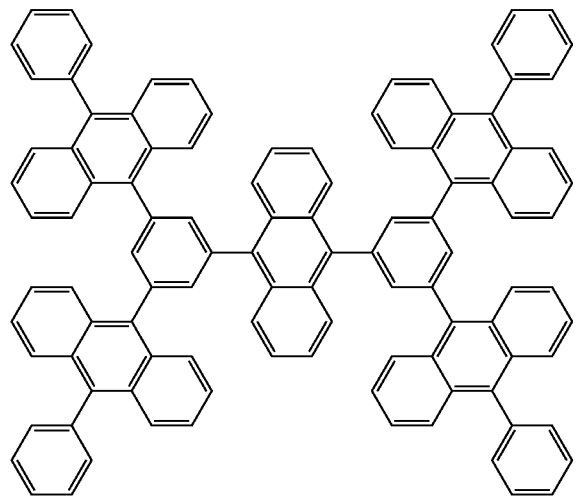
(4-18)
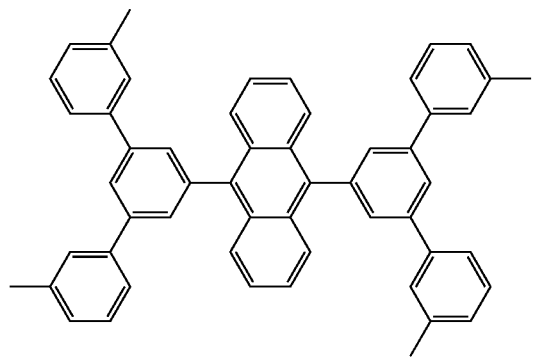
(4-19)
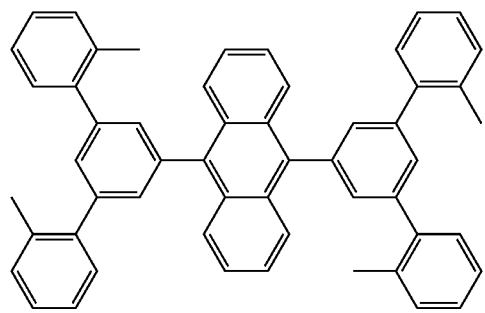
(4-20)
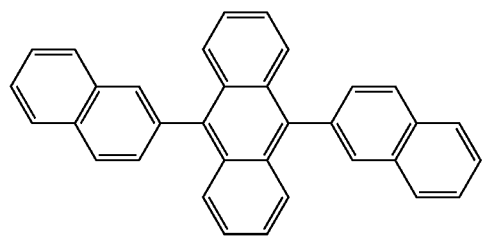
(4-21)
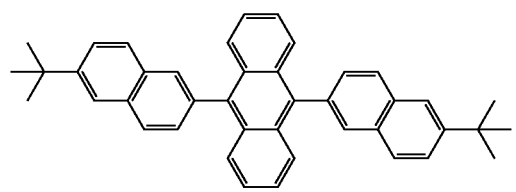
(4-22)
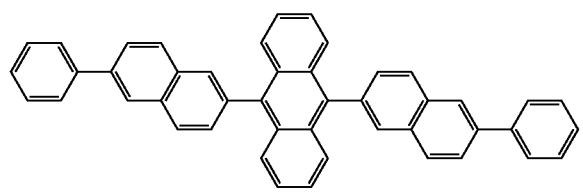
(4-23)
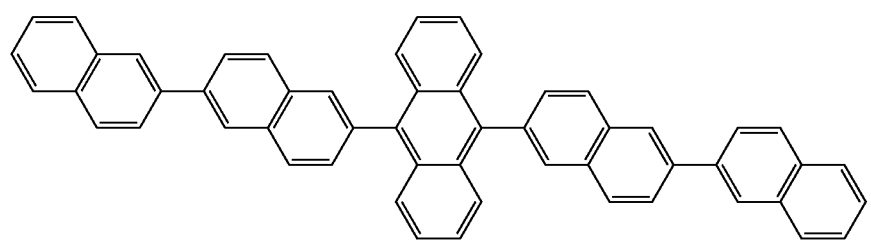
(4-24)
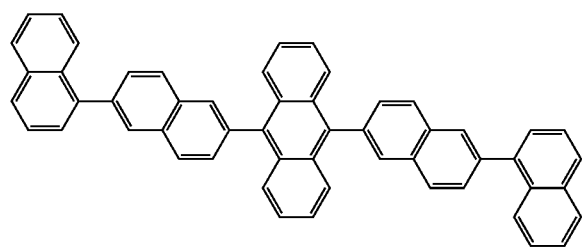
(4-25)
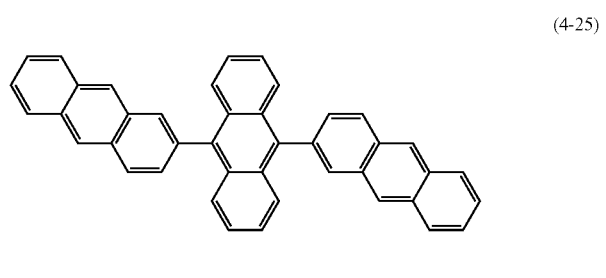

-continued
(4-26)
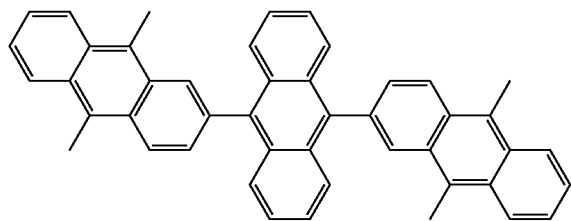
(4-27)
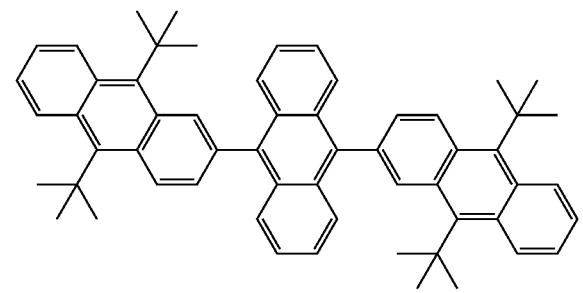
(4-28)
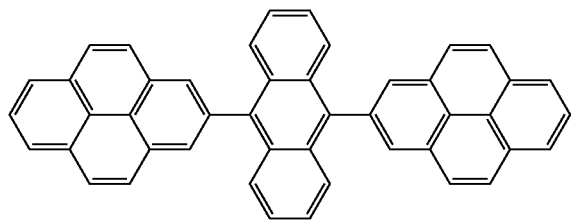
(4-29)
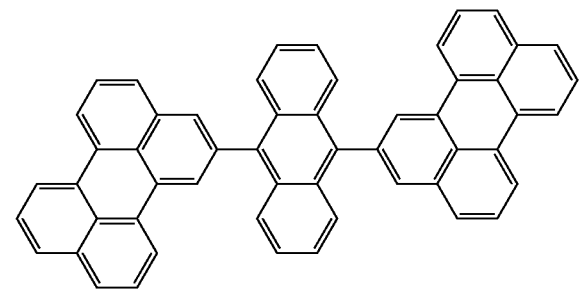
(4-30)
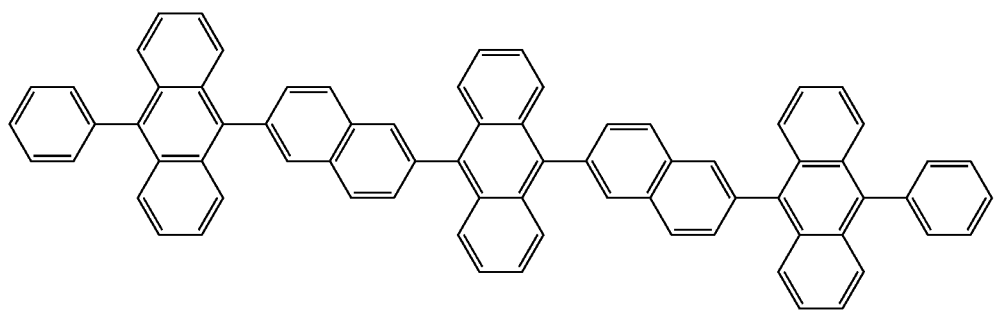
(4-31)
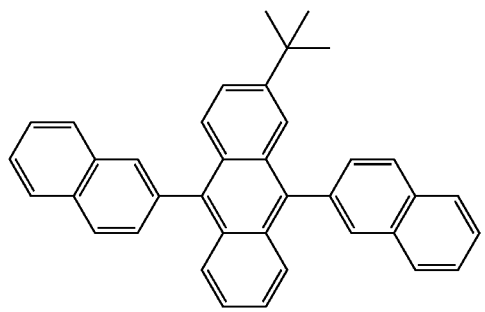
(4-32)
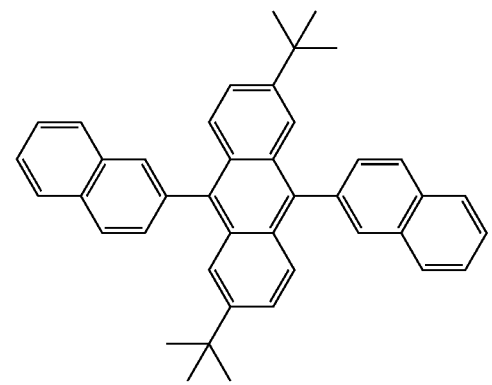
(4-33)
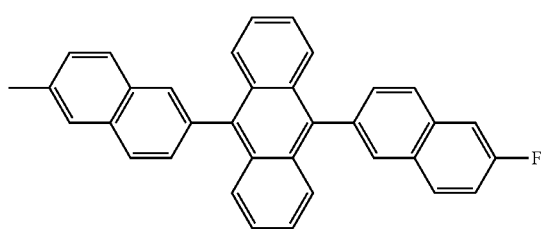
(4-34)
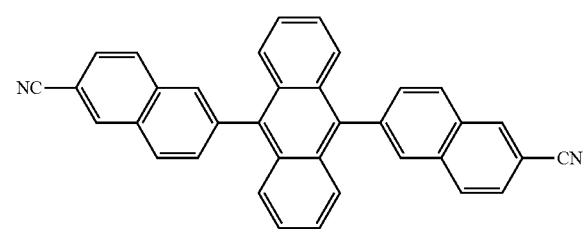

-continued
(4-35)
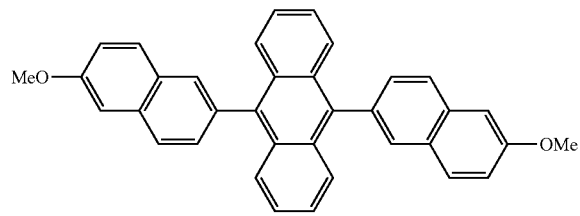
(4-36)
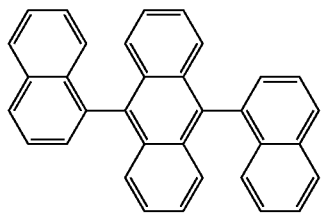
(4-37)
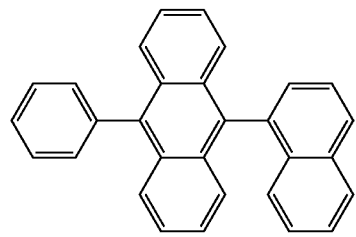
(4-38)
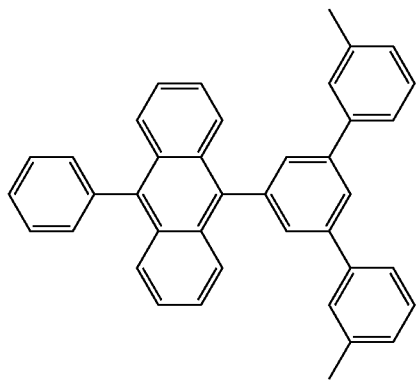
(4-39)
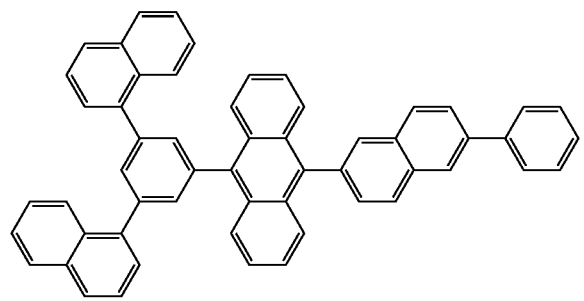
(4-40)
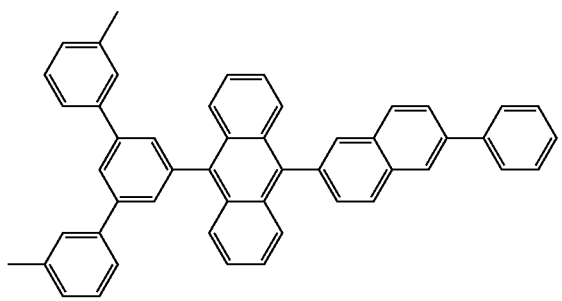
(4-41)
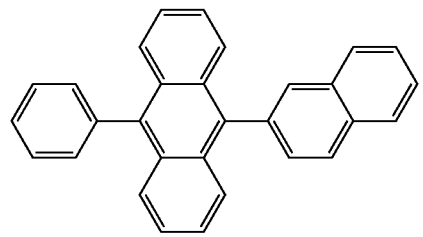
(4-42)
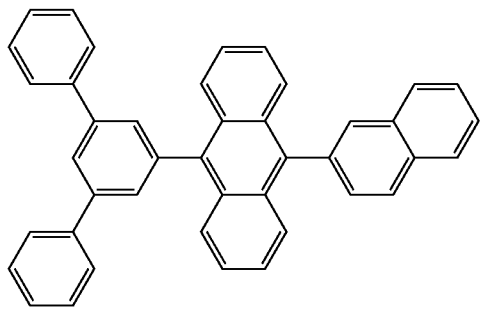
(4-43)
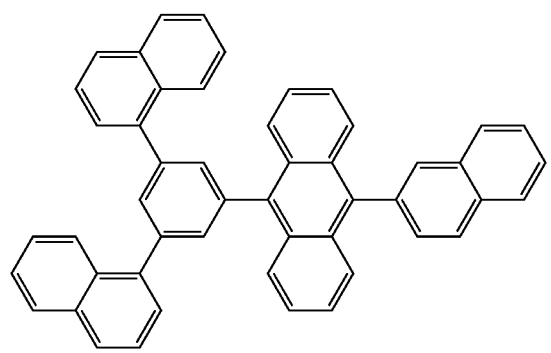
(4-44)
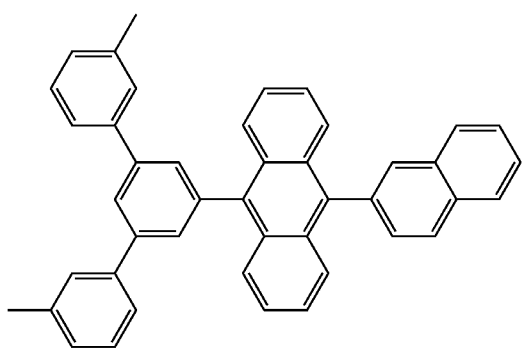

(4-45)
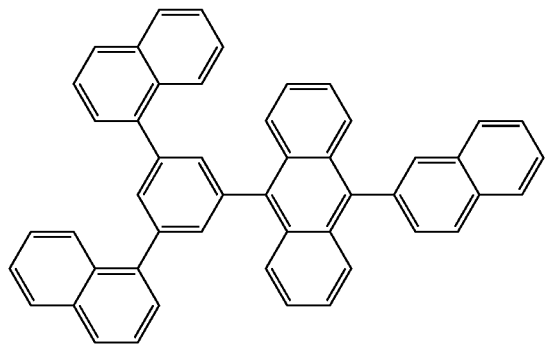
(4-46)
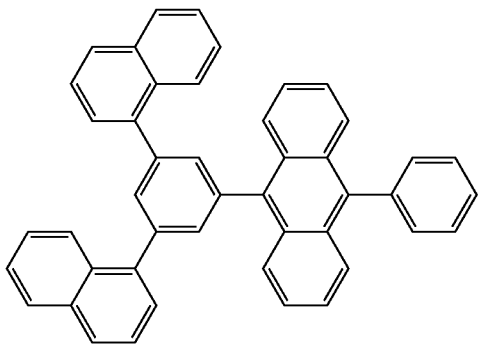
(4-47)
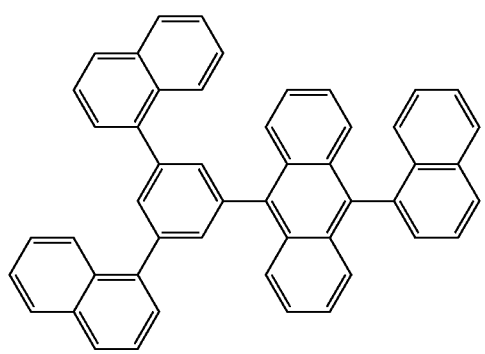
(4-48)
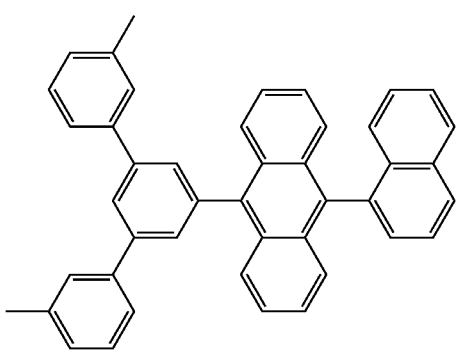
(4-49)
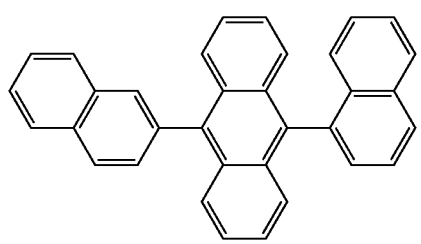
(4-50)
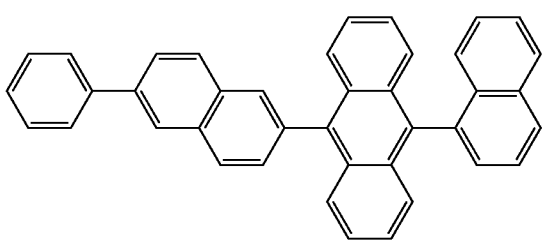
(4-51)
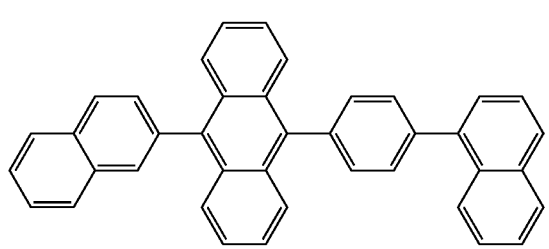
Besides, it is preferable to use as the dopant a phosphorescent metal complex compound, wherein the center metal is a metal selected from Groups 7 to 11 of the Periodic Table. Examples of the metal include beryllium (Be), boron (B), zinc (Zn), cadmium (Cd), magnesium (Mg), gold (Au), silver (Ag), palladium (Pd), platinum (Pt), aluminum (Al), gadolinium (Ga), yttrium (Y), scandium (Ac), ruthenium (Ru), rhodium (Rh), osmium (Os), and iridium (Ir). Further specific, but nonlimitative, examples of the phosphorescent metal complex compound include compounds represented by the following formulas (5-1) to (5-29). Incidentally, the just-mentioned dopants may be used either singly or in combination of two or more of them. Besides, dopants having different center metals may be used in combination.

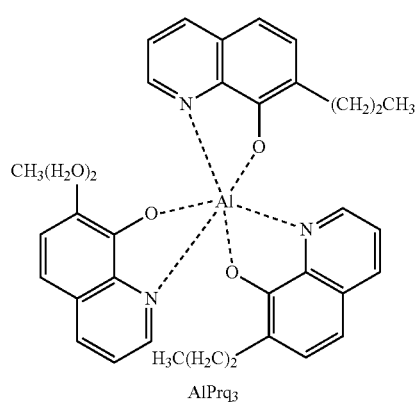

(5-1) AlPrq$_3$

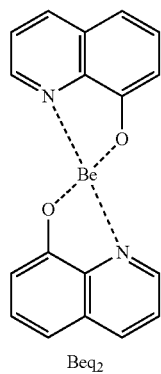

(5-2) Beq$_2$

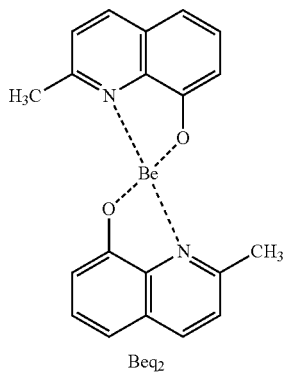

(5-3) Beq$_2$

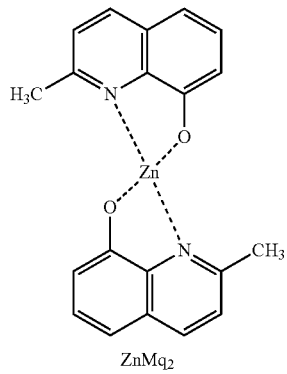

(5-4) ZnMq$_2$

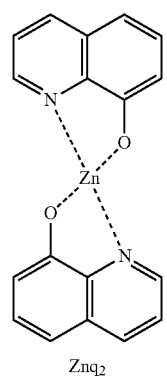

(5-5) Znq$_2$

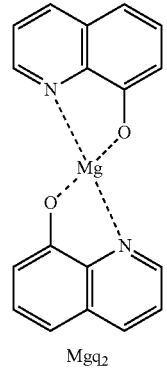

(5-6) Mgq$_2$

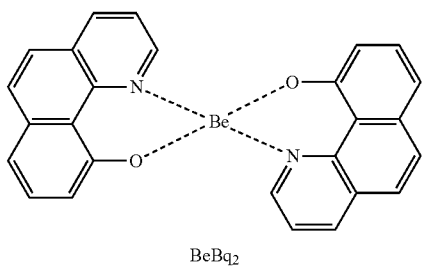

(5-7) BeBq$_2$ (5-8)
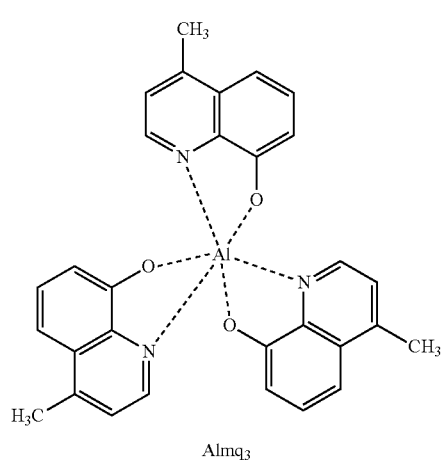
Almq₃
(5-9)
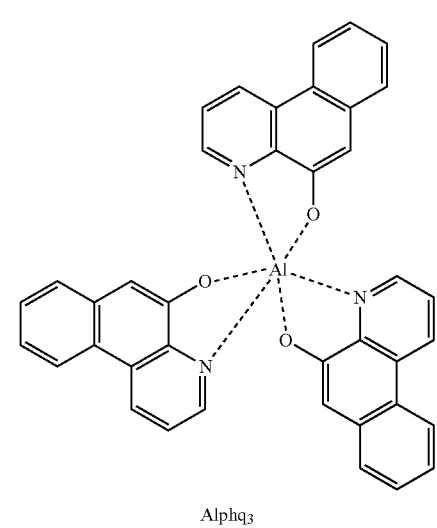
Alphq₃
(5-10)
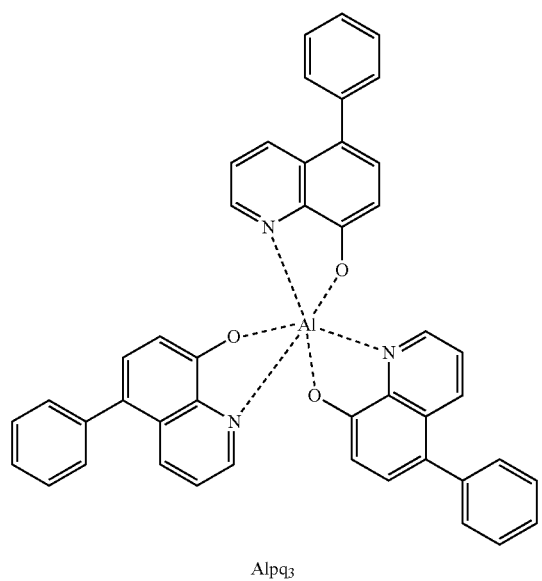
Alpq₃
(5-11)
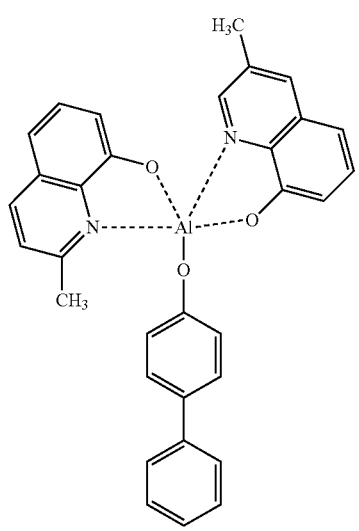
BAlq
(5-12)
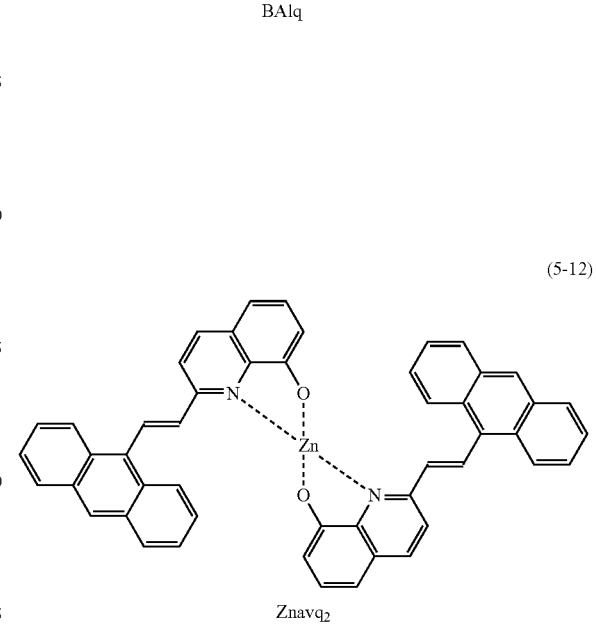
Znavq₂
(5-13)
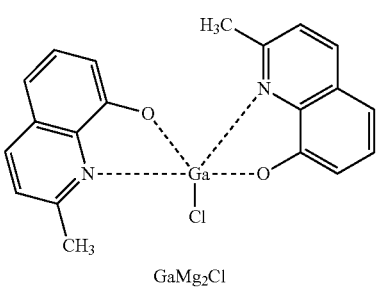
GaMq₂Cl (5-14)
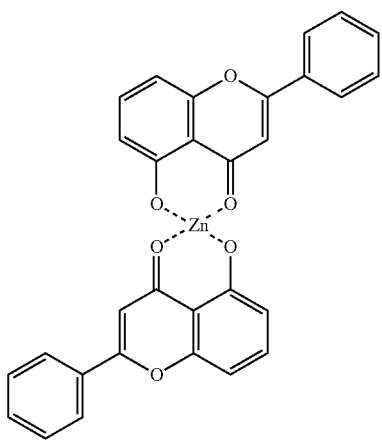
Zn(5Fla)₂
(5-15)
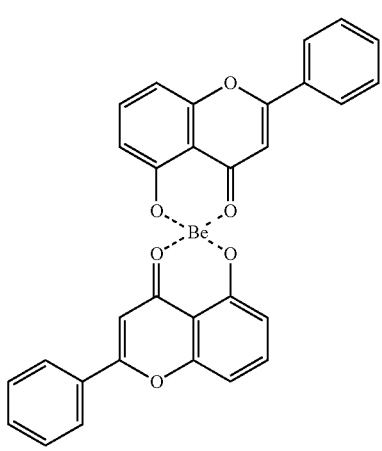
Be(5Fla)₂
(5-16)
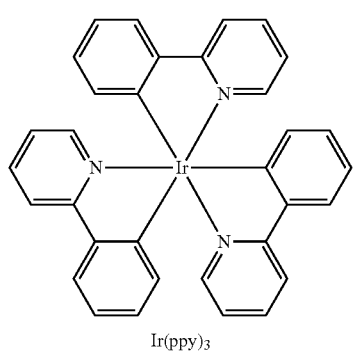
Ir(ppy)₃
(5-17)
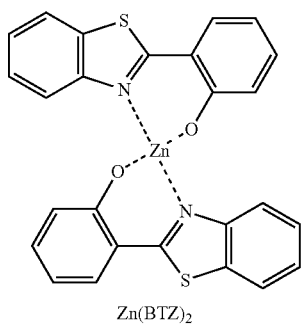
Zn(BTZ)₂
(5-18)
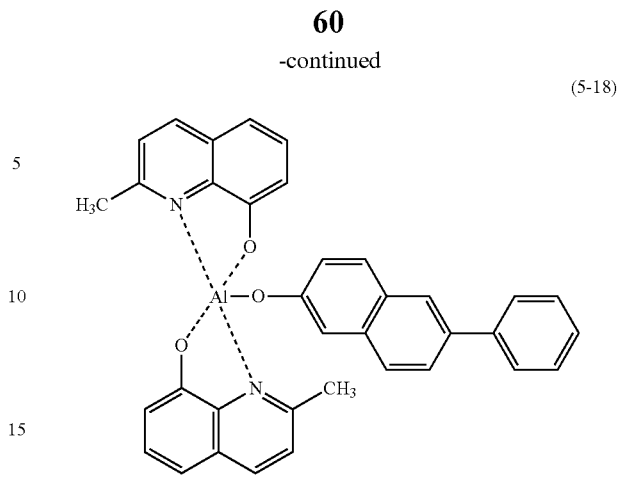
(5-19)
(5-20)
(5-21)
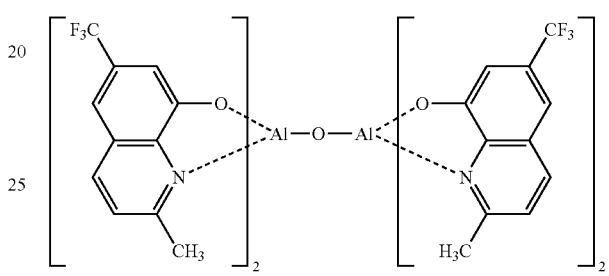
(5-22)
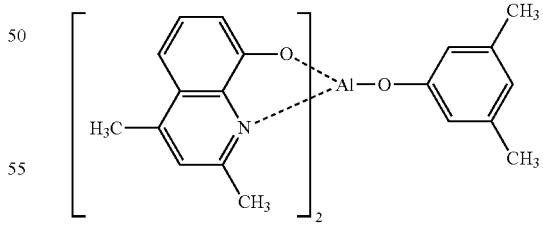
(5-23)
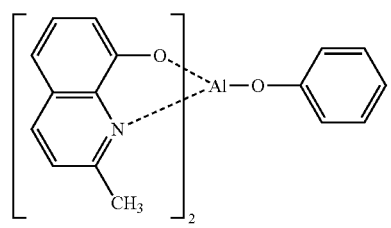

(5-24)
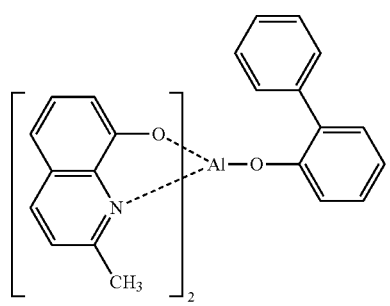

(5-25)
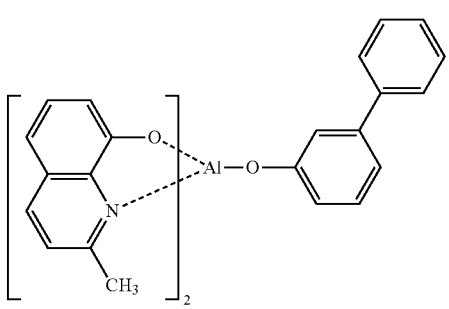

(5-26)
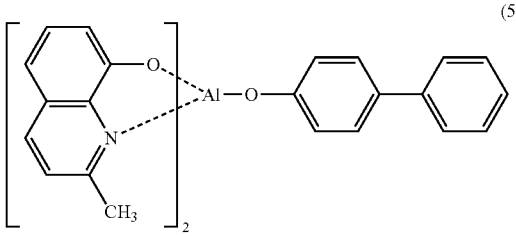

(5-27)
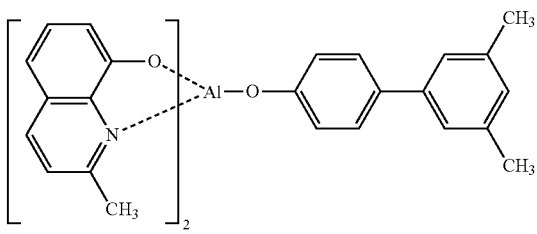

(5-28)
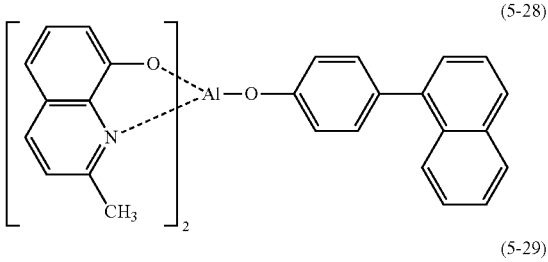

(5-29)
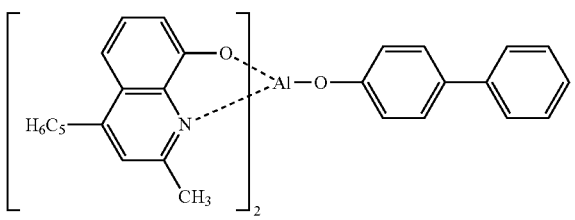

In addition, other than the above-mentioned low-molecular material, particularly as a yellow light emitting material, there may be mentioned bis(2-2'-benzothienyl)-pyridinato-N,C3) iridium(acetylacetonate) (formula (6-1), hereinafter abridged to btp2Ir(acac)) and bis(8-hydroxyquinolato)zinc (formula (6-2)), which exhibit phosphorescence through a triplet state. Besides, a light emitting system in which a yellow light emitting material is added to tris(2-phenylpyridine)iridium (formula (6-3), hereinafter abridged to Ir(ppy)), which is representative of green light emitting materials, to synthesize yellow light may also be used. These are nonlimitative examples.

(6-1)
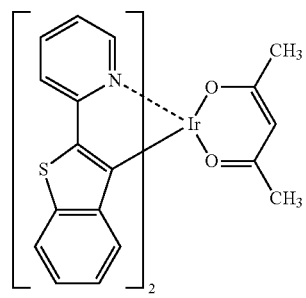

(6-2)
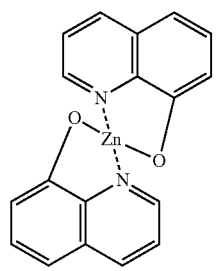

(6-3)
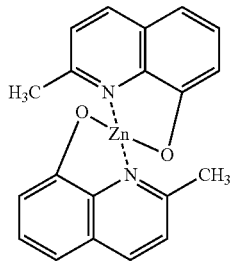

In addition, in the present embodiment, the yellow light emitting layer 16C is formed therein with a crystal part 16CA by crystallizing a region corresponding to each blue organic EL element 10B. The regions corresponding to the blue organic EL elements 10B are crystallized by a method to be described later, whereby yellow light emission is suppressed and blue light emission is realized in these regions. Incidentally, the crystal part 16CA may be attended, for example, by a change in refractive index, so that the reflectance of the crystal part 16CA is different from the reflectance of the yellow light emitting layer 16C other than the crystal part 16CA. Besides, the low-molecular material or high-molecular material in the crystal parts 16CA may not necessarily be in a crystalline state, insofar as the material is in such a state as not to emit yellow light. For instance, there may be adopted a condition wherein decomposition or the like of the material constituting the yellow light emitting layer 16C is selectively generated in the above-mentioned regions, with the result that the function of the yellow light emitting layer 16C is disabled in these regions.

Incidentally, the material constituting the yellow light emitting layer 16C is not restricted to the phosphorescent and fluorescent low-molecular materials represented by the above formulas (2-1) to (2-96), formulas (3-1) to (3-5), formulas (4-1) to (4-51), formulas (5-1) to (5-29) and formulas (6-1) to (6-3). The material may contain, for example, high-polymer materials which have been used for this purpose, for example, such light emitting polymers as polyfluorene high-polymer derivatives, polyphenylenevinylene derivatives, polyphenylene derivatives, polyvinylcarbazole derivatives, and polythiophene derivatives.

The connection layer 16D is for blocking the hole injection into the blue light emitting layer 16E in the yellow light emitting regions, and for causing the yellow light emitting layer 16C crystallized and not functioning as a light emitting layer in the blue light emitting regions to function as a hole transport layer. The thickness of the connection layer 16D, which depends on the total element configuration, is, for example, preferably 2 to 30 nm, more preferably 5 to 15 nm.

Nonlimitative examples of the material constituting the connection layer 16D include the compounds represented by the above formulas (3-1) to (3-5) and formulas (4-1) to (4-51).

In the blue light emitting layer 16E, application of an electric field induces electron-hole recombination, resulting in emission of light. The thickness of the blue light emitting layer 16E, which depends on the total element configuration, is, for example, preferably 2 to 30 nm, more preferably 5 to 15 nm.

The blue light emitting layer 16E is formed from a low-molecular material(s), and it has at least one host material and at least one guest material. Specific examples of the host material include the compounds represented by the above formulas (5-1) to (5-29).

Examples of the guest material include organic light emitting materials which have high luminous efficiency such as low-molecular fluorescent materials, phosphorescent dyes, and metal complexes. Specific examples are those compounds which have a peak wavelength in the range of about 400 to 490 nm. Examples of this type of compounds include such organic substances as naphthalene derivatives, anthracene derivatives, naphthacene derivatives, styrylamine derivatives, and bis(azinyl)methane boron complex. Specifically, the guest material is preferably selected from among aminonaphthalene derivatives, aminoanthracene derivatives, aminochrisene derivatives, aminopyrene derivatives, styrylamine derivatives, and bis(azinyl)methane boron complex.

The electron transport layer 16F is for enhancing the efficiency of electron transport into the yellow light emitting layer 16C and the blue light emitting layer 16E, and is provided on the whole surface of the blue light emitting layer 16E as a common layer. The thickness of the electron transport layer 16F, which depends on the total element configuration, is, for example, preferably 5 to 300 nm, more preferably 10 to 170 nm.

Examples of the material of the electron transport layer 16F include quinoline, perylene, phenanthroline, bisstyryl, pyrazine, triazole, oxazole, fullerene, oxadiazole, fluorenone, and their derivatives and metal complexes. Specific examples include tris(8-hydroxyquinoline)aluminum (abridged to Alq3), anthracene, naphthalene, phenanthroline, pyrene, perylene, butadiene, coumarin, C60, acridine, stilbene, 1,10-phenanthroline, and their derivatives and metal complexes.

The organic material used to form the electron transport layer 16F is not limited to one material, and a plurality of such organic materials may be used in mixture or in a laminated form. Furthermore, the just-mentioned compounds may be used to form the electron injection layer 16G which will be described later.

The electron injection layer 16G is for enhancing electron injection efficiency, and is provided on the whole surface of the electron transport layer 16F as a common layer. Examples of the material of the electron injection layer 16G include lithium oxide ($Li_2O$), cesium carbonate ($Cs_2CO_2$) which is a composite oxide of cesium (Cs), and mixtures of these oxides and composite oxides. These materials are not limitative. For instance, for forming the electron injection layer 16G, alkaline earth metals such as calcium (Ca), barium (Ba), etc., alkali metals such as lithium, cesium, etc., low-work-function metals such as indium (In), magnesium (Mg), etc., and oxides, composite oxides, fluorides and the like of these metals may be used either singly or in the form of mixture or alloy of these metals, oxides, composite oxides, or fluorides for enhancing stability. Furthermore, the organic materials mentioned above as material for the electron transport layer 16F may also be used.

The upper electrode 17 has a thickness of, for example, 2 to 15 nm, and has a metallic conductive film. Specific examples of the material for the upper electrode 17 include alloys of Al, Mg, Ca or Na. Among the alloys, preferred is an alloy of magnesium with silver (Mg—Al alloy) because of its having both conductivity in a thin film state and small absorption. The ratio of magnesium to silver in the Mg—Ag alloy is not particularly limited. The film thickness ratio of Mg:Ag is desirably in the range from 20:1 to 1:1. The material of the upper electrode 17 may be an alloy of aluminum with lithium (Al—Li alloy).

Further, the upper electrode 17 may be a mixed layer containing an organic light emitting material such as an aluminum quinoline complex, styrylamine derivatives, and phthalocyanine derivatives. In this case, further, a layer of a light-transmitting material such as MgAg may separately be provided as a third layer. Incidentally, in the case of an active matrix drive system, the upper electrode 17 is formed in a solid form over the substrate 11 in the state of being insulated from the lower electrode 14 by the organic layers 16 and the partition wall 15, and is used as a common electrode for the red organic EL elements 10R, green organic EL elements 10G, blue organic EL elements 10B and yellow organic EL elements 10Y.

The protective layer 20 has a thickness of, for example, 2 to 3 μm, and may be formed from either an insulating material or a conductive material. The insulating material is preferably an inorganic amorphous insulating material, examples of which include amorphous silicone (α-Si), amorphous silicon carbide (α-SiC), amorphous silicon nitride (α-$Si_{1-x}N_x$), and amorphous carbon (α-C). Since these inorganic amorphous insulating materials do not form grains, they are low in water permeability and capable of forming a good protective film.

The sealing substrate 30 is located on the upper electrode 17 side of the red organic EL elements 10R, green organic EL elements 10G, blue organic EL elements 10B and yellow organic EL elements 10Y. The sealing substrate 30, together with an adhesion layer (not shown), seals the red organic EL elements 10R, green organic EL elements 10G, blue organic EL elements 10B and yellow organic EL elements 10Y. In a top emission system in which light is emitted to the upper side of the sealing substrate, the sealing substrate 30 is formed from a material (e.g., glass) which is transparent to the lights generated from the red organic EL elements 10R, green organic EL elements 10G, blue organic EL elements 10B and yellow organic EL elements 10Y. The sealing substrate 30 is provided with the color filters 40 and a light blocking film (not shown) as black matrix, whereby emission of the lights generated in the red organic EL elements 10R, green organic EL elements 10G, blue organic EL elements 10B and yellow organic EL elements 10Y is permitted whereas external lights reflected by the red organic EL elements 10R, green organic EL elements 10G, blue organic EL elements 10B and yellow organic EL elements 10Y and wirings between these elements are absorbed, so as to improve contrast. Incidentally, in a bottom emission system in which light is emitted through the lower electrode, color filters 40 are similarly formed under a sealing substrate 30.

The color filters 40 include at least red filters 40R and the green filters 40G, and these color filters and blue filters 40B for blue light emission and yellow filters 40Y for yellow light emission are sequentially arranged correspondingly to the red organic EL elements 10R, green organic EL elements 10G, blue organic EL elements 10B and yellow organic EL elements 10Y. The red filters 40R, green filters 40G, blue filters 40B and yellow filters 40Y are formed in, for example, rectangular shapes, and arranged without leaving any gap therebetween. The red filters 40R, green filters 40G, blue filters 40B and yellow filters 40Y are each formed from a resin with a pigment mixed therein. By selecting the pigments, these filters are so controlled that they are each high in light transmittance in a wavelength region corresponding to the desired red, green, blue or yellow color and low in light transmittance in other wavelength regions.

Further, the wavelength range corresponding to the high transmittance in the color filter 40 and the peak wavelength $\lambda$ of the spectrum of the light to be emitted from a resonator structure MC1 are coincide with each other. As a result, of external lights incident through the sealing substrate 30, the external light of the wavelength equal to the peak wavelength $\lambda$ of the spectrum of the light to be emitted is transmitted through the color filter 40, whereas the external lights of other wavelengths are prevented from entering into the organic EL elements 10R, 10G, 10B or 10Y for each color.

The light blocking film is composed, for example, a black resin film in which a black colorant is mixed and which has an optical density of not less than 1, or a thin film filter utilizing interference by thin film. Where the light blocking film is composed of a black resin film, it can be formed at low cost, which naturally is preferable. The thin film filter has a structure in which, for example, one or more layers of a metal, a metallic nitride or a metallic oxide are laminated and light is attenuated by utilizing interference by thin film. Specific examples of the thin film filter include one in which Cr and chromium(III) oxide ($Cr_2O_3$) layers are alternately laminated.

The present organic EL display 1 can be manufactured, for example, in the following manner.

Figure 4:
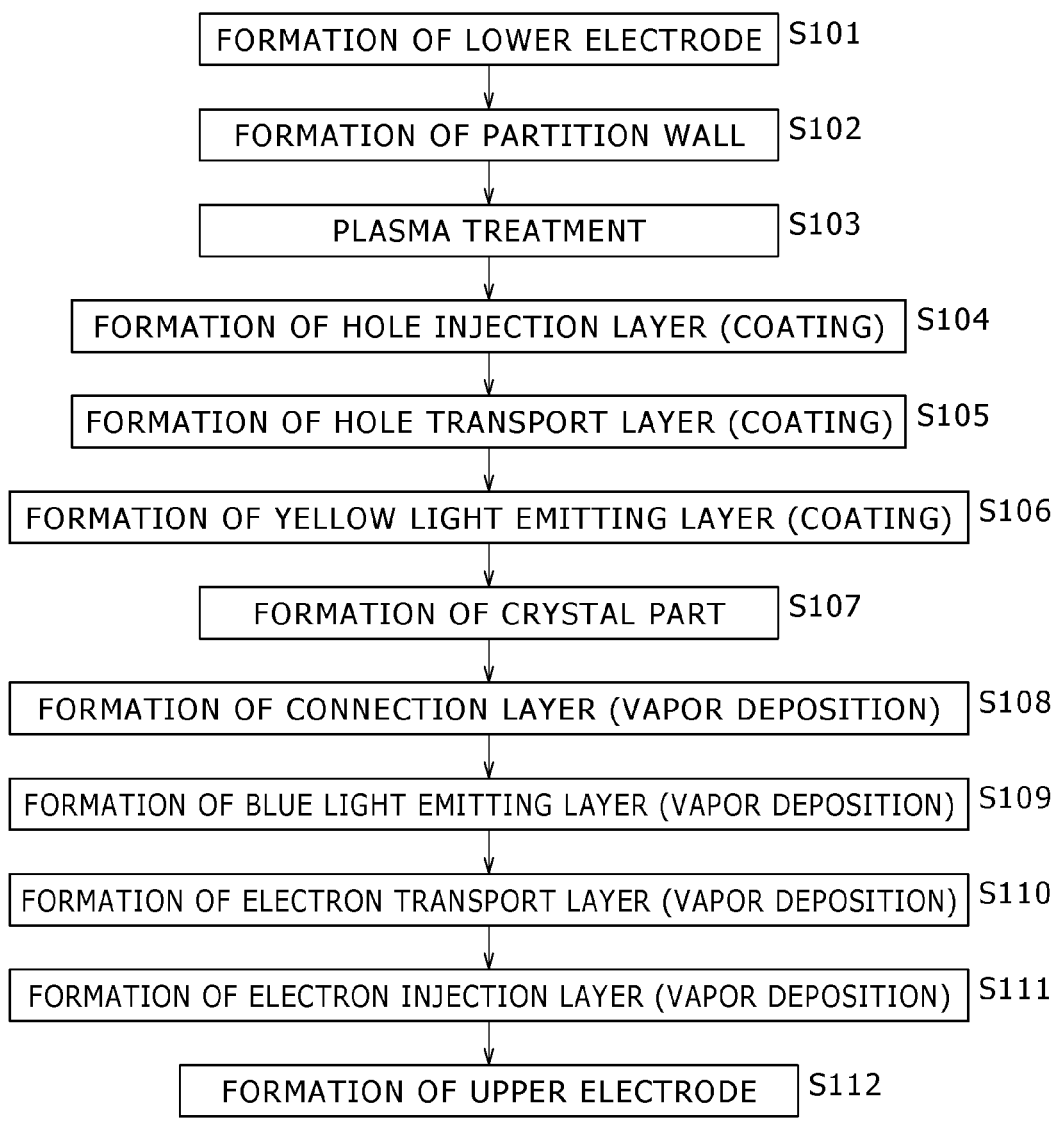
FIG. 4 shows the flow of a method of manufacturing the organic EL display shown in FIG. 1.

FIG. 4 shows the flow of a method of manufacturing the organic EL display 1, and FIGS. 5A to 5F illustrate, in the order of process steps, the manufacturing method shown in FIG. 4. First, on a substrate 11 formed of the above-mentioned material, pixel drive circuits 140 including drive transistors Tr1 are formed, and a flattening dielectric film (not shown) formed of a photosensitive resin, for example, is provided.

(Formation of Lower Electrode 14)

Figure 5A:
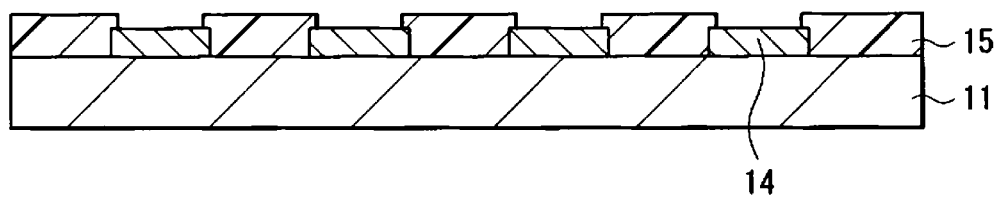
FIGS. 5A to 5F are sectional views illustrating, in the order of process steps, the manufacturing method shown in FIG. 4.
Figure 5B:
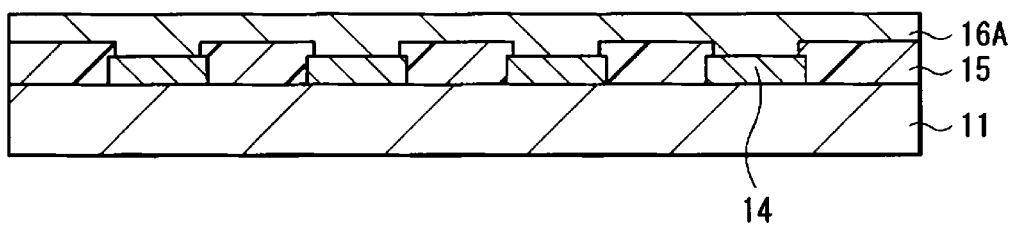
Figure 5C:
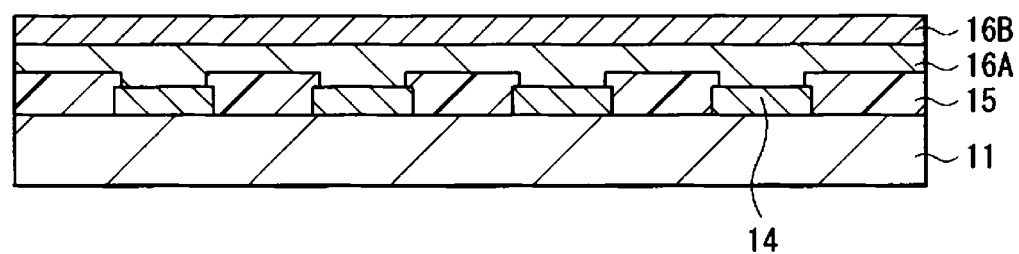

Next, a transparent conductive film of, for example, ITO is formed over the whole surface of the substrate 11, and the transparent conductive film is patterned so as to form lower electrodes 14 on the basis of each of red organic EL elements 10R, green organic EL elements 10G, blue organic EL elements 10B and yellow organic EL elements 10Y, as shown in FIG. 5A (step S101). In this case, the lower electrodes 14 are put into continuity with drain electrodes of the drive transistors Tr1 through contact holes (not shown) in the flattening dielectric film (not shown).

(Formation of Partition Wall 15)

Subsequently, also as shown in FIG. 5A, a film of an inorganic dielectric material such as $SiO_2$ is formed, for example, by CVD (Chemical Vapor Deposition) on the lower electrodes 14 and the flattening dielectric film (not shown), to form partition walls 15 (step S102).

After the formation of the partition walls 15, the surface of the substrate 11 on the side on which the lower electrodes 14 and the partition walls 15 are formed is subjected to an oxygen plasma treatment, to remove contaminants such as organic matter deposited on the surface, thereby enhancing wettability of the surface. Specifically, the substrate 11 is heated to a predetermined temperature, for example, about 70 to 80° C., and subsequently a plasma treatment with oxygen as a reactive gas ($O_2$ plasma treatment) is conducted under the atmospheric pressure (step S103).

(Formation of Hole Injection Layer 16A)

After the plasma treatment, a hole injection layer 16A composed of the above-mentioned material is formed in the regions surrounded by the partition walls 15, as shown in FIG. 15B (step S104). The hole injection layer 16A is formed by a coating process such as spin coating, slit printing, or liquid droplet ejection. Especially, the material for forming the hole injection layer 16A may be selectively disposed in the regions surrounded by the partition walls 15. In that case, it is preferable to use a liquid droplet ejection method, e.g., ink jet system, or nozzle coating system, or gravure printing, flexographic printing or the like.

Specifically, a solution or dispersion of polyaniline, polythiophene or the like selected as the material for forming the hole injection layer 16A is disposed on the exposed surfaces of the lower electrodes 14. Thereafter, a heat treatment (drying treatment) is conducted, to form the hole injection layer 16A.

In the heat treatment, the solvent or dispersant is evaporated off, and thereafter heating at a high temperature is conducted. Where a conductive polymer such as polyaniline or polythiophene is used, the heat treatment is preferably carried out in the atmospheric air or in an oxygen atmosphere. This is because the conductive polymer is oxidized by oxygen, to make it easier for the conductive property to be exhibited.

The heating temperature is preferably 150 to 300° C., more preferably 180 to 250° C. The heating time, which depends on the temperature and the atmosphere, is preferably about 5 to 300 minutes, more preferably 10 to 240 minutes. The thickness of the hole injection layer 16A after drying is preferably 5 to 100 nm, more preferably 8 to 50 nm.

(Formation of Hole Transport Layer 16B)

After the formation of the hole injection layer 16A, a hole transport layer 16B composed of the above-mentioned high-polymer material is formed on the hole injection layer 16A, as shown in FIG. 15C (step S105). The hole transport layer 16B is formed by a coating process such as spin coating, slit printing, and liquid droplet ejection. Especially, materials for forming hole transport layers 16BR and 16BG may be selectively disposed in the regions surrounded by upper partition walls 15B. In that case, it is preferable to use a selective printing method such as liquid droplet ejection method, e.g., ink jet system, or nozzle coating system, or gravure printing, flexographic printing or the like.

Specifically, a mixed solution or dispersion of a high-polymer material and a low-molecular material as materials for forming the hole transport layer 16B is disposed on the exposed surfaces of the hole injection layer 16A by, for example, slit printing system. Thereafter, a heat treatment (drying treatment) is conducted, to form the hole transport layer 16B.

In the heat treatment, the solvent or dispersant is evaporated off, and then heating at a high temperature is conducted. As the atmosphere during coating and the atmosphere during solvent drying and heating, an atmosphere containing nitrogen ($N_2$) as a main component is preferably used. If oxygen or moisture is present in the atmosphere, the organic EL display fabricated would show a lowered luminous efficiency and/or a shortened service life. The influence of oxygen or moisture is particularly great in the heating step, so that care should be taken about this point. The oxygen concentration is preferably 0.1 to 100 ppm, more preferably not more than 50 ppm. When oxygen is present in an amount of more than 100 ppm, the interface of the thin film formed may be contaminated, and the organic EL display obtained may show a lowered luminous efficiency and/or a shortened useful life. If the oxygen concentration is less than 0.1 ppm, on the other hand, there is no problem as to characteristics of the EL elements, but, in consideration of practical mass production process, a considerably high equipment cost may be needed for maintaining the oxygen concentration in the atmosphere to below 0.1 ppm.

As for moisture, it is preferable for the dew point to be in the range of, for example, −80° C. to −40° C. A more preferable dew point is −50° C. or below, and a further preferable dew point is −60° C. or below. If the amount of moisture is more than the value corresponding to a dew point of −40° C., the interface of the thin film formed may be contaminated, and the organic EL display may have a lower luminous efficiency and/or a shortened service life. If the amount of moisture is less than the value corresponding to a dew point of −80° C., there is no problem as to characteristics of the EL elements, but, in consideration of practical mass production process, a considerably high equipment cost may be needed for maintaining the dew point of the atmosphere to below −80° C.

The heating temperature is preferably 100 to 230° C., more preferably 150 to 200° C. The heating temperature is preferably at least lower than the temperature at the time of forming the hole injection layer 16A. The heating time, which depends on the temperature and the atmosphere, is preferably about 5 to 300 minutes, more preferably 10 to 240 minutes. The thickness of the hole transport layer 16B after drying, which depends on the total element configuration, is preferably 10 to 200 nm, more preferably 15 to 150 nm.

(Formation of Yellow Light Emitting Layer 16C)

Figure 5D:
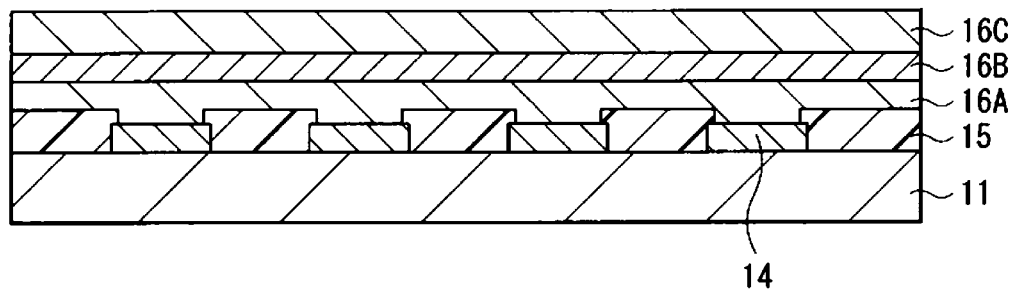

After the formation of the hole transport layer 16B, a yellow light emitting layer 16C composed of a mixed material of low-molecular materials is formed as shown in FIG. 5D (step S106). The yellow light emitting layer is formed by a coating process such as spin coating, slit printing, and liquid droplet ejection.

Specifically, a mixed solution or dispersion prepared by dissolving the materials for the yellow light emitting layer 16C in a 2:8 mixed solvent of xylene and cyclohexylbenzene so that the effective material concentration is 1 wt %, for example, is disposed on the exposed surface of the hole transport layer by a slit printing system, for example. Thereafter, a heat treatment (drying treatment) is conducted, to form the yellow light emitting layer 16C. In the heat treatment, the solvent or dispersant is evaporated off, and thereafter heating at a temperature below the lowest one of the glass transition points of the components of the yellow light emitting layer is conducted, in the range of 80 to 150° C. As the atmosphere during coating and the atmosphere during solvent drying and heating, an atmosphere containing nitrogen ($N_2$) as a main component is preferably used.

(Formation of Crystal Part 16CA)

Figure 5E:
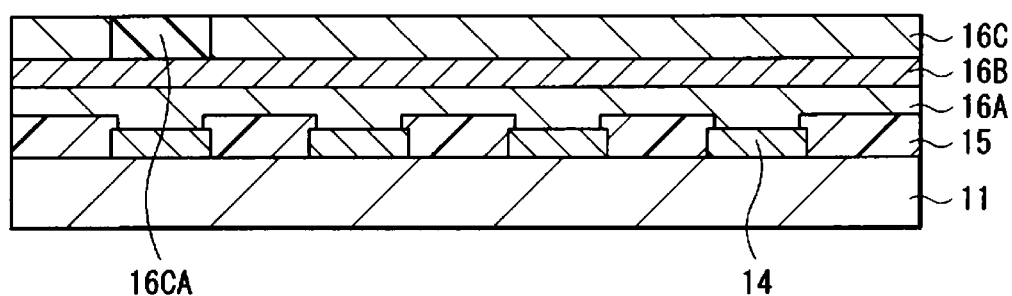

After the solvent or dispersant is removed by the drying (evaporating-off) step, the yellow light emitting layer 16C is selectively crystallized by light or heat, only in the regions of blue light emission, as shown in FIG. 5E (step S107). The temperature at the time of selective crystallization by light or heat may be in the range of 100 to 200° C., and is preferably 120 to 200° C. A heat treatment is conducted at a temperature which is in this temperature range and which is at least higher than the glass transition point (Tg) of at least one of the components of the yellow light emitting layer 16C, whereby crystal regions 16CA are selectively formed in the yellow light emitting layer 16C.

Figure 6:
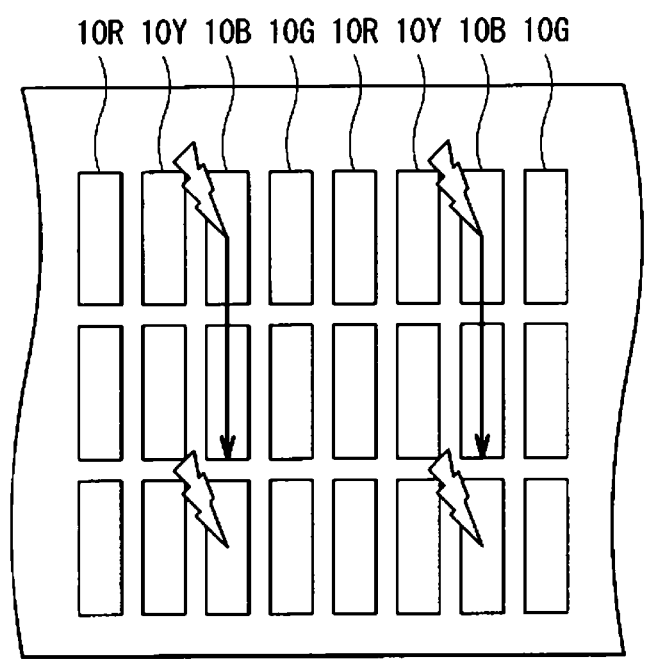
FIG. 6 illustrates an example of a method of forming a crystal part.

In a specific example of the method of forming the crystal regions 16CA, as shown in FIG. 6, the yellow light emitting layer 16C in the regions of the blue organic EL elements 10B are irradiated with blue laser at an output of about 1 W, to form the crystal regions 16CA. More preferably, the substrate 11 is preliminarily heated to about 80 to 100° C., and the output of the blue laser is controlled to about 0.3 W, whereby the yellow light emitting layer 16C can be more selectively crystallized in the regions of the blue organic EL elements 10B. Incidentally, the method for forming the crystal parts 16CA is not restricted to this one, and other methods will be described in Modifications 1 to 6 later.

(Formation of Connection Layer 16D, Blue Light Emitting Layer 16E, Electron Transport Layer 16F, Electron injection layer 16G and Upper Electrode 17)

Figure 5F:
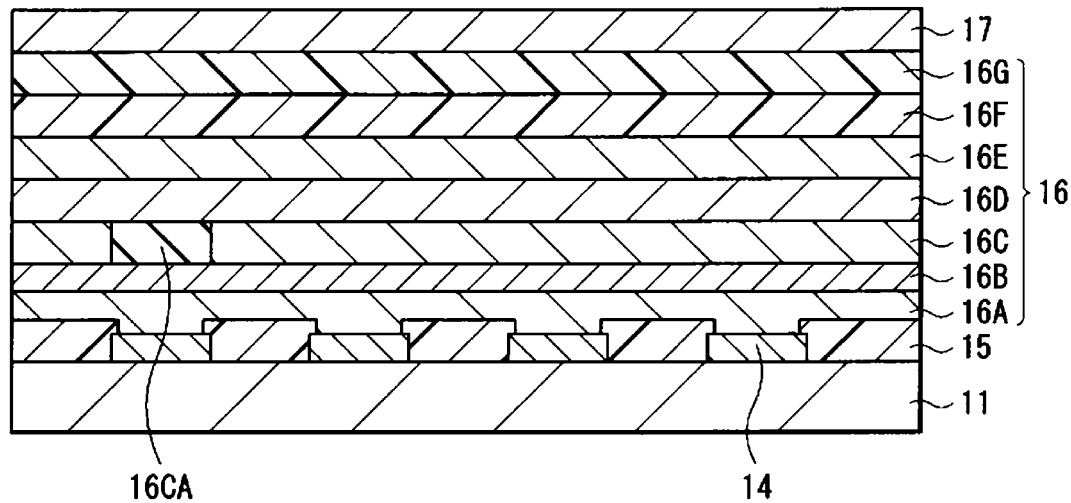

After the crystal regions 16CA is formed in the yellow light emitting layer 16C, a connection layer 16D, a blue light emitting layer 16E, an electron transport layer 16F, an electron injection layer 16G and an upper electrode 17 are formed as shown in FIG. 5F (steps S108, S109, S110, S111, and S112).

After the formation of the upper electrode 17, a protective layer 20 is formed thereon by a film forming method in which the energy of film forming particles is so low as not to influence the underlying layer, for example, a vapor deposition method or a CVD method. For instance, where a protective layer 20 composed of amorphous silicon nitride is formed, the layer is formed in a thickness of 2 to 3 μm by a CVD method. In this face, for preventing a lowering in luminance from being caused by deterioration of the organic layers 16, the film forming temperature is desirably set at normal temperature, and, for preventing peeling of the protective layer 20, it is desirable to form the film under such conditions that stress on the film is minimized.

The connection layer 16D, blue light emitting layer 16E, electron transport layer 16F, electron injection layer 16G, upper electrode 17 and the protective layer 20 are formed as solid film over the whole surface area, without use of any mask. In addition, the connection layer 16D, blue light emitting layer 16E, electron transport layer 16F, electron injection layer 16G, upper electrode 17 and protective layer 20 are formed desirably without exposure to the atmospheric air, in the same film forming apparatus, and in a continuous manner. This prevents the organic layers 16 from being deteriorated due to moisture in the atmospheric air.

Incidentally, where an auxiliary electrode or electrodes (not shown) are formed in the same step as the lower electrode 14, the organic layers 16 formed in a solid film form on the auxiliary electrodes may be removed by such a technique as laser ablation, prior to formation of the upper electrode 17.

This permits the upper electrode 17 to make direct contact with the auxiliary electrodes, whereby contact property is enhanced.

After the formation of the protective layer 20, for example, a sealing substrate 30 formed from the above-mentioned material is provided with a light blocking film formed of the above-mentioned material. Subsequently, the material for red filters 40R is applied to the sealing substrate 30 by spin coating or the like, and the film of the material is patterned by photolithographic technique, followed by baking, to form the red filters 40R. Subsequently, green filters 40G, blue filters 40B and yellow filters 40Y are sequentially formed, in the same manner as the red filters 40R.

Thereafter, an adhesion layer (not shown) is formed on the protective layer 20, and the sealing substrate 30 is adhered to the protective layer 20, with the adhesion layer therebetween. In the above-mentioned manner, the organic EL display 1 shown in FIGS. 1 to 3 is completed.

In the organic EL display 1, a scan signal from the scanning line drive circuit 130 is supplied to each pixel through the gate electrode of the write transistor Tr2, whereas an image signal from the signal line drive circuit 120 is held into the holding capacitance Cs through the write transistor Tr2. Specifically, according to the signals held in the holding capacitances Cs, the drive transistors Tr1 are turned on or off under control, whereby drive currents Id are injected into the red organic EL elements 10R, green organic EL elements 10G, blue organic EL elements 10B and yellow organic EL elements 10Y so as to cause hole-electron recombination, resulting in emission of light. The lights thus emitted from the organic EL elements are emitted to the exterior through the lower electrodes 14 and the substrate 11 in the case of bottom emission, whereas the lights are emitted to the exterior through the upper electrode 17, the color filters 40 and the sealing substrate 30 in the case of top emission.

In an organic EL display including pluralities of elements such as red organic EL elements, green organic EL elements and blue organic EL elements according to the related art, a hole injection layer and a hole transport layer and part of light emitting layers have been formed on the basis of EL elements for each color by a coating process, as above-mentioned. In the coating process such as ink jet process, coating with a dispersion of a predetermined material in a solvent is followed by removal of the solvent by heating, as above-mentioned. Therefore, control of film thickness is difficult to achieve, so that there has been a problem of scattering of properties among EL elements. In addition, there has been the problem of lowering in device characteristics due to remaining of impurities such as solvent.

In contrast, in the organic EL display 1 according to the present embodiment, the hole injection layer 16A and the hole transport layer 16B and the yellow light emitting layer 16C are formed as common layers by coating process over the whole surface area of the lower electrodes 14 for the red organic EL elements 10R, green organic EL elements 10G, blue organic EL elements 10B and yellow organic EL elements 10Y. This makes it possible to reduce film thickness deviations among the EL elements. In addition, the yellow light emitting layer 16C is selectively crystallized in the regions corresponding to the blue organic EL elements 10B, whereby blue light emission is achieved in these regions. Besides, the crystal parts 16CA function as a conductive layer. In other words, yellow light emission and blue light emission at high luminous efficiency can be attained, without using a divisional coating technique.

Thus, in the organic EL display 1 according to this embodiment, the hole injection layer 16A and the hole transport layer 16B and the yellow light emitting layer 16C to be formed by coating process are formed as common layers over the whole surface area, so that film thickness deviations among EL elements can be reduced. In addition, since the yellow light emitting layer 16C is crystallized in the regions corresponding to the blue organic EL elements 10B, yellow light emission and blue light emission at high luminous efficiency can be achieved, without using a divisional coating technique. This ensures that scattering of film thickness and luminous efficiency on a color basis can be reduced, and an organic EL display 1 with high luminous efficiency can be provided. Furthermore, desired color lights are obtained from yellow light emission by use of the color filters 40, whereby an organic EL display with uniform luminous intensity for different colors can be fabricated.

(Second Embodiment)

Now, a second embodiment of the present disclosure will be described below. Incidentally, the same components as those in the first embodiment above are denoted by the same reference symbols as used above, and descriptions of the components will be omitted.

Figure 7:
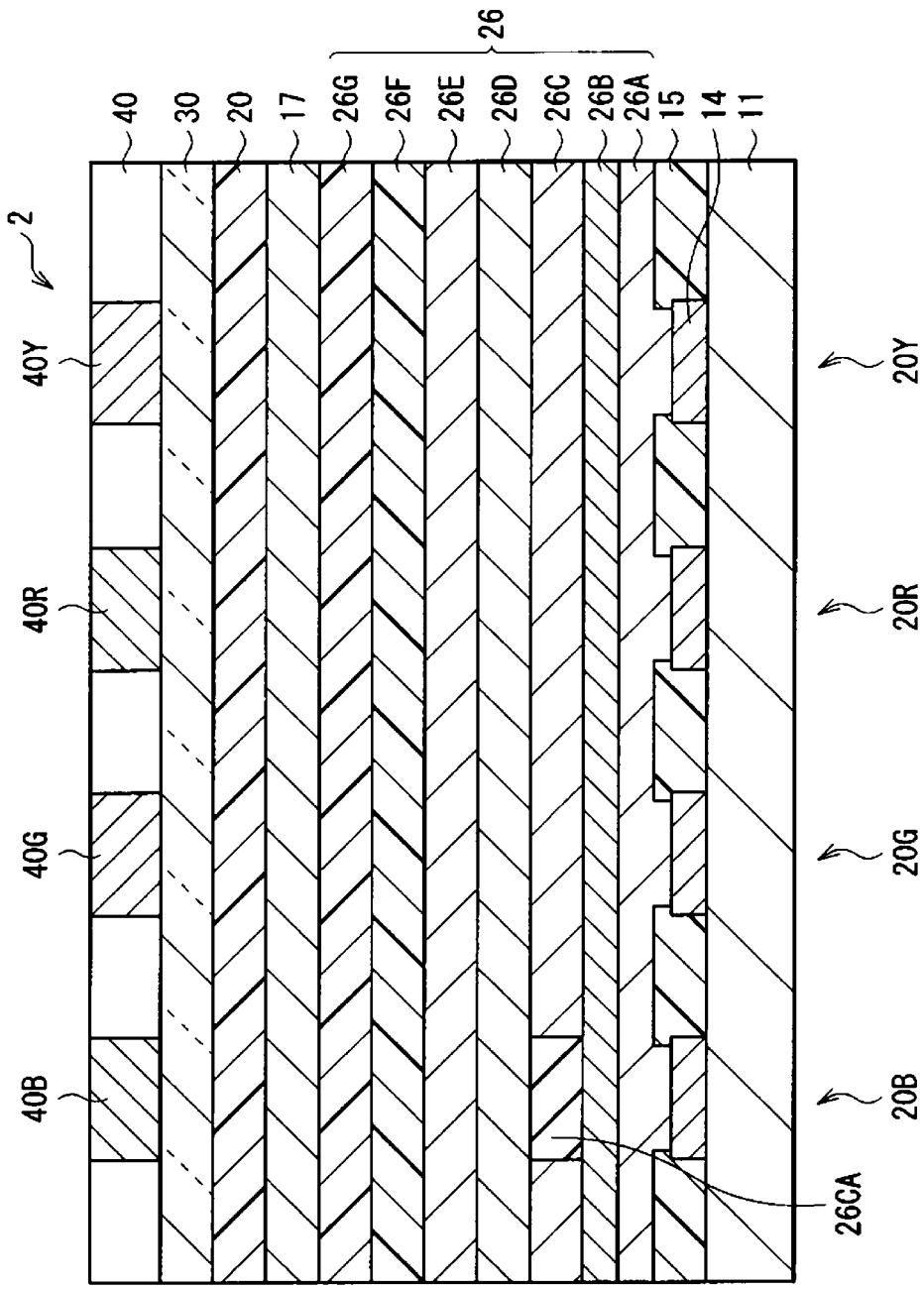
FIG. 7 is a sectional view illustrating the configuration of an organic EL display according to a second embodiment of the present disclosure.

FIG. 7 illustrates the sectional configuration of a display region of an organic EL display 2 according to the second embodiment. Each of red organic EL elements 10R, green organic EL elements 10G, blue organic EL elements 10B, yellow organic EL elements 10Y has a configuration in which a lower electrode 14 as anode, a partition wall 15, organic layer 26 including light emitting layers (yellow light emitting layer 26C, blue light emitting layer 26E) and a connection layer 26D, and an upper electrode 17 as cathode are laminated in this order from the side of a substrate 11, with a drive transistor Tr1 of the above-mentioned pixel drive circuit 140 and a flattening dielectric layer (not shown) interposed between the substrate 11 and the laminated layers.

Figure 8:
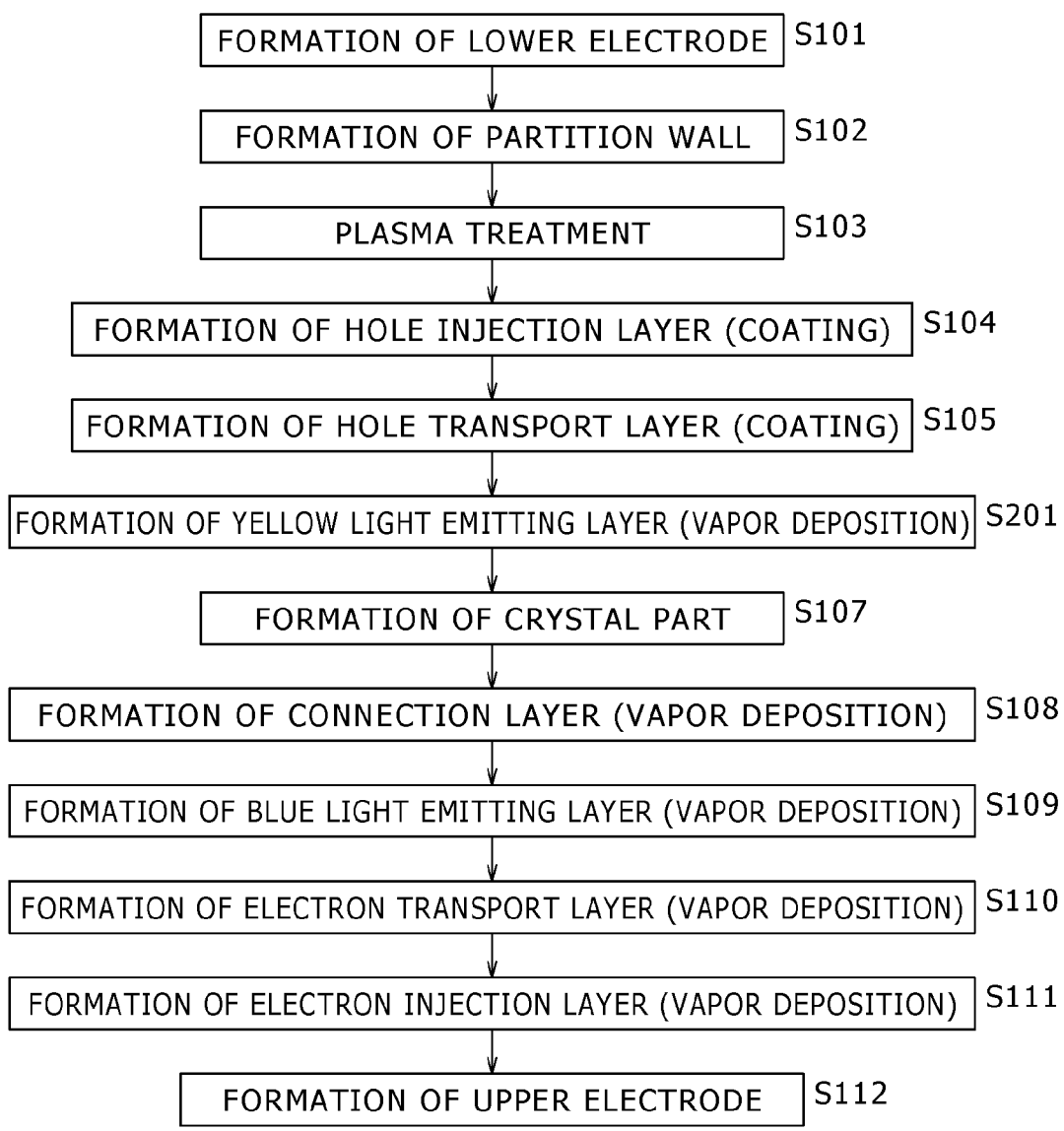
FIG. 8 shows the flow of a method of manufacturing the organic EL display shown in FIG. 7.

The organic EL display 2 in this embodiment differs from the organic EL display 1 in the first embodiment above, in that the yellow light emitting layer 26C is formed by vapor deposition as indicated in the flow sheet shown in FIG. 8.

(Formation of Yellow Light Emitting Layer 26C by Vapor Deposition)

After the formation of a hole transport layer 26B, the yellow light emitting layer 26C composed of the above-mentioned materials is formed on the whole surface area of the hole transport layer 26B by vapor deposition of the host material at a temperature of 320° C. and a deposition rate of 1 Å/sec and vapor deposition of the light emitting guest material at a temperature of 280° C. at a deposition rate of 1 Å/sec (step S201).

In the organic EL display 2 according to this embodiment, the number of coating steps is reduced, whereby the merit of an easier film thickness control is obtained, in addition to the effects of the first embodiment. Besides, since the amounts of impurities such as residual solvent are reduced, a higher luminous efficiency can be obtained.

Now, Modifications 1 to 6 of the first and second embodiments will be described below. In Modifications 1 to 6, methods of selectively forming the crystal parts 16CA in the yellow light emitting layer 16C as described in the first embodiment above will be described.

(Modification 1)

In Modification 1, the crystal parts 16CA are formed by irradiating crystallization regions with light. Specifically, instead of the laser used in the first embodiment above, a lamp such as a flash lamp is used for effecting crystallization. More specifically, the other regions than the regions of the blue organic EL elements are masked, and the substrate 11 is preliminarily heated to 80 to 100° C., like in the first embodiment. Thereafter, the regions of the blue organic EL elements are irradiated with light from the flash lamp, whereby the crystal parts 16CA can be formed selectively. This method permits the crystal parts 16CA to be formed with low energy.
(Modification 2)

In forming the crystal parts 16CA in Modification 2, the lower electrodes 14 are formed by use of Mo having a reflectance of about 60%, and the yellow light emitting layer 16C is selectively irradiated with light in the absorption band of Mo, for example, infrared light at a wavelength of about 800 nm, whereby the yellow light emitting layer 16C can be selectively crystallized. Incidentally, use of light with better directionality, such as laser light, makes it possible to form the crystal parts 16CA more selectively.
(Modification 3)

The method of forming the crystal parts 16CA in Modification 3 is an improved version of the method in Modification 2. Specifically, of the lower electrodes 14, only the lower electrodes 14B corresponding to the blue organic EL elements 10B are formed of Mo. This ensures that the yellow light emitting layer 16C can be selectively crystallized only in the regions over the lower electrodes 14B, namely, only in the regions of the blue organic EL elements 10B, more easily and accurately, without using a laser as in Modification 2 or forming a mask.

Incidentally, the lower electrodes 14 described in Modifications 2 and 3 may not necessarily be formed of Mo. A metal whose reflectance is comparable to that of Mo can also be used, for example, Cr. Besides, other metal than Mo or Cr, for example, ITO may be contained in the material of the lower electrodes 14.
(Modification 4)

Figure 9:
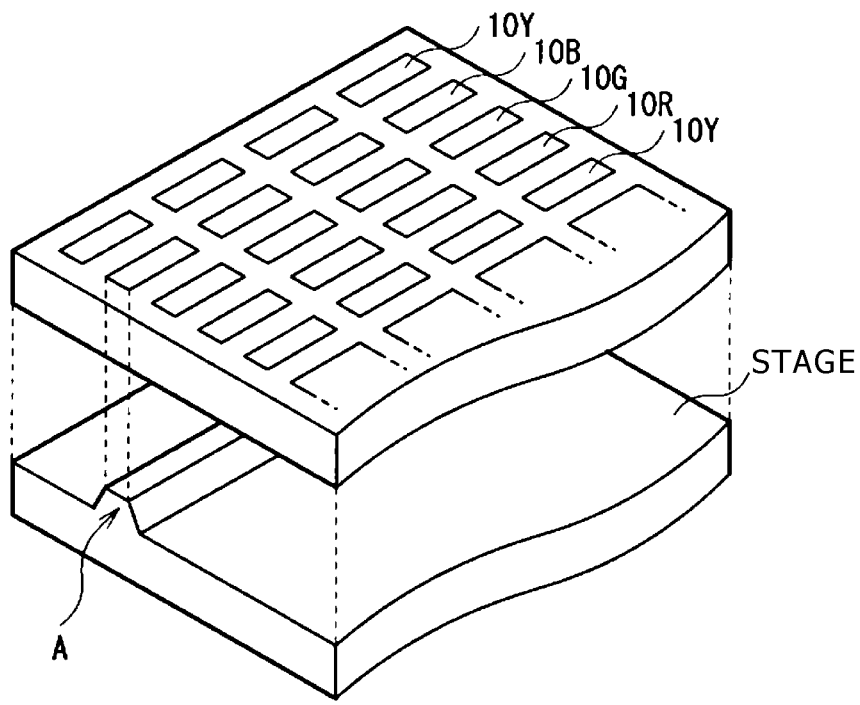
FIG. 9 illustrates another example of the method of forming the crystal part.

In Modification 4, the crystal parts 16CA are formed by heating the regions of the blue organic EL elements 10B from the back side of the substrate 11. Specifically, as shown in FIG. 9, for example, a stage having a projected part A corresponding to the regions of the blue organic EL elements 10B is heated, and the heated stage is brought into contact with the back surface of the substrate 11, whereby the crystal parts 16CA are formed.
(Modification 5)

In Modification 5, the crystal parts 16CA are formed by a method wherein those regions of the yellow light emitting layer 16C which correspond to the blue organic EL elements 10B are crystallized by scanning a heated body along the back surface of the substrate 11. Here, the substrate 11 and the heated body may be in contact or out of contact with each other. Besides, the scanning may be conducted on the upper side of the substrate 11.
(Modification 6)

In Modification 6, the crystal parts 16CA are formed by a method in which after the formation of the yellow light emitting layer 16C, a current is made to flow through a resistor provided in the regions of the blue organic EL elements 10B, whereby the corresponding regions of the yellow light emitting layer 16C are crystallized.

MODULES AND APPLICATION EXAMPLES

Now, application examples of the organic EL displays 1 and 2 described in the first and second embodiments above will be described below. The organic EL display devices according to the above embodiments can be applied to display devices of electronic apparatuses in any field in which an image signal inputted externally or an image signal produced internally is displayed as an image or video, such as television sets, digital cameras, notebook-sized personal computers, portable terminal devices such as cellphones, video cameras, etc.
(Modules)

Figure 10:
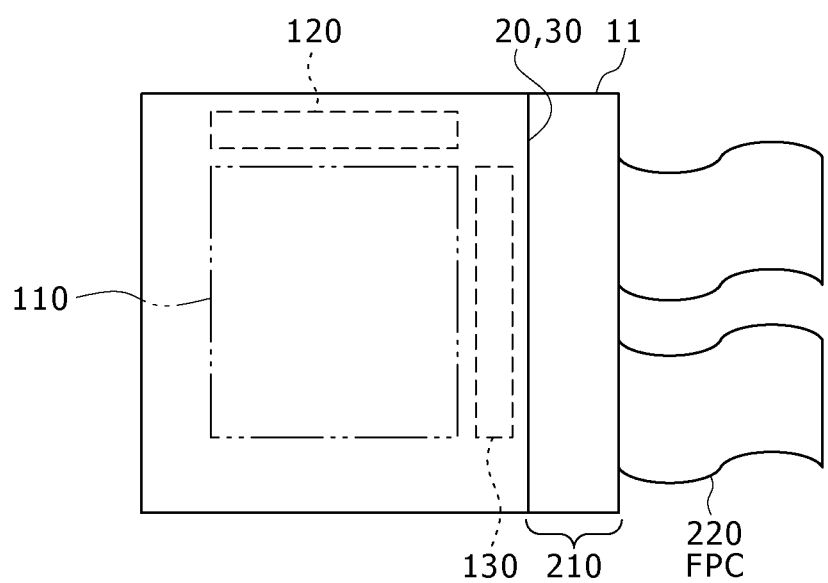
FIG. 10 is a plan view illustrating a schematic configuration of a module including the display according to the above embodiment.

The organic EL displays 1 and 2 according to the above embodiments are incorporated as, for example, a module shown in FIG. 10, in various electronic apparatuses such as Application Examples 1 to 5 which will be described later. This module has a configuration in which, for example, a region 210 exposed from a protective layer 20 and a sealing substrate 30 is provided along one edge of a substrate 11, and, in this exposed region 210, wirings of a signal line drive circuit 120 and a scanning line drive circuit 130 are extended and an external connection terminal (not shown) is formed. At the external connection terminal, a flexible printed circuit (FPC) 220 for input/output of signals may be provided.

Application Example 1

Figure 11:
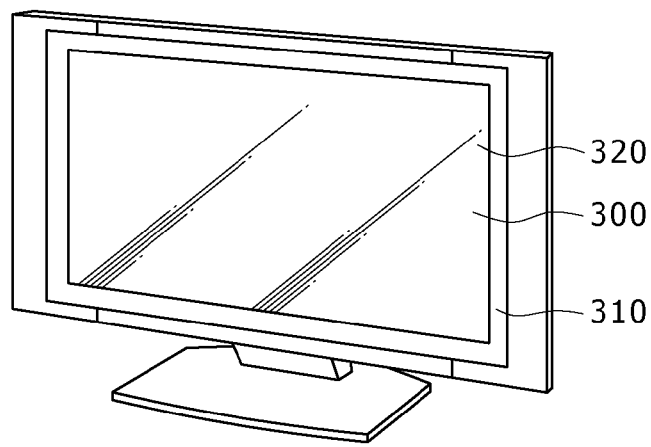
FIG. 11 is a perspective view showing an external appearance of Application Example 1 of the display according to the above embodiment.

FIG. 11 shows an external appearance of a television set to which any of the organic EL displays 1 or 2 of the above embodiments is applied. The television set has, for example, an image display screen part 300 including a front panel 310 and a filter glass 320. The image display screen 300 has any of the organic EL displays 1 or 2 of the above embodiments.

Application Example 2

Figure 12A:
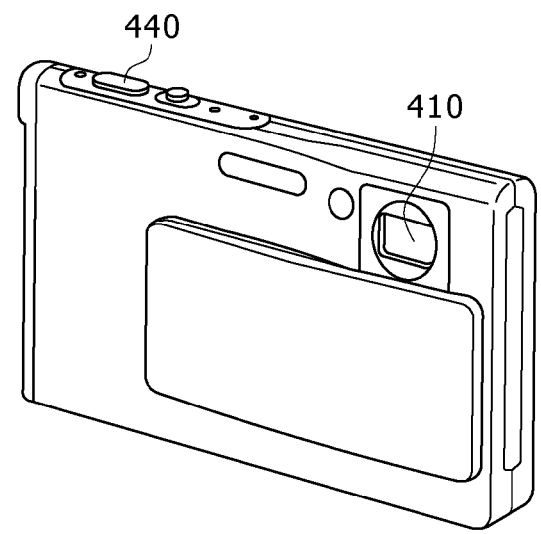
FIG. 12A is a perspective view showing an external appearance, as viewed from the front side, of Application Example 2.
Figure 12B:
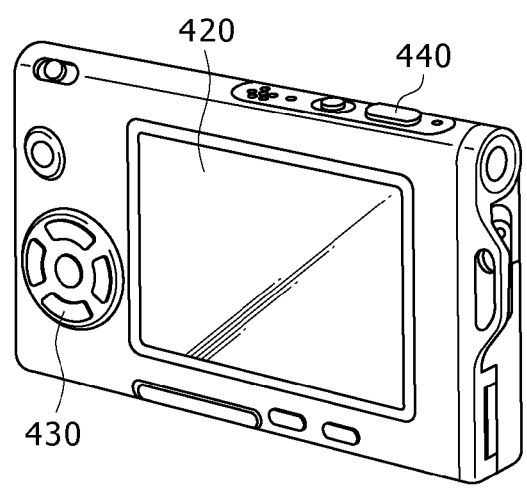
FIG. 12B is a perspective view showing an external appearance, as viewed from the back side, of Application Example 2.

FIGS. 12A and 12B show external appearance of a digital camera to which any of the organic EL displays of the above embodiments is applied. The digital camera includes, for example, a flash light emitting part 410, a display unit 420, a menu switch 430 and a shutter button 440. The display unit 420 has any of the organic EL displays 1, 2 according to the above embodiments.

Application Example 3

Figure 13:
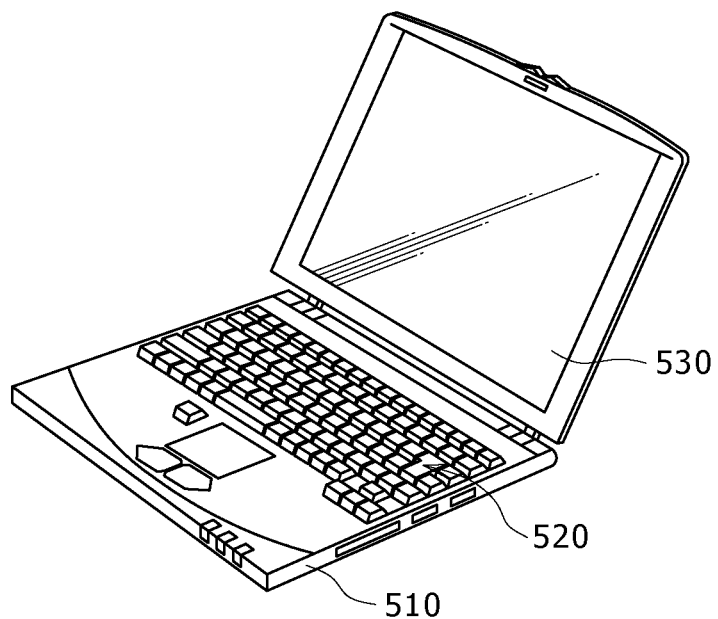
FIG. 13 is a perspective view showing an external appearance of Application Example 3.

FIG. 13 shows an external appearance of a notebook-sized personal computer to which any of the organic EL displays 1 or 2 of the above embodiments is applied. The notebook-sized personal computer includes, for example, a body 510, a keyboard 520 to be operated for inputting characters and the like, and a display unit 530 for displaying images. The display unit 530 has any of the organic EL displays 1 or 2 according to the above embodiments.

Application Example 4

Figure 14:
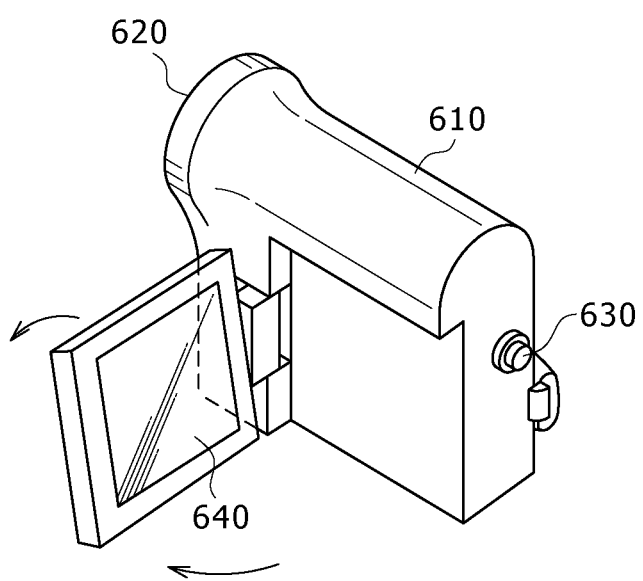
FIG. 14 is a perspective view showing an external appearance of Application Example 4.

FIG. 14 shows an external appearance of a video camera to which any of the organic EL displays 1 or 2 of the above embodiments is applied. The video camera includes, for example, a body section 610, a subject photographing lens 620 provided at a front side surface of the body section 610, a photographing start/stop switch 630, and a display unit 640. The display unit 640 has any of the organic EL displays 1 or 2 according to the above embodiments.

Application Example 5

FIGS. 15A to 15G show external appearances of a cellphone to which any of the organic EL displays 1 or 2 of the above embodiments is applied. The cellphone has, for example, an upper-side casing 710 and a lower-side casing 720 linked to each other through a link section (hinge section) 730, and includes a display 740, a sub-display 750, a picture light 760, and a camera 770. The display 740 or the sub-display 750 has any of the organic EL displays 1 or 2 according to the above embodiments.

Example

A device (blue organic EL element) having the structure as described in the first and second embodiments above was fabricated. First, a glass substrate (25 mm×25 mm) was prepared as a substrate 11. On the substrate 11, a transparent conductive film of ITO having a thickness of 100 nm was formed as a lower electrode 14 (step S101). Subsequently, a partition wall 15 was formed by use of an inorganic material such as $SiO_2$, and a partition wall 15B was formed by use of a resin material such as polyimide resin, acrylic resin, novolak resin, etc., to form a partition wall 15. Next, the partition wall 15 was introduced into an apparatus equipped with a plasma power source and electrodes, and a plasma treatment was conducted using a fluorine gas such as $CF_4$, whereby the surfaces of the partition wall 15 were treated to be water-repellent.

Subsequently, ND1501 (a polyaniline, made by Nissan Chemical Industries, Ltd.) was applied in a thickness of 15 nm by a nozzle coating system in air, followed by heat curing on a hot plate at 220° C. for 30 minutes, to form a hole injection layer 16A.

Thereafter, a 1-wt % solution prepared by dissolving the compound of the above formula (1-1) in xylene or a solvent having a boiling point higher than that of xylene was applied to the hole injection layer 16A by a nozzle coating system, in order to form a hole transport layer 16B. Then, the substrate 11 was evacuated to a vacuum state, to evaporate off the solvent in vacuum, followed by a heating treatment at 180° C. for 30 minutes.

After the formation of the hole transport layer 16B, a yellow light emitting layer 16C was formed. Specifically, for example, the compound of the formula (2-7) as a host material and the compound of the formula (7-3) as a guest material were dissolved in a 2:8 mixed solvent of xylene and cyflohexylbenzene, and the resulting solution was applied in a thickness of 60 nm by a nozzle coating system. Next, evacuation to a vacuum state was conducted, to evaporate off the solvent in vacuum, and a heating treatment at 130° C. was carried out for 30 minutes.

Next, for example using a blue laser, the yellow light emitting layer 16C was crystallized by irradiation with laser light at an output of, for example, 1 W, to form a crystal part 16CA.

Subsequently, the substrate 11 was moved into a vacuum deposition apparatus, and a connection layer 16D and the subsequent layers were formed by vapor deposition. First, as the connection layer 16D, for example, the compound of the formula (3-2) was formed in a thickness of 10 nm by the vacuum deposition process. Thereafter, as a blue light emitting layer, for example, the compound of the formula (5-20) and the compound of the formula (7) as a blue dopant in a weight ratio of 95:5 were co-evaporated in a thickness of 25 nm. As an electron transport layer 16E, for example, an organic material of the formula (8) was vapor deposited in a thickness of 15 nm. Similarly by vapor deposition, LiF was deposited in a thickness of 0.3 nm as an electron injection layer 16F, and Al was deposited in a thickness of 100 nm as an upper electrode 17. Finally, a protective layer 30 of SiN was formed in a thickness of 3 μm by the CVD method, and solid-state sealing was conducted by use of an epoxy resin. In this manner, a device (corresponding to the blue organic EL element 10B) having the crystal part 16CA between the hole transport layer 16B and the connection layer 16D was fabricated as Example. In addition, as Comparative Example, a device not having the crystal part between the hole transport layer and the connection layer was fabricated. Incidentally, in the device of Comparative Example, the thickness of the hole transport layer was set to be equal to the thickness of the hole transport layer 16B and the yellow light emitting layer 16C (the crystal part 16CA) in Example, so that the device thicknesses in both cases were equal.

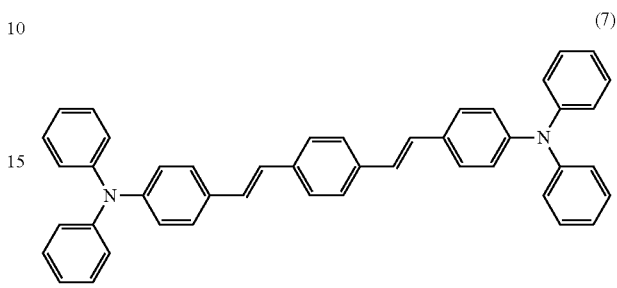

For Example and Comparative Example, luminous efficiency (cd/A), drive voltage (V) and chromacity coordinates (x, y) at driving with a current density of 10 $mA/cm^2$ were measured. In addition, life characteristic at 50 $mA/cm^2$ was measured. These measurements were carried out in an environment controlled to 23±0.5° C. The measurement results are shown in Table 1 below.

TABLE 1

|  | Example | Comparative Example |
|---|---|---|
| Luminous efficiency (cd/A) | 7.3 | 7.4 |
| Drive voltage (V) | 3.9 | 3.9 |
| Chromaticity (x, y) | 0.137, 0.110 | 0.137, 0.111 |
| Luminance half-life (h) | 1200 | 1198 |

From the results shown in Table 1, the device in which the crystal part 16CA crystallized by subjecting the yellow light emitting layer 16C to a treatment such as heating and the blue light emitting layer 16E were laminated, with the connection layer 16D therebetween, as described in the above embodiments was found to exhibit blue light emission, instead of yellow light emission. The characteristics of this device were good and substantially equal to those of the device having only the blue light emitting layer (Comparative Example), in terms of luminous efficiency, drive voltage, chromacity and life characteristic.

While the present disclosure has been described by showing the first and second embodiments and Example above, the present disclosure is not to be restricted to the above embodiments and the like, and various modifications are possible.

For instance, the material, thickness, film forming method, film forming conditions and the like for the layers described in the above embodiments and the like are not restrictive; thus, other materials and thicknesses as well as other film forming methods and film forming conditions may also be adopted.

In addition, while the configurations of the organic EL elements 10R, 10G, 10B, 10Y and the like have been specifically mentioned and described in the above embodiments and the like, all the layers may not necessarily be provided. Besides, other layer may further be provided. For example, formation of the hole transport layer 16B on the hole injection layer 16A may be omitted, and the light emitting layer 16C may be formed directly on the hole injection layer 16A by a coating process.

Further, while the electron transport layer 16G was formed as a single layer of one material in the above embodiments and the like, this structure is not limitative. For instance, the electron transport layer may be a layer of a mixture of two or more materials, or may have a laminated structure in which different material layers are laminated. In addition, while the display having red, green, blue and yellow organic EL elements has been described in the above embodiments and the like, the present disclosure is also applicable to an organic EL element for white light emission. Thus, there is no restriction as to color in light emission.

Further, while the case of the active matrix type display has been described in the above embodiments and the like, the present disclosure is also applicable to a passive matrix type display. Furthermore, the configuration of the pixel drive circuit for active matrix driving is not restricted to the one described in the above embodiments, and capacitance elements and transistors may be added, as required. In that case, other than the above-mentioned signal line drive circuit 120 and the scanning line drive circuit 130, required drive circuits may be added according to the changes made in the pixel drive circuit.

The present disclosure contains subject matter related to that disclosed in Japanese Priority Patent Application JP 2011-068247 filed in the Japan Patent Office on Mar. 25, 2011, the entire content of which is hereby incorporated by reference.

What is claimed is:

1. An organic electroluminescence display comprising:
   a plurality of first electrodes provided on a substrate on the basis of a first organic electroluminescence element for blue color and on the basis of a second organic electroluminescence element for another color;
   a hole injection/transport layer provided over a whole surface area on the first electrodes and having a property of at least one of hole injection and hole transport;
   a second organic light emitting layer for the another color provided over a whole surface area on the hole injection/transport layer and having a crystal part in at least a part thereof;
   a connection layer provided over a whole surface area on the second organic light emitting layer;
   a first organic light emitting layer for the blue color provided over a whole surface area on the connection layer;
   an electron injection/transport layer provided over a whole surface area on the first organic light emitting layer and having a property of at least one of electron injection and electron transport; and
   a second electrode provided over a whole surface area on the electron injection/transport layer, wherein the crystal part is a hole transport crystal part.

2. The organic electroluminescence display according to claim 1, wherein the second organic light emitting layer has at least one peak wavelength in the range of 500 to 750 nm.

3. The organic electroluminescence display according to claim 1, wherein an organic electroluminescence element corresponding to the crystal part formed in the second organic light emitting layer exhibits blue light emission.

4. The organic electroluminescence display according to claim 1, wherein the first electrode contains molybdenum in at least a part thereof.

5. The organic electroluminescence display according to claim 1, wherein a color filter is provided on the second organic electroluminescence element for the another color so as to emit light in two or more colors.

6. A method of manufacturing an organic electroluminescence display, comprising:
   forming a plurality of first electrodes on a substrate on the basis of a first organic electroluminescence element for blue color and on the basis of a second organic electroluminescence element for another color;
   forming a plurality of hole injection/transport layers provided over a whole surface area of the first electrodes and having a property of at least one of hole injection and hole transport, by a coating process;
   forming a second organic light emitting layer for the another color over a whole surface area on the hole injection/transport layers by a coating process;
   forming a crystal part in at least a part of the second organic light emitting layer, wherein the crystal part is a hole transport crystal part;
   forming a connection layer over a whole surface area of the second organic light emitting layer by a vapor deposition process;
   forming a first organic light emitting layer for the blue color over a whole surface area of the connection layer by a vapor deposition process;
   forming an electron injection/transport layer having a property of at least one of electron injection and electron transport, over a whole surface area of the first organic light emitting layer by a vapor deposition process; and
   forming a second electrode over a whole surface area of the electron injection/transport layer.

7. The method of manufacturing an organic electroluminescence display according to claim 6, wherein a part of the second organic light emitting layer is crystallized by laser annealing.

8. The method of manufacturing an organic electroluminescence display according to claim 6, wherein a part of the second organic light emitting layer is crystallized by exposure to light.

9. The method of manufacturing an organic electroluminescence display according to claim 6, wherein a part of the second organic light emitting layer is crystallized by selective substrate heating.

10. The method of manufacturing an organic electroluminescence display according to claim 6, wherein a part of the second organic light emitting layer is crystallized by heating a resistor formed on a substrate side.

11. A method of manufacturing an organic electroluminescence display, comprising:
   forming a plurality of first electrodes on a substrate on the basis of a first organic electroluminescence element for blue color and on the basis of a second organic electroluminescence element for another color;
   forming a plurality of hole injection/transport layers provided over a whole surface area of the first electrodes and having a property of at least one of hole injection and hole transport, by a coating process;

forming a second organic light emitting layer for the another color over a whole surface area on the hole injection/transport layers by a vapor deposition process;

forming a crystal part in at least a part of the second organic light emitting layer, wherein the crystal part is a hole transport crystal part;

forming a connection layer over a whole surface area of the second organic light emitting layer by a vapor deposition process;

forming a first organic light emitting layer for the blue color over a whole surface area of the connection layer by a vapor deposition process;

forming an electron injection/transport layer having a property of at least one of electron injection and electron transport over a whole surface area of the first organic light emitting layer by a vapor deposition process; and forming a second electrode over a whole surface area of the electron injection/transport layer.

12. The method of manufacturing an organic electroluminescence display according to claim 11, wherein a part of the second organic light emitting layer is crystallized by laser annealing.

13. The method of manufacturing an organic electroluminescence display according to claim 11, wherein a part of the second organic light emitting layer is crystallized by exposure to light.

14. The method of manufacturing an organic electroluminescence display according to claim 11, wherein a part of the second organic light emitting layer is crystallized by selective substrate heating.

15. The method of manufacturing an organic electroluminescence display according to claim 11, wherein a part of the second organic light emitting layer is crystallized by heating a resistor formed on a substrate side.

16. The organic electroluminescence display according to claim 1, wherein the connection layer blocks hole injection into the first organic light emitting layer for the blue color in regions corresponding to yellow light emitting regions.

17. The organic electroluminescence display according to claim 1, wherein the crystal part is in direct contact with the connection layer and the second organic light emitting layer.

18. The organic electroluminescence display according to claim 1, wherein the connection layer blocks hole injection into the first organic light emitting layer for the blue color in regions corresponding to yellow light emitting regions, and wherein the crystal part is in direct contact with the connection layer and the second organic light emitting layer.

19. The organic electroluminescence display according to claim 1, wherein the connection layer blocks hole injection into the first organic light emitting layer for the blue color in regions corresponding to yellow light emitting regions, wherein the crystal part is in direct contact with the connection layer and the second organic light emitting layer, and wherein the crystal part is a hole transport crystal part.

* * * * *